(12) United States Patent
Chen

(10) Patent No.: US 12,707,678 B2
(45) Date of Patent: Aug. 11, 2026

(54) SEMICONDUCTOR DEVICE AND METHOD FOR FORMING THE SAME

(71) Applicant: TAIWAN SEMICONDUCTOR MANUFACTURING COMPANY, LTD., Hsinchu (TW)

(72) Inventor: Chih-Yang Chen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 656 days.

(21) Appl. No.: 18/149,636

(22) Filed: Jan. 3, 2023

(65) Prior Publication Data

US 2024/0222459 A1 Jul. 4, 2024

(51) Int. Cl.

| | |
|---|---|
| ***H10D 30/67*** | (2025.01) |
| ***H10D 62/00*** | (2026.01) |
| ***H10D 62/13*** | (2025.01) |
| ***H10D 84/01*** | (2026.01) |
| ***H10D 84/03*** | (2025.01) |

(52) U.S. Cl.

CPC ....... *H10D 30/6735* (2025.01); *H10D 62/151* (2025.01); *H10D 84/013* (2025.01); *H10D 84/038* (2025.01); *H10D 62/021* (2025.01); *H10D 84/0133* (2025.01)

(58) Field of Classification Search

None

See application file for complete search history.

(56) References Cited

U.S. PATENT DOCUMENTS 9,209,247 B2 12/2015 Colinge et al.
9,236,267 B2 1/2016 De et al.
9,412,817 B2 8/2016 Yang et al.
9,412,828 B2 8/2016 Ching et al.
9,472,618 B2 10/2016 Oxland
9,502,265 B1 11/2016 Jiang et al.
9,520,482 B1 12/2016 Chang et al.
9,536,738 B2 1/2017 Huang et al.

(Continued)

FOREIGN PATENT DOCUMENTS

TW 202232765 A 8/2022
TW 202245065 A 11/2022
TW 202245142 A 11/2022

*Primary Examiner* — Julio J Maldonado
*Assistant Examiner* — Pinaki Das
(74) *Attorney, Agent, or Firm* — Maschoff Brennan

(57) ABSTRACT

A method includes forming first and second semiconductor layers, in which a number of the first semiconductor layers is less than a number of the second semiconductor layers. Embodiments includes etching first and second semiconductor layers to form a first recess within the first semiconductor layers and a second recess within the second semiconductor layers; performing an etching process to deepen the second recess; and forming a first and second source/drain epitaxy structures in the first recess and the deepened second recess. Embodiments also includes after the first and second recesses are formed, performing a first deposition process to form first and second epitaxy layers in the first and second recesses, respectively; performing a second deposition process to form a third epitaxy layer over the first epitaxy layer; and performing a third deposition process to form fourth and fifth epitaxy layers over the third and second epitaxy layers, respectively.

20 Claims, 76 Drawing Sheets

(56) References Cited

U.S. PATENT DOCUMENTS

| | | | | |
|---|---|---|---|---|
| 9,576,814 | B2 | 2/2017 | Wu et al. | |
| 9,608,116 | B2 | 3/2017 | Ching et al. | |
| 11,710,737 | B2 | 7/2023 | Cheng et al. | |
| 2022/0029023 | A1* | 1/2022 | Chen | H10D 30/6708 |
| 2022/0238678 | A1* | 7/2022 | Lee | H10D 62/121 |
| 2022/0285511 | A1* | 9/2022 | Park | H10D 84/013 |
| 2022/0359652 | A1 | 11/2022 | Lin et al. | |
| 2022/0359679 | A1 | 11/2022 | Lu et al. | |
| 2022/0359768 | A1 | 11/2022 | Chang et al. | |
| 2022/0384456 | A1 | 12/2022 | Liaw | |

* cited by examiner

SEMICONDUCTOR DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
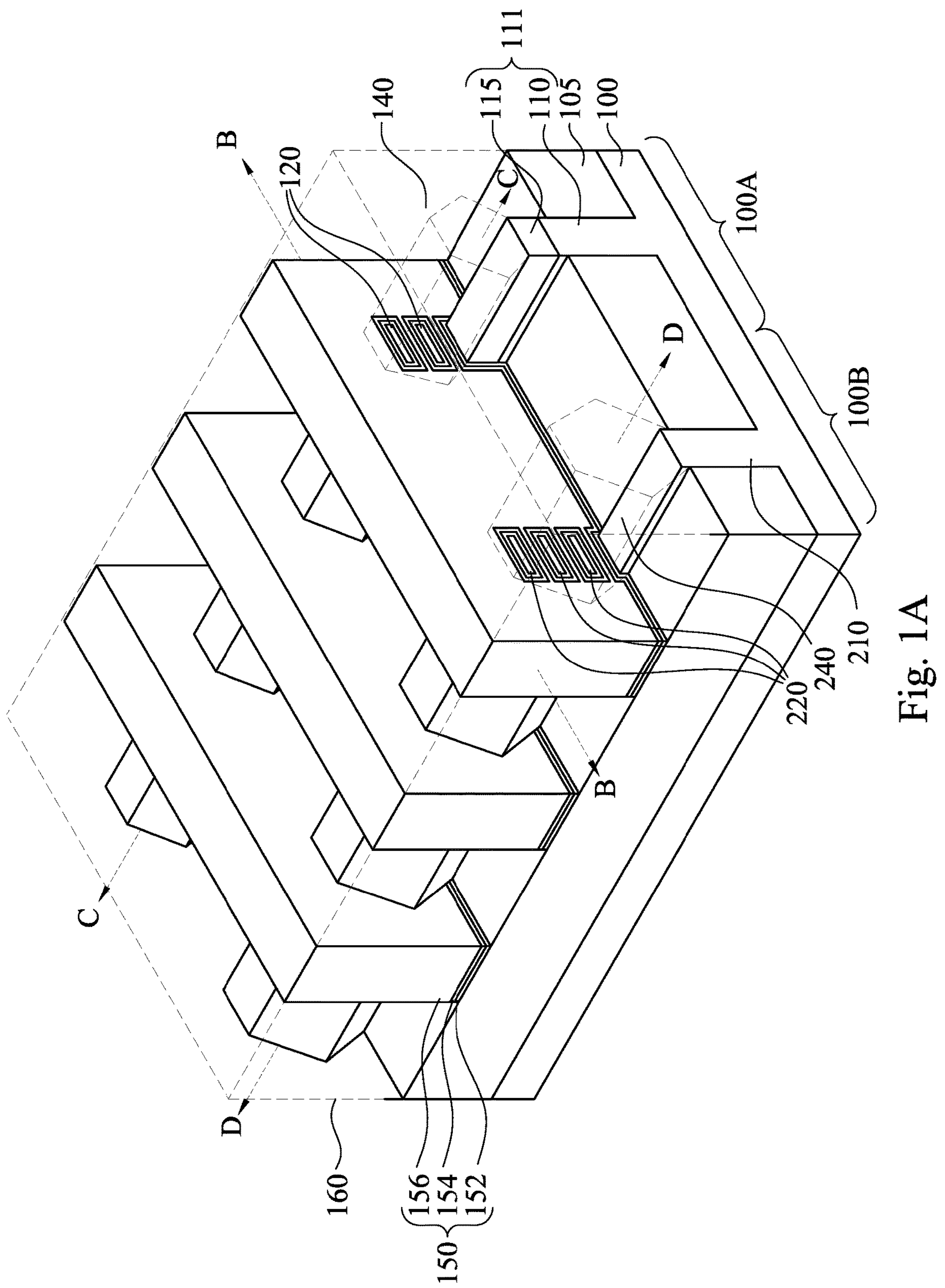
FIG. 1A is a schematic view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments are described below in a particular context, a die comprising nano-FETs. Various embodiments may be applied, however, to dies comprising other types of transistors (e.g., fin field effect transistors (FinFETs), planar transistors, thin film transistors (TFTs), or the like) in lieu of or in combination with the nano-FETs.

Figure 1B:
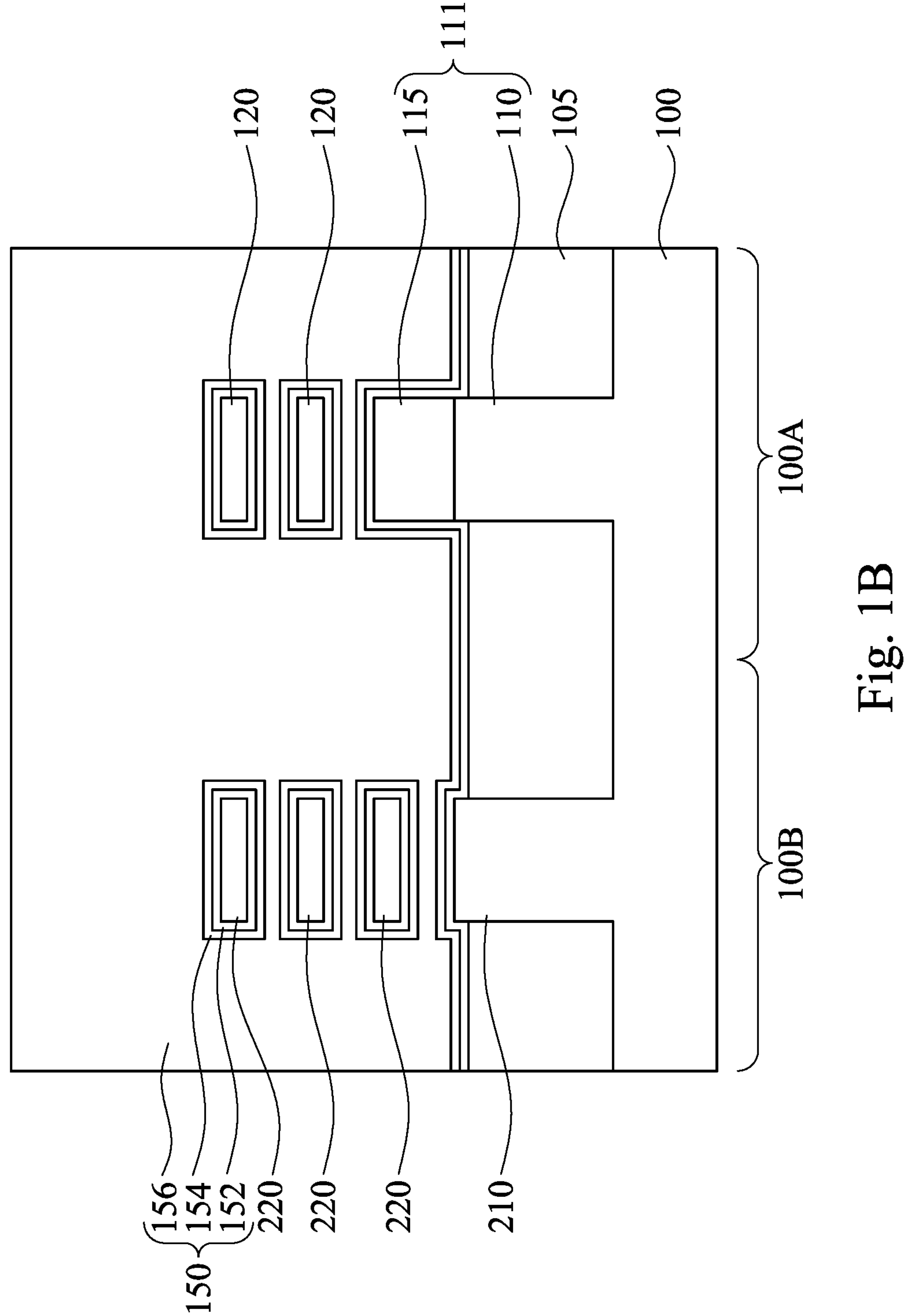
FIGS. 1B to 1D are cross-sectional views of a semiconductor device in accordance with some embodiments.
Figure 1C:
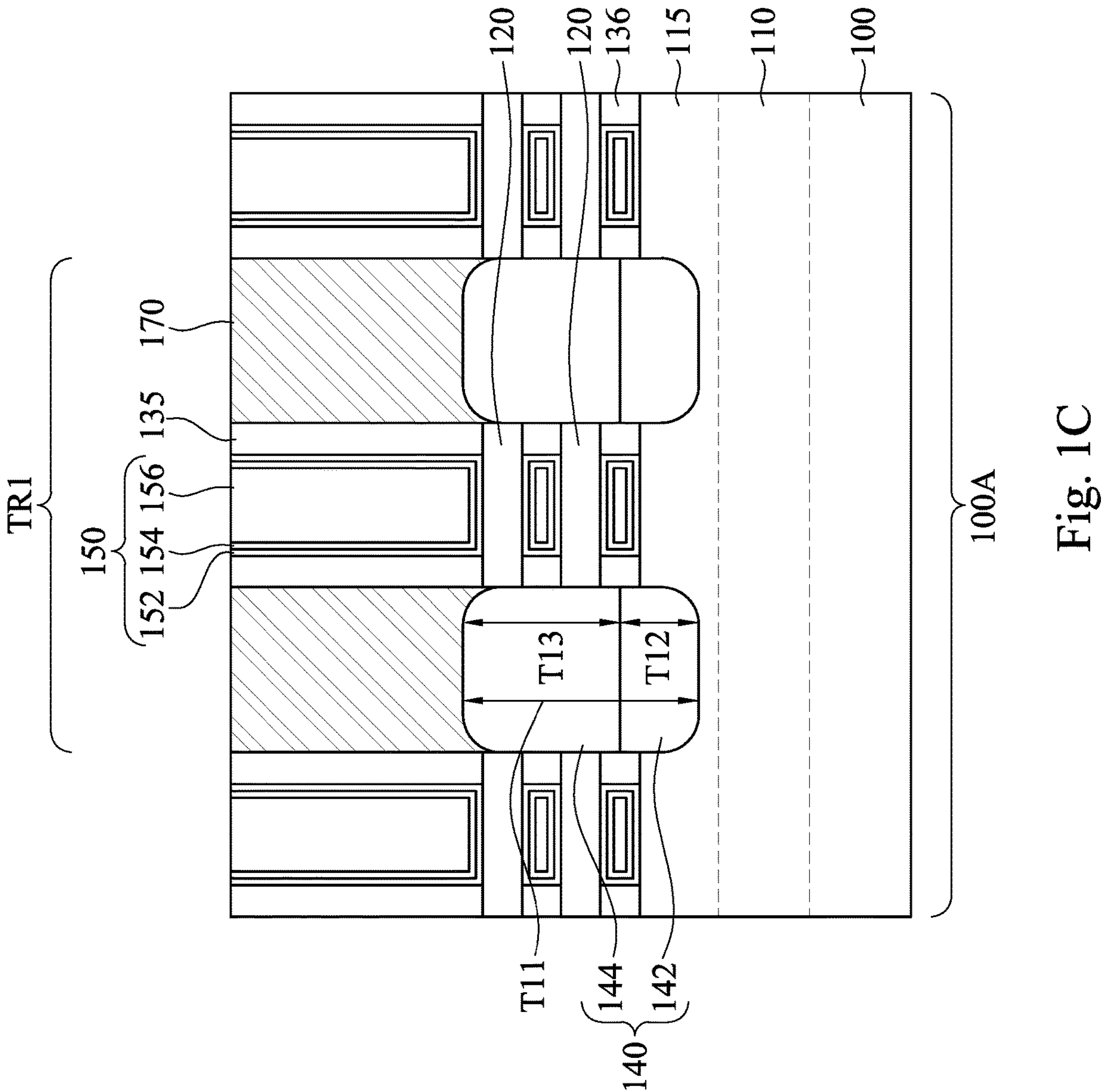
Figure 1D:
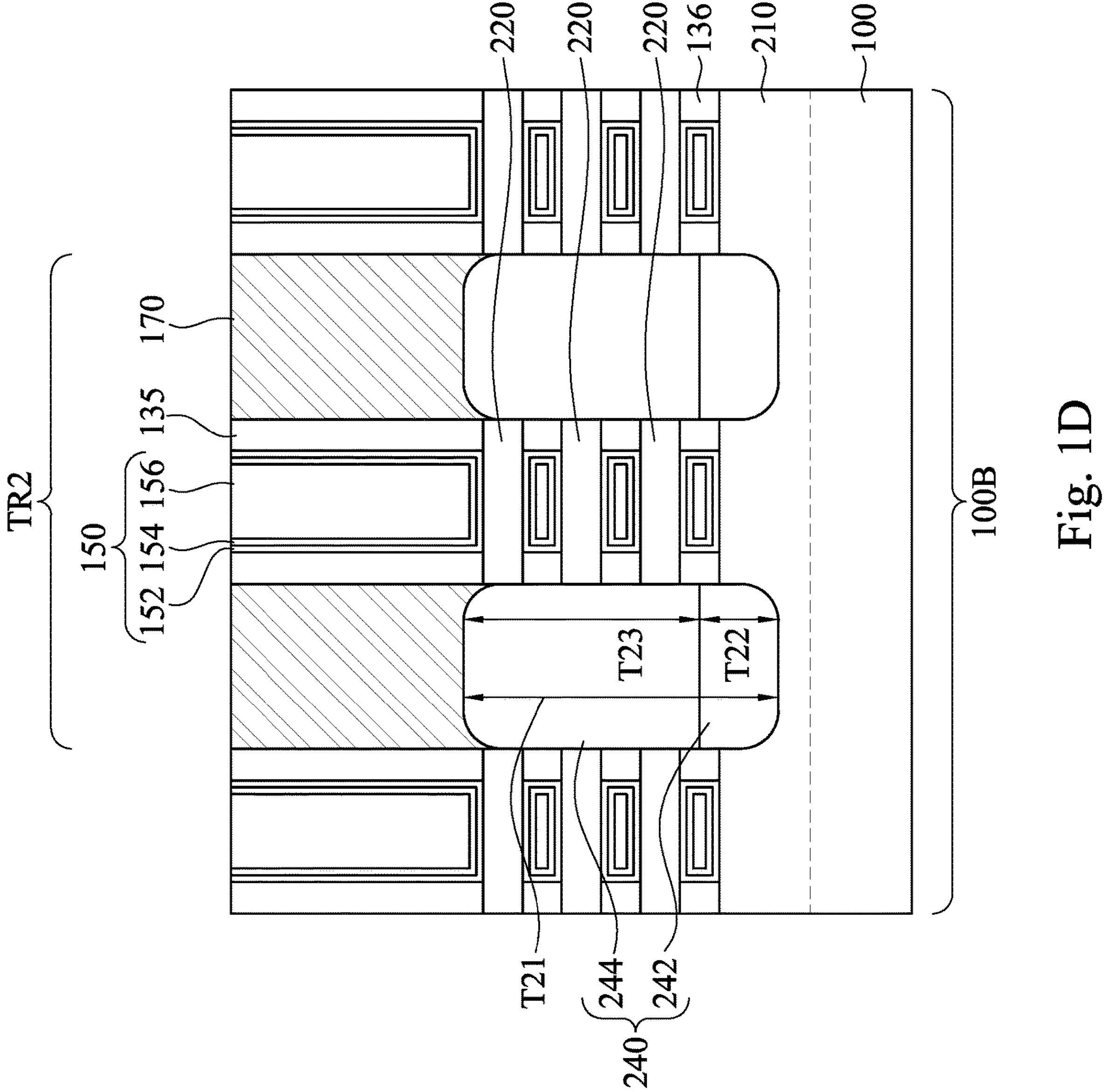

FIG. 1A is a schematic view of a semiconductor device in accordance with some embodiments. FIGS. 1B to 1D are cross-sectional views of a semiconductor device in accordance with some embodiments. In greater details, FIGS. 1B to 1D are cross-sectional views along lines B-B, C-C, and D-D of FIG. 1A.

Shown there is a substrate 100, which includes a first region 100A and a second region 100B. Generally, the substrate 100 may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multilayered substrates, gradient substrates, or hybrid orientation substrates.

A semiconductor strip 110 is disposed over the first region 100A of the substrate 100, and a semiconductor strip 210 is disposed over the second region 100B of the substrate 100. The semiconductor strips 110 and 210 protrude from the top surface of the substrate 100. In some embodiments, the semiconductor strips 110 and 210 are illustrated as being single, continuous materials with the substrate 100, while the semiconductor strips 110 and 210 and/or the substrate 100 may include a single material or a plurality of materials. In some embodiments, the semiconductor strips 110 and 210 may include a same material as the substrate 100, such as silicon.

With respect to the first region 100A of the substrate 100, a semiconductor layer 115 is disposed over and in contact with the top surface of the semiconductor strip 110. In some embodiments where the semiconductor layer 115 and the semiconductor strip 110 are made of a same material, the semiconductor layer 115 and the semiconductor strip 110 may collectively be referred to as a semiconductor strip 111, and thus the semiconductor strip 111 has a higher top surface than the semiconductor strip 210. Furthermore, semiconductor layers 120 are vertically stacked over the semiconductor layer 115. In some embodiments, the bottommost one of the semiconductor layers 120 may be vertically separated from the semiconductor layer 115. In some embodiments, the semiconductor layer 115 is thicker than each of the semiconductor layers 120 along the vertical direction.

On the other hand, with respect to the second region 100B of the substrate 100, semiconductor layers 220 are vertically stacked over the semiconductor strip 210. In some embodiments, the bottommost one of the semiconductor layers 220 may be vertically separated from the semiconductor strip 210.

In some embodiments, the number of the semiconductor layers 120 may be less than the number of the semiconductor layers 220. For example, two semiconductor layers 120 and three semiconductor layers 220 are illustrated in FIGS. 1A to 1D. However, the present disclosure is not limited thereto. In other embodiments, the numbers of the semiconductor layers 120 and the semiconductor layers 220 may be 3 and 4, 2 and 3, 1 and 2, 2 and 4, 1 and 4, and so on. In some embodiments, each of the semiconductor layers 120 may include substantially a same thickness as each of the semiconductor layers 220. In some embodiments, the topmost one of the semiconductor layers 120 may be laterally aligned with the topmost one of the semiconductor layers 220, while the bottommost one of the semiconductor layers 120 is higher than the bottommost one of the semiconductor layers 220. In some embodiments, the top surface of the bottommost one of the semiconductor layers 220 may be level with the top surface of the semiconductor layer 115.

In some embodiments, the semiconductor layers 120 and the semiconductor layers 220 may act as channel region of the respective semiconductor devices, and thus can also be referred to as semiconductor channel layers. In some other embodiments, semiconductor layers 120 and the semiconductor layers 220 can also be referred to as nanostructures, nanowires, nanosheets, or the like.

Isolation structures 105 are disposed over the substrate 100 and laterally adjacent the semiconductor strips 110 and 210. In some embodiments, at least one of the isolation structures 105 is disposed between the semiconductor strips 110 and 210, and may be in contact with sidewalls of the semiconductor strips 110 and 210. In some embodiments, as shown in FIG. 1B, the top surfaces of the semiconductor strips 110 and 210 may be higher than the top surfaces of the isolation structures 105. In some embodiments, the bottom surface of the semiconductor layer 115 may be higher than the top surfaces of the isolation structures 105.

The isolation structures 105 may be shallow trench isolation (STI) structures, suitable isolation structures, combinations of the foregoing, or the like. In some embodiments, the isolation structures 105 may be made of oxide (e.g., silicon oxide), nitride (e.g., silicon nitride), or combinations thereof.

Gate structures 150 are disposed over the substrate 100. In some embodiments, each of the gate structures 150 may include a gate dielectric layer 152, a work function metal layer 154, and a gate electrode 156. Each of the gate structures 150 may span over the first region 100A and the second region 100B of the substrate 100. In some embodiments, each of the gate structures 150 may wraps around each of the semiconductor layers 120 and 220. That is, each of the gate structures 150 may be in contact with at least four sides of each of the semiconductor layers 120 and 220. In some embodiments, each of the gate structures 150 may cross the semiconductor layer 115 and in contact with at least three sides of the semiconductor layer 115. In some embodiments, each of the gate structures 150 may be in contact with the top surface of the semiconductor strip 210, and may be separated from the semiconductor strip 110 through the semiconductor layer 115.

In some embodiments, each of the gate structures 150 can be regarded as having a first gate structure wraps around each of the semiconductor layers 120 and a second gate structure wraps around each of the semiconductor layers 220, in which the first gate structure and the second gate structure may be connected to each other. In some embodiments, the first gate structure and the second gate structure may be formed in a same process. In some other embodiments, a cut-metal-gate (CMG) dielectric structure (not shown) may be formed cutting the gate structures 150, such that each of the gate structures 150 may be divided into two individual gate structures over the first and second regions 100A and 100B of the substrate 100, respectively. In such embodiments, the two individual gate structures may wraps around each of the semiconductor layers 120 and each of the semiconductor layers 220, respectively.

In some embodiments, the gate dielectric layer 152 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HTIO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 152 may be formed by CVD, ALD or any suitable method.

In some embodiments, the work function metal layer 154 may be made of a conductive material such as a single layer of TiN, TaN, TaAIC, TiC, TaC, Co, Al, TiAl, HfTi, TiSi, TaSi or TiAIC, or a multilayer of two or more of these materials. For the n-channel FET, one or more of TaN, TaAIC, TIN, TIC, Co, TiAl, HfTi, TiSi and TaSi is used as the work function metal layer 154, and for the p-channel FET, one or more of TiAIC, Al, TiAl, TaN, TaAIC, TIN, TiC and Co is used as the work function metal layer 154. The work function metal layer 154 may be formed by ALD, PVD, CVD, e-beam evaporation, or other suitable process.

In some embodiments, the gate electrode 156 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode 156 may be formed by CVD, ALD, electro-plating, or other suitable method.

As shown in FIGS. 1C and 1D, gate spacers 135 are disposed on opposite sidewalls of each of the gate structures 150. In some embodiments, the gate spacers 135 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 135 may include a single layer or multilayer structure made of different dielectric materials. It is noted that the gate spacers 135 are not illustrated in FIG. 1A for clarity.

Inner spacers 136 are vertically between two adjacent semiconductor layers 120 and between two adjacent semiconductor layers 220. In some embodiments, the inner spacers 136 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. It is noted that the inner spacers 136 are not illustrated in FIG. 1A for clarity.

With respect to the first region 100A of the substrate 100, source/drain epitaxy structures 140 are disposed over the semiconductor strip 110 and on opposite sides of each of the gate structures 150. As shown in FIG. 1C, each of the source/drain epitaxy structures 140 may include an epitaxy layer 142 and an epitaxy layer 144 over the epitaxy layer 142. In some embodiments, the epitaxy layer 142 and the epitaxy layer 144 may be made of different semiconductor materials. For example, in some embodiments, the epitaxy layer 142 may include un-doped silicon. For an N-type device, the epitaxy layer 144 may include silicon phosphorus (SiP) doped with n-type dopants. Examples of n-type dopants can be phosphorus (P), arsenic (As), or antimony (Sb), or the like. On the other hand, for a P-type device, the epitaxy layer 144 may include silicon germanium (Ge) doped with p-type dopants. Examples of p-type dopants can be boron (B), gallium (Ga), indium (In), aluminium (Al), or the like. In some embodiments, the dopant concentration of the epitaxy layer 144 may be higher than the dopant concentration of the epitaxy layer 142.

In some embodiments, each epitaxy layer 142 may be in contact with the sidewall of the semiconductor layer 115, and the top surface of the epitaxy layer 142 may be higher than the top surface of the semiconductor layer 115. Because the epitaxy layer 142 is an un-doped semiconductor material, the conductivity of the epitaxy layer 142 is low and thus the semiconductor layer 115 between the epitaxy layers 142 of the source/drain epitaxy structures 140 may not be able to serve as channel region. On the other hand, the epitaxy layers 144 on opposite sides of the semiconductor layer 120 are doped or heavily doped, and thus the carrier mobility in the semiconductor layers 120 may be high enough to serve as channel region. In some embodiments, the semiconductor layers 120, the gate structure 150, and the source/drain epitaxy structures 140 on opposite sides of the gate structure 150 can collectively function as a transistor TR1.

With respect to the second region 100B of the substrate 100, source/drain epitaxy structures 240 are disposed over the semiconductor strip 210 and on opposite sides of each of the gate structures 150. As shown in FIG. 1D, each of the source/drain epitaxy structures 240 may include an epitaxy layer 242 and an epitaxy layer 244 over the epitaxy layer 242. In some embodiments, the epitaxy layer 242 and the epitaxy layer 244 may be made of different semiconductor materials. For example, in some embodiments, the epitaxy layer 242 may include un-doped silicon. For an N-type device, the epitaxy layer 244 may include silicon phosphorus (SiP) doped with n-type dopants. Examples of n-type dopants can be phosphorus (P), arsenic (As), or antimony (Sb), or the like. On the other hand, for a P-type device, the epitaxy layer 244 may include silicon germanium (Ge) doped with p-type dopants. Examples of p-type dopants can be boron (B), gallium (Ga), indium (In), aluminium (Al), or the like. In some embodiments, the dopant concentration of the epitaxy layer 244 may be higher than the dopant concentration of the epitaxy layer 242.

In some embodiments, each epitaxy layer 242 may be in contact with the sidewall of the semiconductor strip 210, and the top surface of the epitaxy layer 242 may be higher than the top surface of the semiconductor strip 210. Because the epitaxy layer 242 is an un-doped semiconductor material, the conductivity of the epitaxy layer 242 is low and thus the semiconductor strip 210 between the epitaxy layers 242 of the source/drain epitaxy structures 240 may not be able to serve as channel region. On the other hand, the epitaxy layers 244 on opposite sides of the semiconductor layer 220 are doped or heavily doped, and thus the carrier mobility in the semiconductor layers 220 may be high enough to serve as channel region. In some embodiments, the semiconductor layers 220, the gate structure 150, and the source/drain epitaxy structures 240 on opposite sides of the gate structure 150 can collectively function as a transistor TR2.

With respect to FIGS. 1C and 1D, each source/drain epitaxy structure 140 has a thickness T11, and each source/drain epitaxy structure 240 has a thickness T21. In some embodiments, the thickness T11 is less than the thickness T21. That is, the bottom surface of each source/drain epitaxy structure 140 may be higher than the bottom surface of each source/drain epitaxy structure 240. In some embodiments, the top surface of the each source/drain epitaxy structure 140 may be substantially level with the top surface of the each source/drain epitaxy structure 240.

Each epitaxy layer 142 has a thickness T12, and each epitaxy layer 242 has a thickness T22. In some embodiments, the thickness T12 is substantially equal to the thickness T22. That is, the epitaxy layer 142 and the epitaxy layer 242 may include substantially a same thickness. However, the epitaxy layer 142 may be higher than the epitaxy layer 242. That is, the top surface and the bottom surface of the epitaxy layer 142 may be higher than the top surface and the bottom surface of the epitaxy layer 242, respectively.

Each epitaxy layer 144 has a thickness T13, and each epitaxy layer 244 has a thickness T23. In some embodiments, the thickness T13 is less than the thickness T23. That is, the epitaxy layer 144 is thinner than the epitaxy layer 244. In some embodiments, the top surface of the epitaxy layer 144 may be substantially level with the top surface of the epitaxy layer 244. However, the bottom surface of the epitaxy layer 144 may be higher than the bottom surface of the epitaxy layer 244. In some embodiments, the thickness variation between the epitaxy layers 142 and 242 is less than the thickness variation between the epitaxy layers 144 and 244.

Referring to FIG. 1A, an interlayer dielectric (ILD) layer 160 is disposed over the substrate 100 and covering the source/drain epitaxy structures 140 and 240. In some embodiments, the ILD layer 160 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In FIGS. 1C and 1D, source/drain contacts 170 are disposed in the ILD layer 160 and over the source/drain epitaxy structures 140 and 240, respectively. The source/ drain contacts 170 may include one or more layers, such as barrier layers, diffusion layers, and fill materials. In some embodiments, the contacts each may include a barrier layer made of titanium, titanium nitride, tantalum, tantalum nitride, or the like, and a conductive material made of copper, a copper alloy, silver, gold, tungsten, cobalt, aluminum, nickel, or the like. It is noted that the source/drain contacts 170 are not illustrated in FIG. 1A for clarity.

In some embodiments of the present disclosure, a first semiconductor device (e.g., the transistor TR1) is disposed over a first region 100A of a substrate 100, and a second semiconductor device (e.g., the transistor TR2) is disposed over a second region 100B of a substrate 100. The first semiconductor device may include less semiconductor channel layers than the second semiconductor device. Such dual-channel number (ex: 3-sheet+2-sheet) devices on a same chip may be beneficial for power saving. Moreover, the first and second semiconductor devices may include different depths of source/drain epitaxy structures, which in turn will improve the device performance and may be beneficial for device control.

FIGS. 2 to 22B are schematic views of a semiconductor device in various stages of fabrication in accordance with some embodiments of the present disclosure. In greater details, FIGS. 2 to 22B illustrate a method for forming the structure shown in FIGS. 1A to 1D. FIGS. 2, 3, 4, 5, 6, 7, 8, 9, 10, 11A, 20A, and 21A are cross-sectional views the same as the cross-sectional view of FIG. 1B. FIGS. 11B, 12A, 13A, 14A, 15A, 16A, 17A, 18A, 19A, 20B, 21B, and 22A are cross-sectional views the same as the cross-sectional view of FIG. 1C. FIGS. 11C, 12B, 13B, 14B, 15B, 16B, 17B, 18B, 19B, 20C, 21C, and 22B are cross-sectional views the same as the cross-sectional view of FIG. 1D. Although the views shown in FIGS. 2 to 22B are described with reference to a method, it will be appreciated that the structures shown in FIGS. 2 to 22B are not limited to the method but rather may stand alone separate of the method. Although FIGS. 2 to 22B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 2:
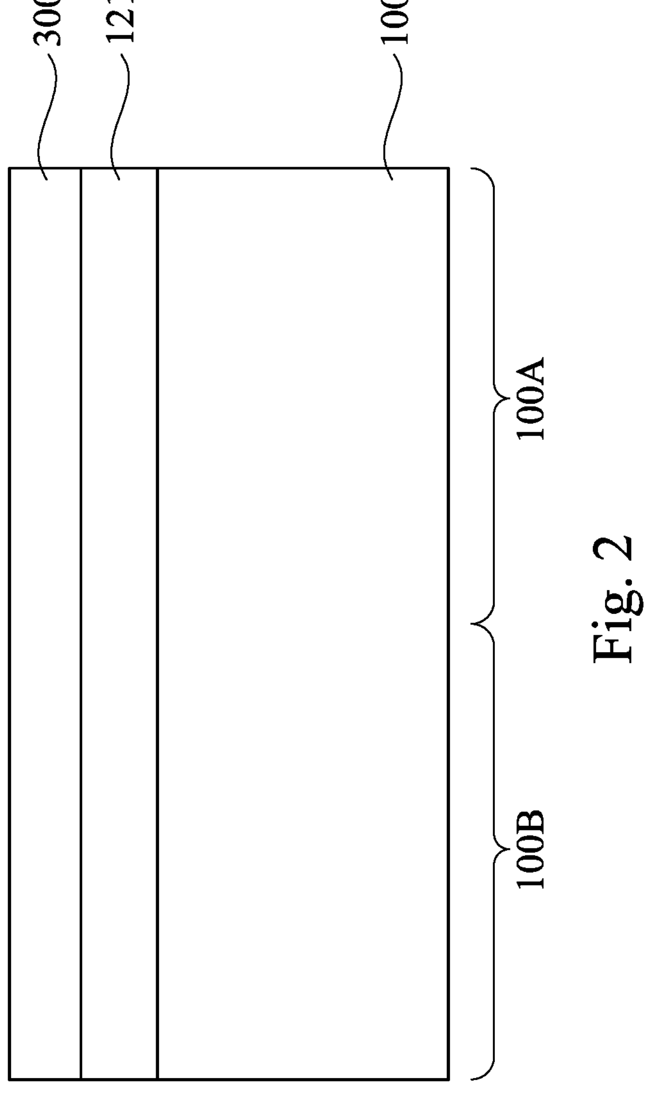
FIGS. 2 to 22B are schematic views of a semiconductor device in various stages of fabrication in accordance with some embodiments of the present disclosure.

Reference is made to FIG. 2. A substrate 100 is provided, and a semiconductor layer 121 is deposited over the substrate 100. In some embodiments, the semiconductor layer 121 may span over the first region 100A and the second region 100B of the substrate 100. In some embodiments, the semiconductor layer 121 may be a pure silicon layer that is free of germanium. The semiconductor layer 121 may also be substantially pure silicon layer, for example, with a germanium percentage lower than about 1 percent. In some embodiments, the semiconductor layer 121 may be deposited using suitable deposition process, such as chemical vapor deposition (CVD), molecular beam epitaxy (MBE), or other suitable process(es).

A pad layer 300 is deposited over the semiconductor layer 121. In some embodiments, the pad layer 300 may include a dielectric material. For example, the dielectric material may be oxide, such as silicon oxide. In some other embodiments, the dielectric material may be nitride. In some embodiments, the pad layer 300 may span over the first region 100A and the second region 100B of the substrate 100. In some embodiments, the pad layer 300 may be deposited using suitable deposition process, such as CVD, ALD, PVD, or the like.

Figure 3:
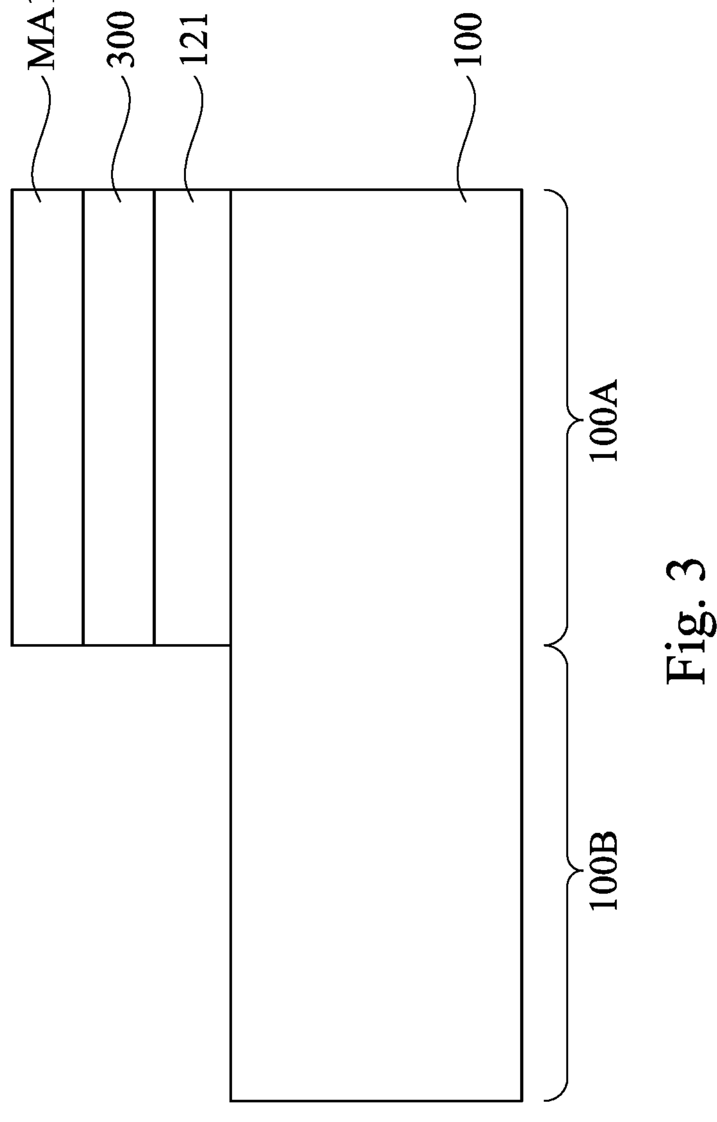

Reference is made to FIG. 3. A patterned mask MA1 is formed over the first region 100A of the substrate 100, while leaving the second region 100B of the substrate 100 exposed. In some embodiments, the patterned mask MA1 may include photoresist, and may be patterned using suitable photolithography process.

Afterwards, portions of the pad layer 300 and the semiconductor layers 121 exposed by the patterned mask MA1 are removed by using the patterned mask MA1 as an etch mask. The portions of the pad layer 300 and the semiconductor layers 121 can be removed by suitable etching process, such as wet etch, dry etch, the like, or combinations thereof. As a result, portions of the pad layer 300 and the semiconductor layers 121 over the second region 100B of the substrate 100 are removed, and the surface of the second region 100B of substrate 100 is exposed. On the other hand, portions of the pad layer 300 and the semiconductor layer 121 over the first region 100A of the substrate 100 are protected by the patterned mask MA1 during the etching process, and may keep remaining over the substrate 100 after the etching process is completed.

Figure 4:
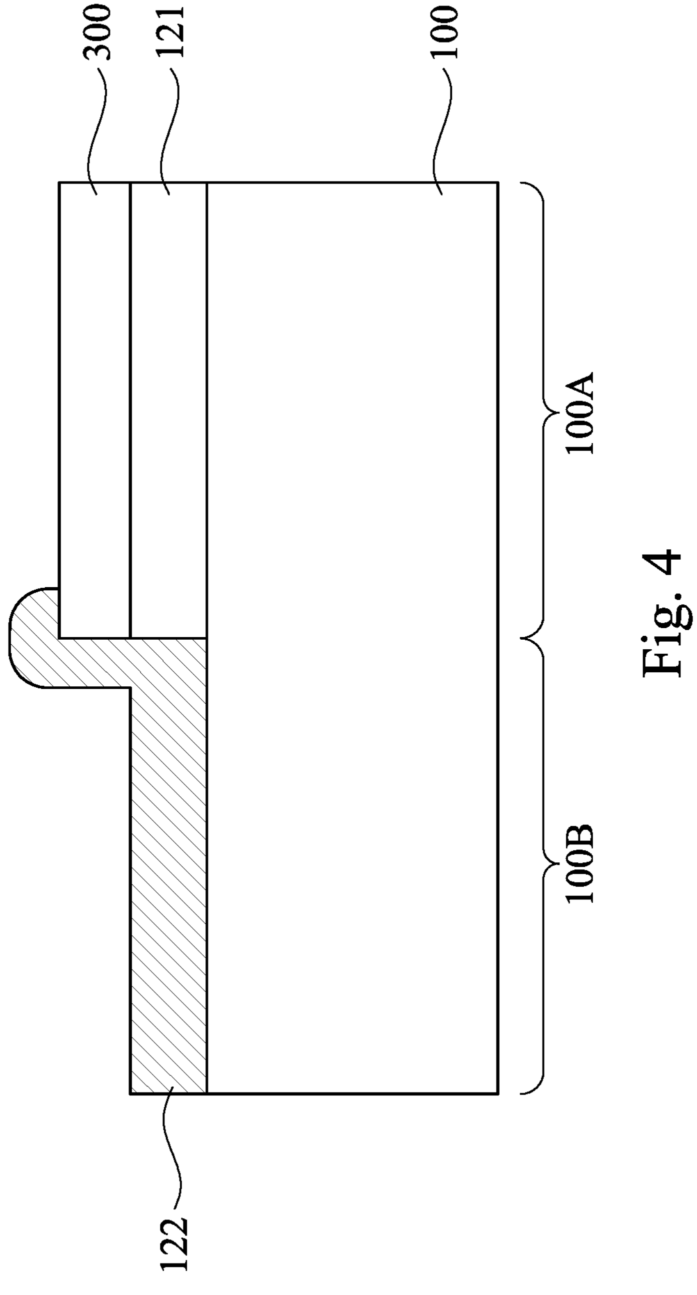

Reference is made to FIG. 4. The patterned mask MA1 is removed. Afterwards, a semiconductor layer 122 is selectively formed on the exposed surface of the second region 100B of the substrate 100. In some embodiments, the semiconductor layer 122 is made from SiGe. The germanium percentage (atomic percentage concentration) of the semiconductor layer 122 is in the range between about 10 percent and about 50 percent, while higher or lower germanium percentages may be used. It is appreciated, however, that the values recited throughout the description are examples, and may be changed to different values. For example, the semiconductor layer 122 may vary from $Si_{0.5}Ge_{0.5}$ to $Si_{0.9}Ge_{0.1}$, in which the proportion between Si and Ge may vary from embodiments, and the disclosure is not limited thereto.

In some embodiments, the semiconductor layer 122 may be deposited using suitable deposition process, such as selective epitaxial growth (SEG), chemical vapor deposition (CVD), molecular beam epitaxy (MBE), or other suitable process(es). In some embodiments, the semiconductor layer 122 may be selectively grown on epitaxy material, such as the substrate 100 and the semiconductor layer 121. Accordingly, the semiconductor layer 122 may include higher deposition rate on the substrate 100 and the semiconductor layer 121 than on the pad layer 300. In some embodiments, because the semiconductor layer 122 may also be grown from sidewall of the semiconductor layer 121, excess material of the semiconductor layer 122 may extend to the sidewall and the top surface of the pad layer 300.

Figure 5:
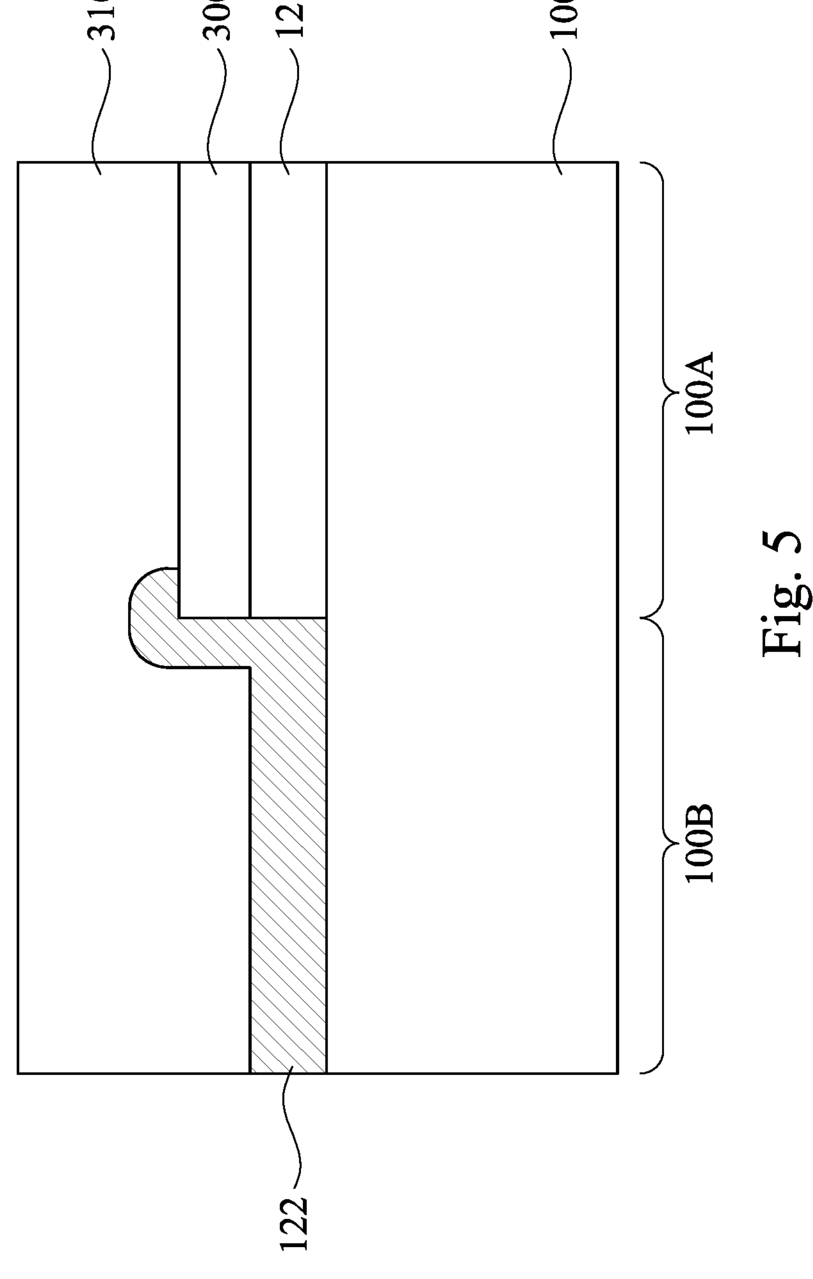

Reference is made to FIG. 5. A dielectric layer 310 is deposited over the substrate 100 and covering the semiconductor layer 122 and the pad layer 300. In some embodiments, the dielectric layer 310 may include a same material as the pad layer 300. For example, the dielectric layer 310 may be oxide, such as silicon oxide. In some other embodiments, the dielectric layer 310 may be nitride. In some embodiments, the dielectric layer 310 may span over the first region 100A and the second region 100B of the substrate 100. In some embodiments, the dielectric layer 310 may be deposited using suitable deposition process, such as CVD, ALD, PVD, or the like.

Figure 6:
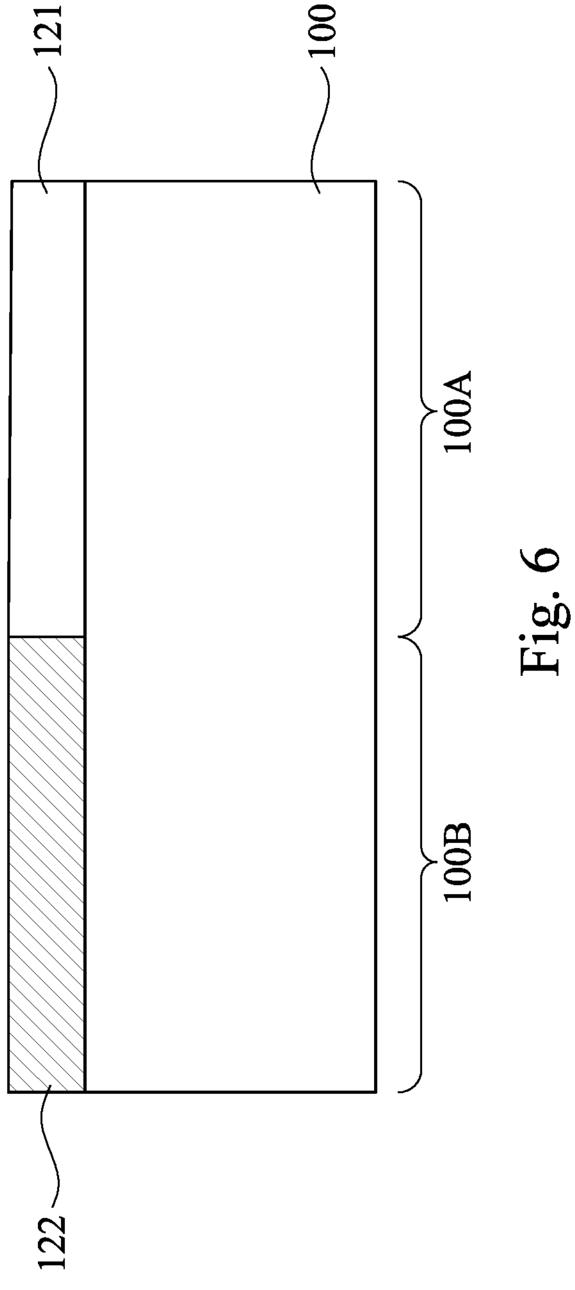

Reference is made to FIG. 6. A planarization process, such as a chemical mechanical polishing (CMP) process, is performed to level the top surface of the semiconductor layer 121 and the top surface of the semiconductor layer 122. In some embodiments, the dielectric layer 310 is removed during the planarization process.

Figure 7:
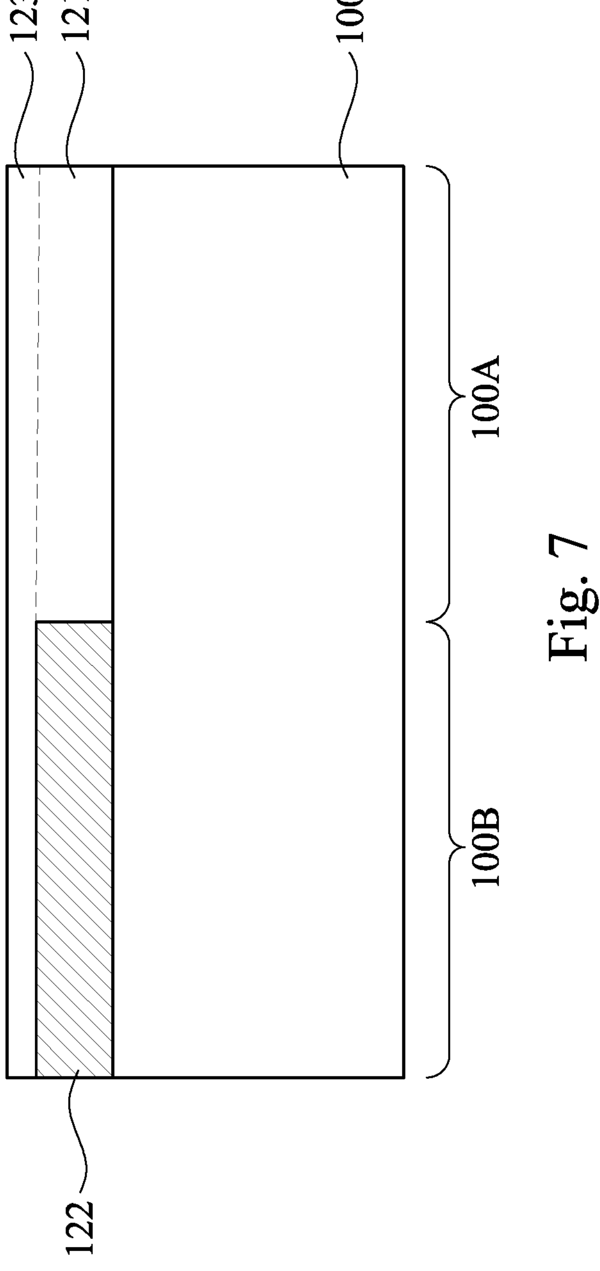

Reference is made to FIG. 7. A semiconductor layer 123 is deposited over the semiconductor layer 121 and 122. In some embodiments, the semiconductor layer 123 may span over the first region 100A and the second region 100B of the substrate 100. In some embodiments, the semiconductor layer 123 may be a pure silicon layer that is free of germanium. The semiconductor layer 123 may also be substantially pure silicon layer, for example, with a germanium percentage lower than about 1 percent. In some embodiments, the semiconductor layer 123 may be deposited using suitable deposition process, such as chemical vapor deposition (CVD), molecular beam epitaxy (MBE), or other suitable process(es).

Figure 8:
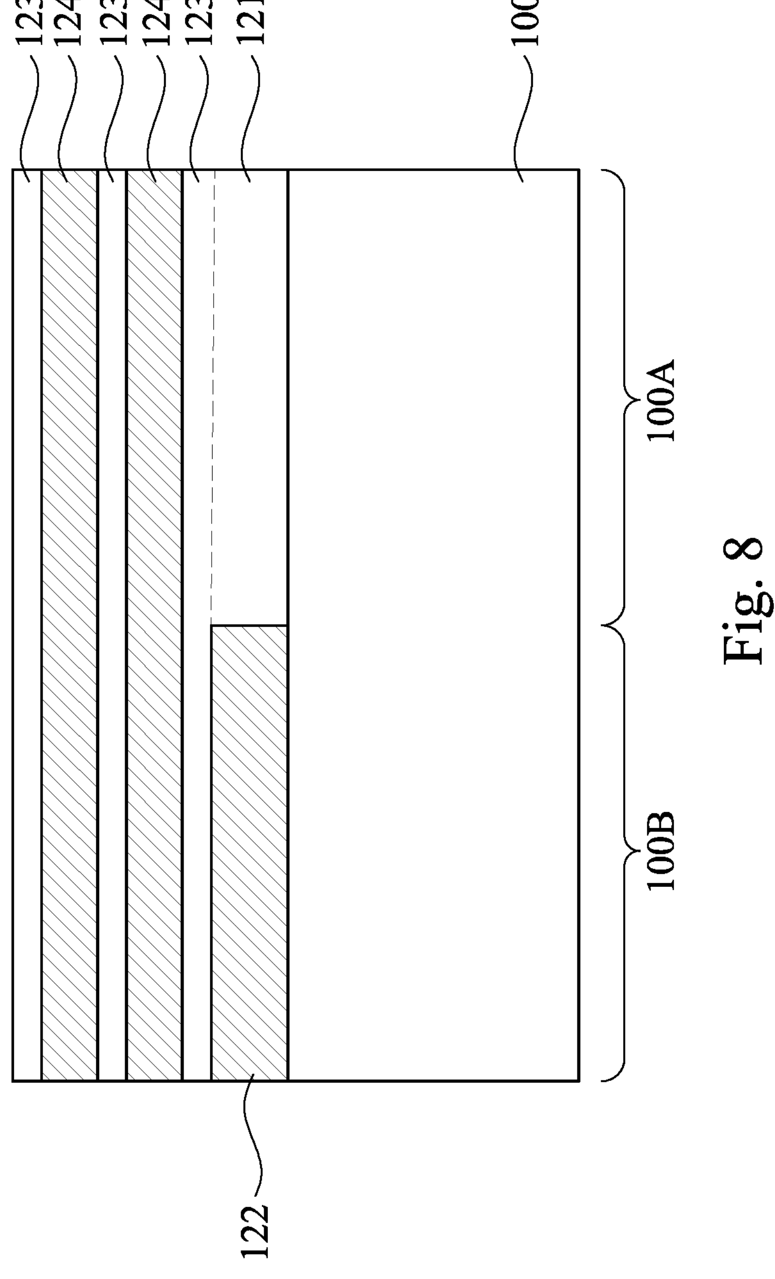

Reference is made to FIG. 8. Semiconductor layers 124 and semiconductor layers 123 are alternately deposited over the substrate 100. In some embodiments, the semiconductor layers 124 are made from SiGe. The germanium percentage (atomic percentage concentration) of the semiconductor layer 124 is in the range between about 10 percent and about 50 percent, while higher or lower germanium percentages may be used. It is appreciated, however, that the values recited throughout the description are examples, and may be changed to different values. For example, the semiconductor layer 124 may vary from $Si_{0.5}Ge_{0.5}$ to $Si_{0.9}Ge_{0.1}$, in which the proportion between Si and Ge may vary from embodiments, and the disclosure is not limited thereto.

In some embodiments, the semiconductor layer 121 and the semiconductor layers 123 may be made of a same material, such as silicon. In some embodiments, the semiconductor layer 122 and the semiconductor layers 124 may be made of a same material, such as silicon germanium. In some embodiments, the semiconductor layer 121 is formed over the first region 100A of the substrate 100, and the semiconductor layer 122 is formed over the second region 100B of the substrate 100, while each of the semiconductor layers 123 and 124 may span over the first region 100A and the second region 100B of the substrate 100.

In some embodiments, a portion of the bottommost one of the semiconductor layers 123 is in contact with the semiconductor layer 121. Because the semiconductor layer 123 and the semiconductor layer 121 are made of a same material, the composite layer of the semiconductor layer 121 and the portion of the semiconductor layer 123 may collectively form the semiconductor layer 115 (see FIG. 9) discussed in later steps.

Figure 9:
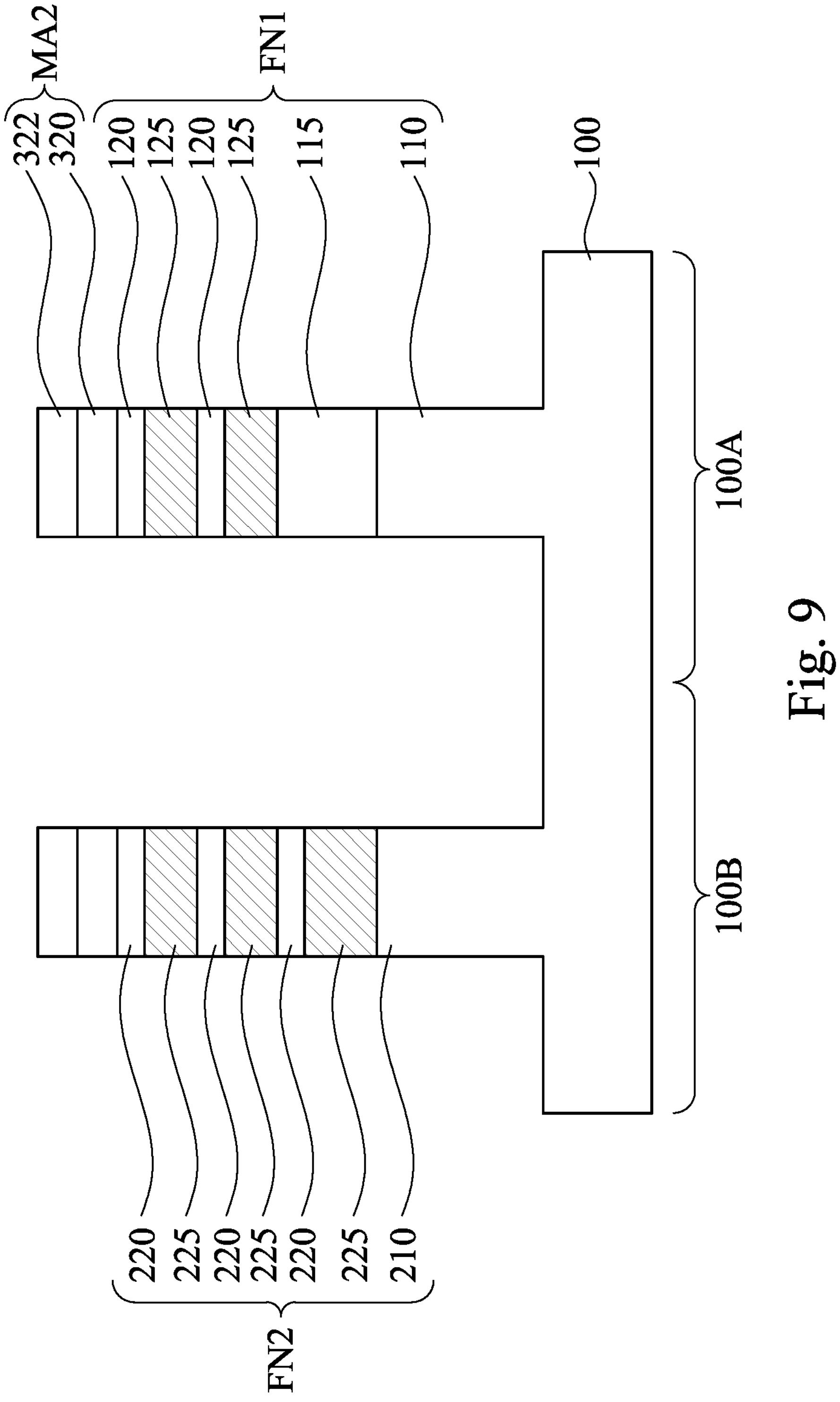

Reference is made to FIG. 9. Patterned masks MA2 are formed over the topmost one of the semiconductor layers 123 (see FIG. 8). In some embodiments, each of the patterned masks MA2 may include a pad oxide layer 320 and a hard mask layer 322 over the pad oxide layer 320. In some embodiments, the pad oxide layer 320 is formed of silicon oxide grown by a thermal oxidation process. The hard mask layer 322, for example, may include a silicon nitride or silicon oxynitride layer. In some embodiments, the patterned masks MA2 can be formed by, for example, depositing a material of the pad oxide layer 320 over the topmost one of the semiconductor layers 123 by a rapid thermal oxidation (RTO) process or in an annealing process. Then, a material of the hard mask layer 322 can be deposited by, for example, a chemical vapor deposition (CVD) process, or a low pressure CVD (LPCVD) process. The material of the pad oxide layer 320 and the material of the hard mask layer 322 are then patterned to form the patterned masks MA2.

After the patterned masks MA2 are formed, an etching process is performed to remove portions of the semiconductor layers 121, 122, 123, and 124, and the substrate 100 that are exposed by the patterned mask MA2, so as to form a fin structure FN1 over the first region 100A of the substrate 100 and a fin structure FN2 over the second region 100B of the substrate 100. In some embodiments, the etching process may include dry etch, wet etch, or combinations thereof.

With respect to the fin structure FN1, the fin structure FN1 may include a semiconductor strip 110, a semiconductor layer 115, and a stack of alternating semiconductor layers 125 and 120 over the semiconductor layer 115. In some embodiments, the semiconductor strip 110 may be a remaining portion of the substrate 100 that is protected by the patterned mask MA2 during the etching process. The semiconductor layer 115 may include the remaining portions of the semiconductor layer 121 and the bottommost one of the semiconductor layers 123. The semiconductor layers 125 may be remaining portions of the semiconductor layers 124, and the semiconductor layers 120 may be remaining portions of the semiconductor layers 123.

On the other hand, with respect to the fin structure FN2, the fin structure FN2 may include a semiconductor strip 210 and a stack of alternating semiconductor layers 225 and 220 over the semiconductor strip 210. In some embodiments, the semiconductor strip 210 may be a remaining portion of the substrate 100 that is protected by the patterned mask MA2 during the etching process. The semiconductor layers 225 may be remaining portions of the semiconductor layers 124, and the semiconductor layers 220 may be remaining portions of the semiconductor layers 123.

Figure 10:
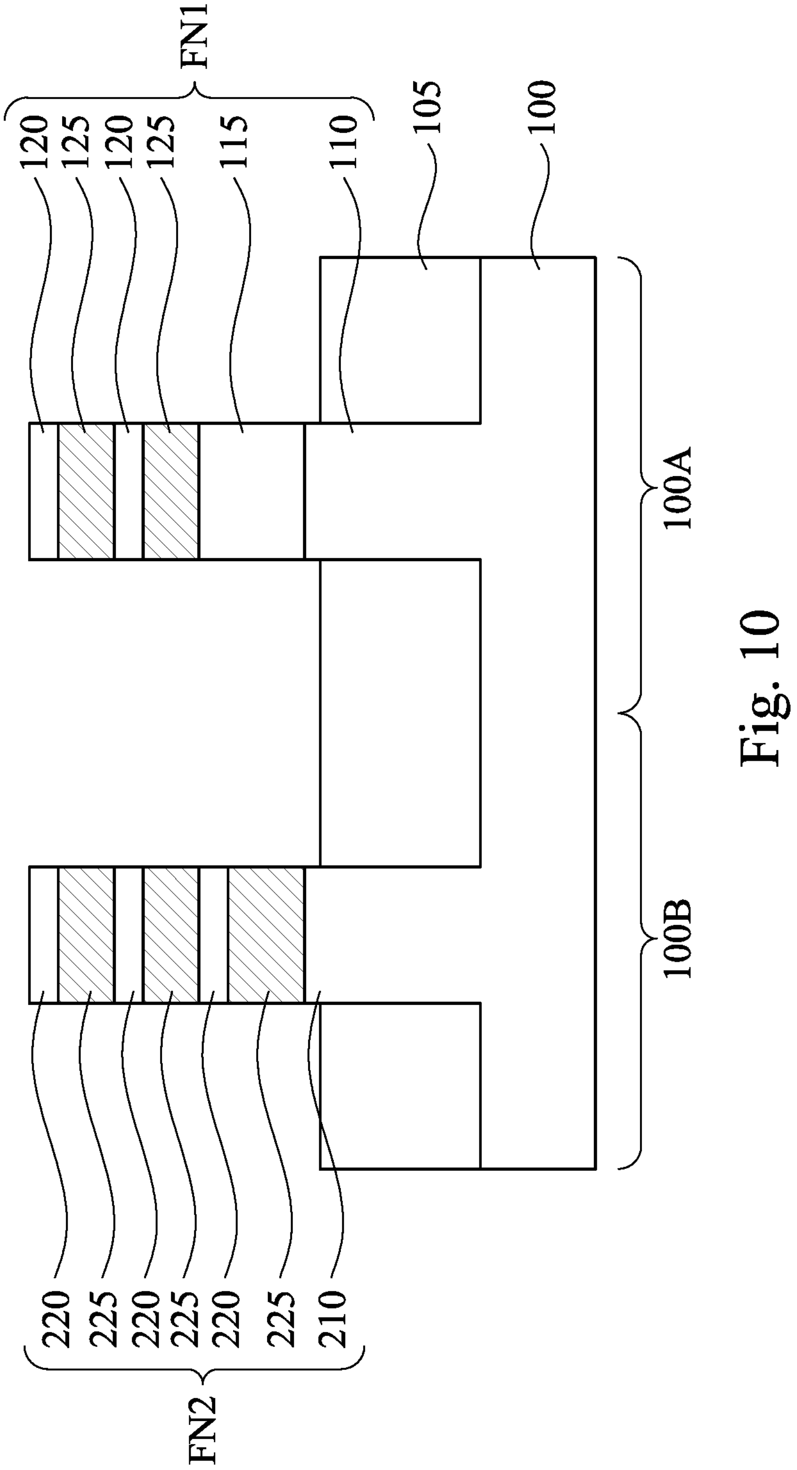

Reference is made to FIG. 10. Isolation structures 105 are formed over the substrate 100 and laterally surrounding the fin structures FN1 and FN2. In some embodiments, the isolation structures 105 may be formed by, for example, depositing a dielectric material blanket over the substrate 100 and covering the fin structures FN1 and FN2, performing a planarization process (e.g., CMP) to remove excess material of the dielectric material until the topmost semiconductor layers 120 and 220 are exposed, and them etching back the dielectric material to lower the top surface of the dielectric material to a desired position. In some embodiments, the patterned masks MA2 may be removed during the planarization process, and thus the topmost semiconductor layers 120 and 220 are exposed after the isolation structures 105 are formed.

Figure 11A:
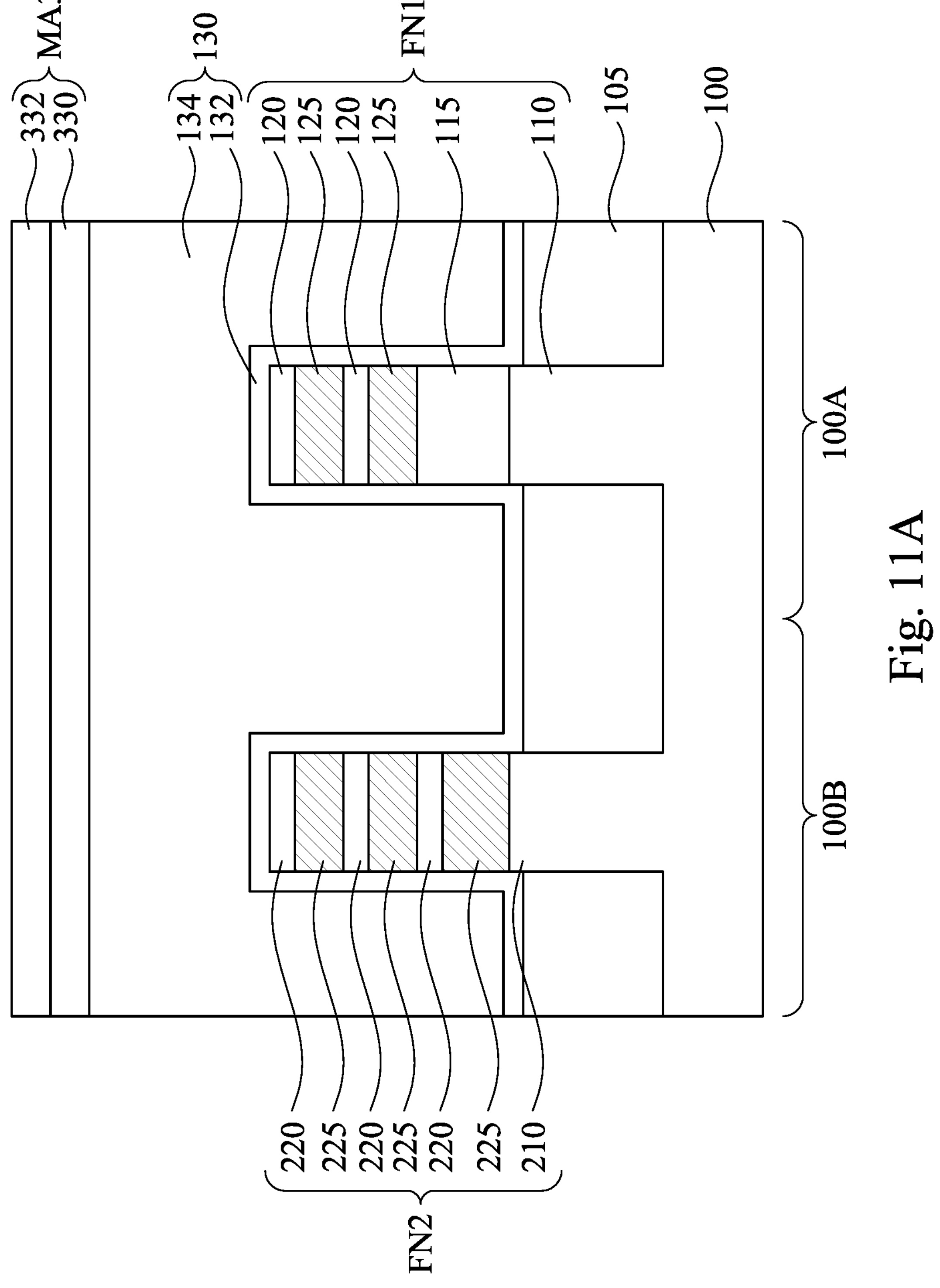
Figure 11B:
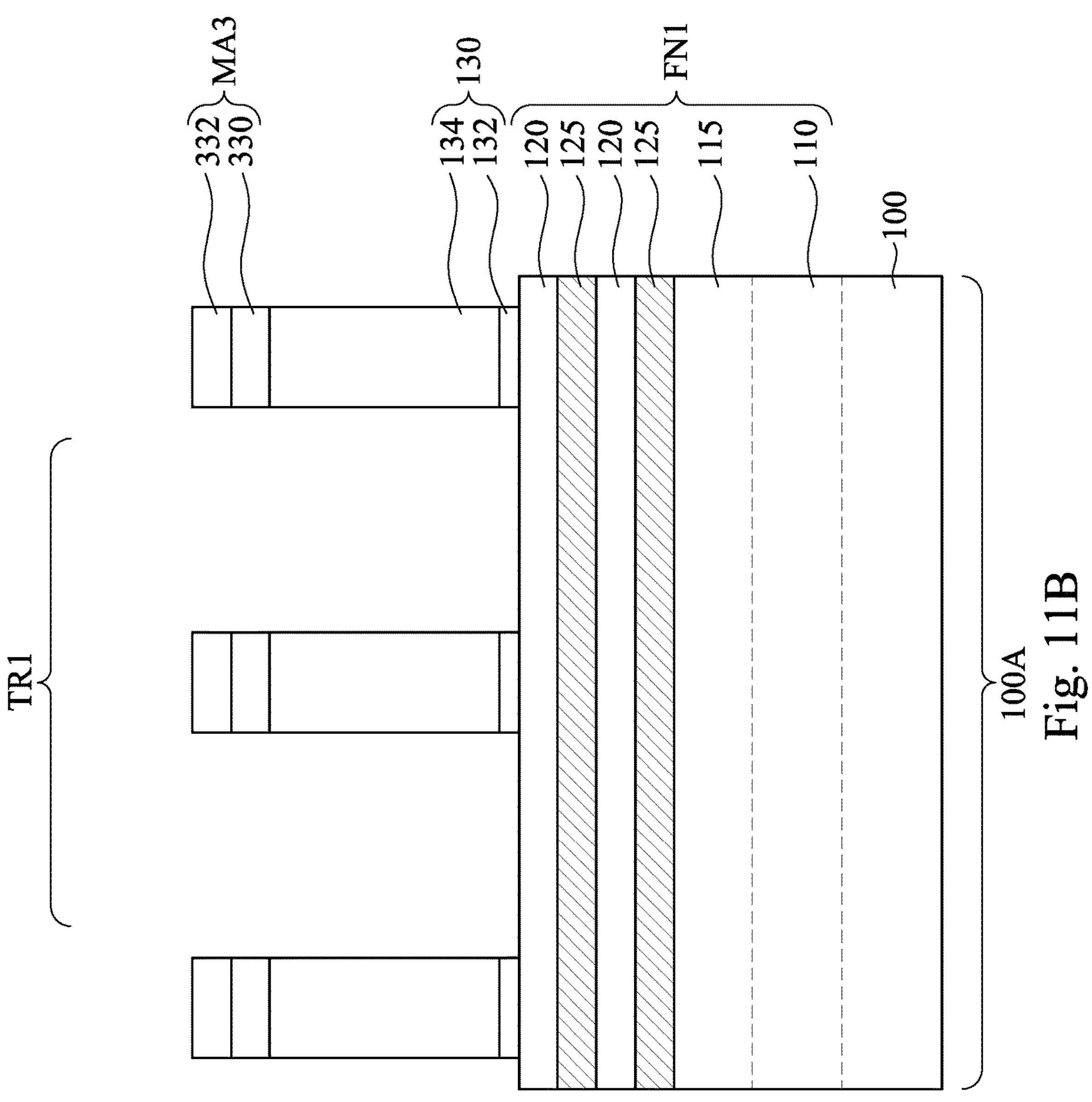
Figure 11C:
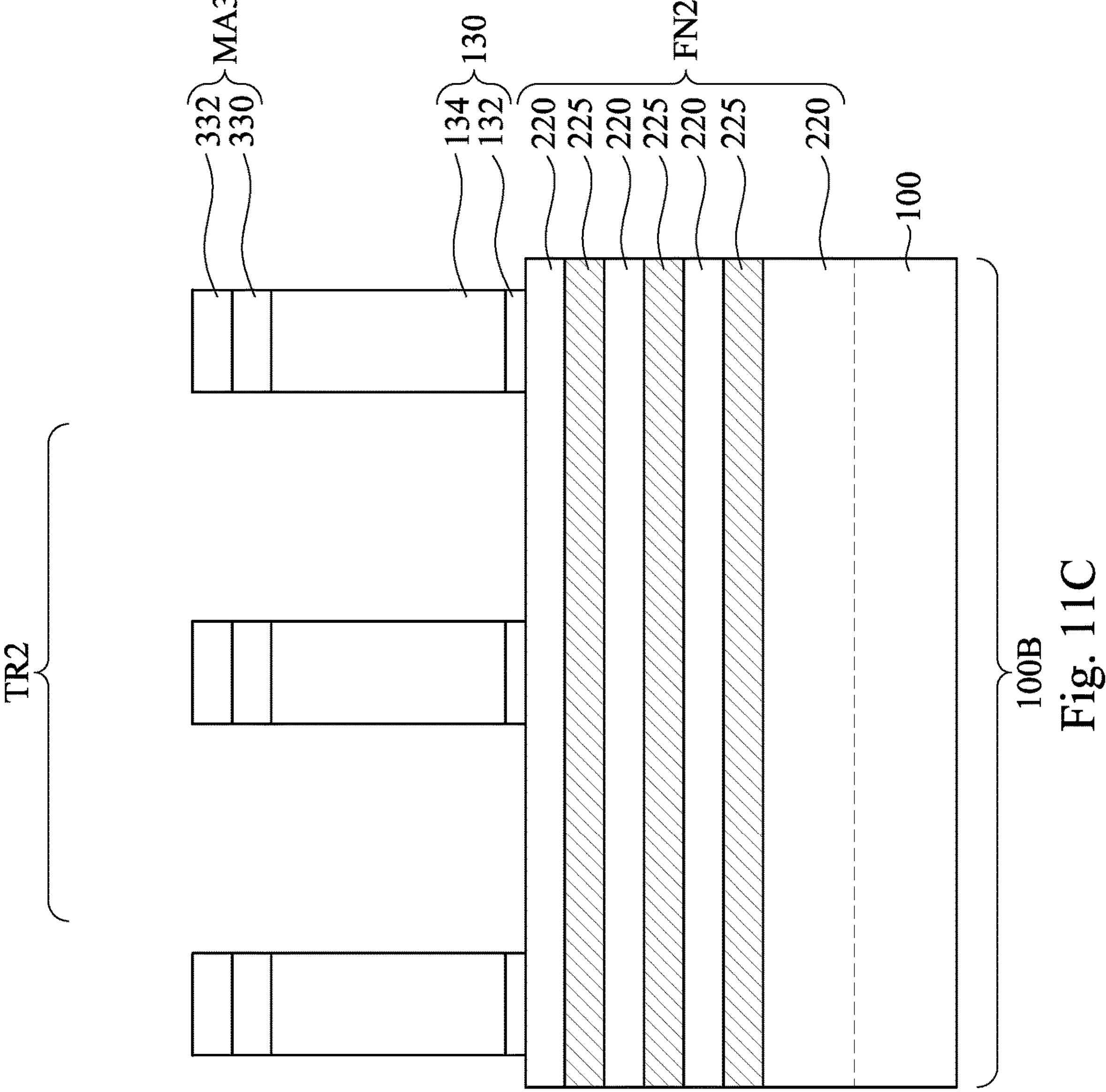

Reference is made to FIGS. 11A, 11B, and 11C. Dummy gate structures 130 are formed over the substrate 100 and crossing the fin structures FN1 and FN2. In some embodiments, each of the dummy gate structures 130 includes a dummy gate dielectric 132 and a dummy gate electrode 134 over the dummy gate dielectric 132. The dummy gate dielectric 132 may be, for example, silicon oxide, silicon nitride, a combination thereof, or the like, and may be deposited or thermally grown according to acceptable techniques. The dummy gate electrode 134 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals.

The dummy gate electrode 134 and the dummy gate dielectric 132 may be formed by, for example, depositing a dummy dielectric layer and a dummy gate layer over the substrate 100, forming patterned masks MA3 over the dummy gate layer, and then performing an etching process to the dummy dielectric layer and the dummy gate layer by using the patterned masks MA3 as an etching mask. In some embodiments, the dummy gate electrode 134 may be deposited by physical vapor deposition (PVD), CVD, sputter deposition, or other techniques for depositing the selected material. In some embodiments, the dummy gate dielectric 132 may be formed by thermal oxidation.

In some embodiments, the each of the patterned masks MA3 includes a first hard mask 330 and a second hard mask 332 over the first hard mask 330. The first hard mask 330 and the second hard mask 332 may be made of different materials. In some embodiments, the first hard mask 330 may be formed of silicon nitride, and the second hard mask 332 may be formed of silicon oxide.

Figure 12A:
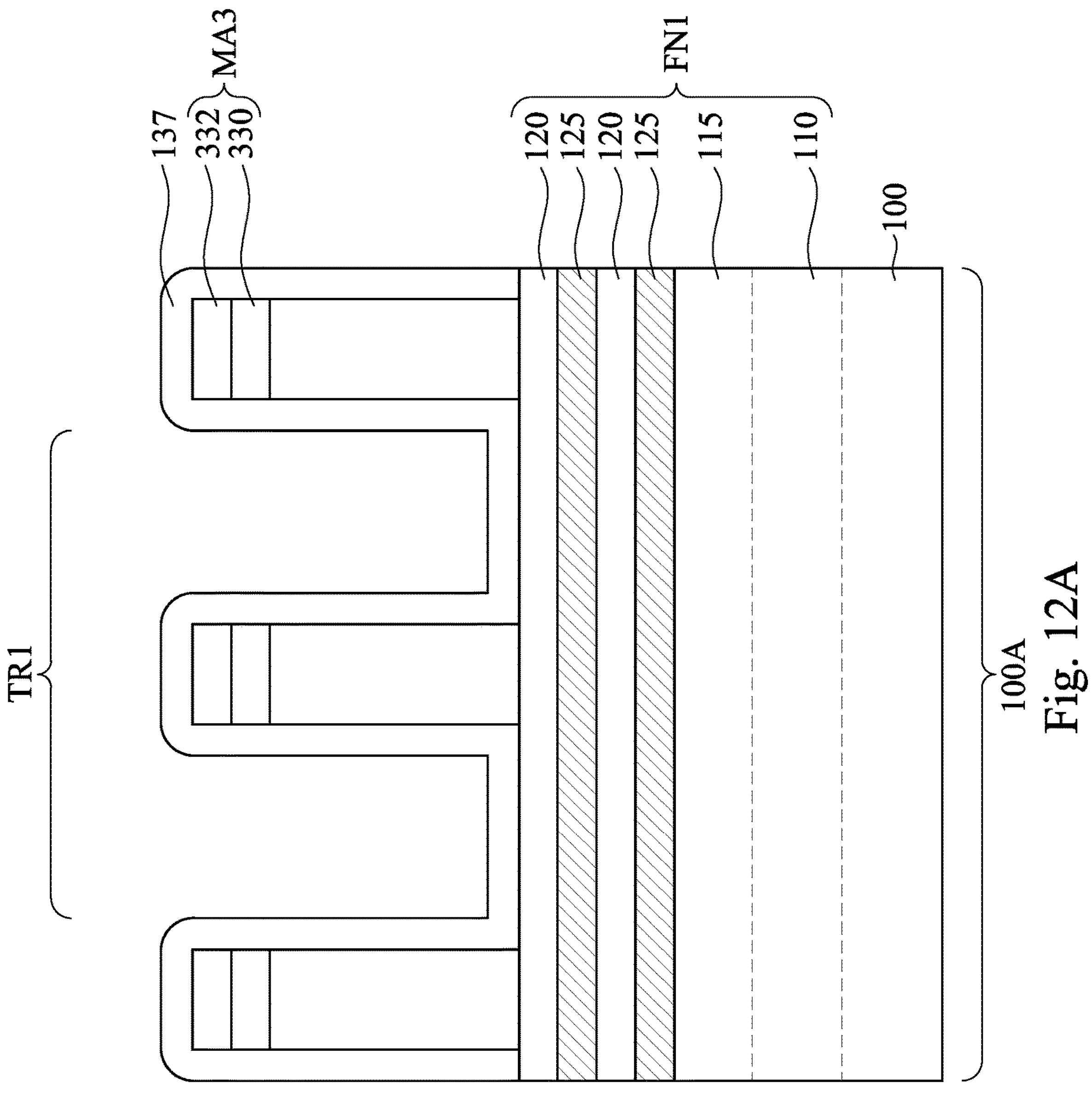
Figure 12B:
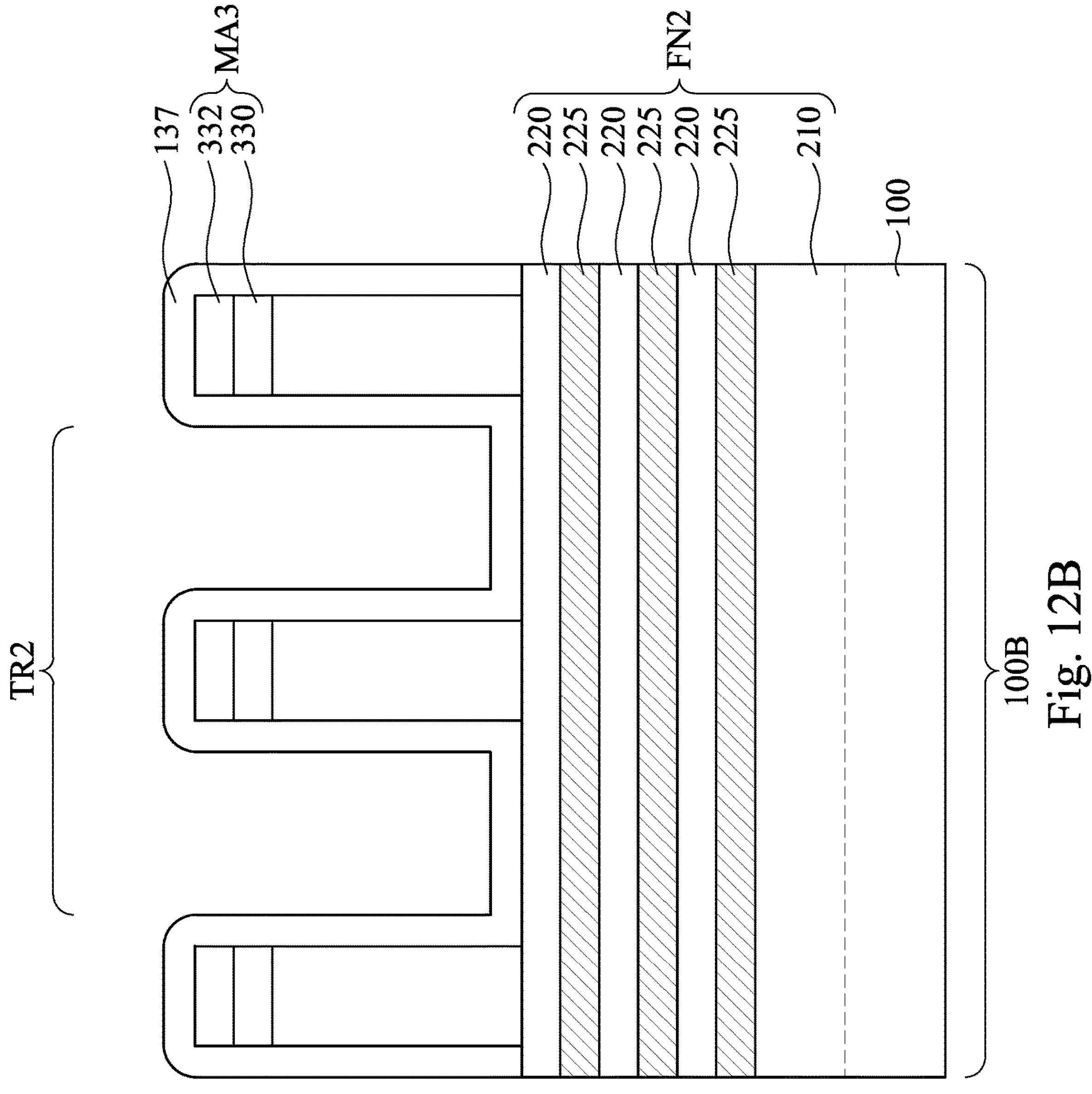

Reference is made to FIGS. 12A and 12B. A spacer layer 137 is deposited conformally over the structure of FIGS. 11A to 11C. In some embodiments, the spacer layer 137 may be formed of silicon oxide, silicon nitride, silicon oxynitride, combinations thereof, using techniques such as thermal oxidation or deposited by CVD, ALD, or the like.

Figure 13A:
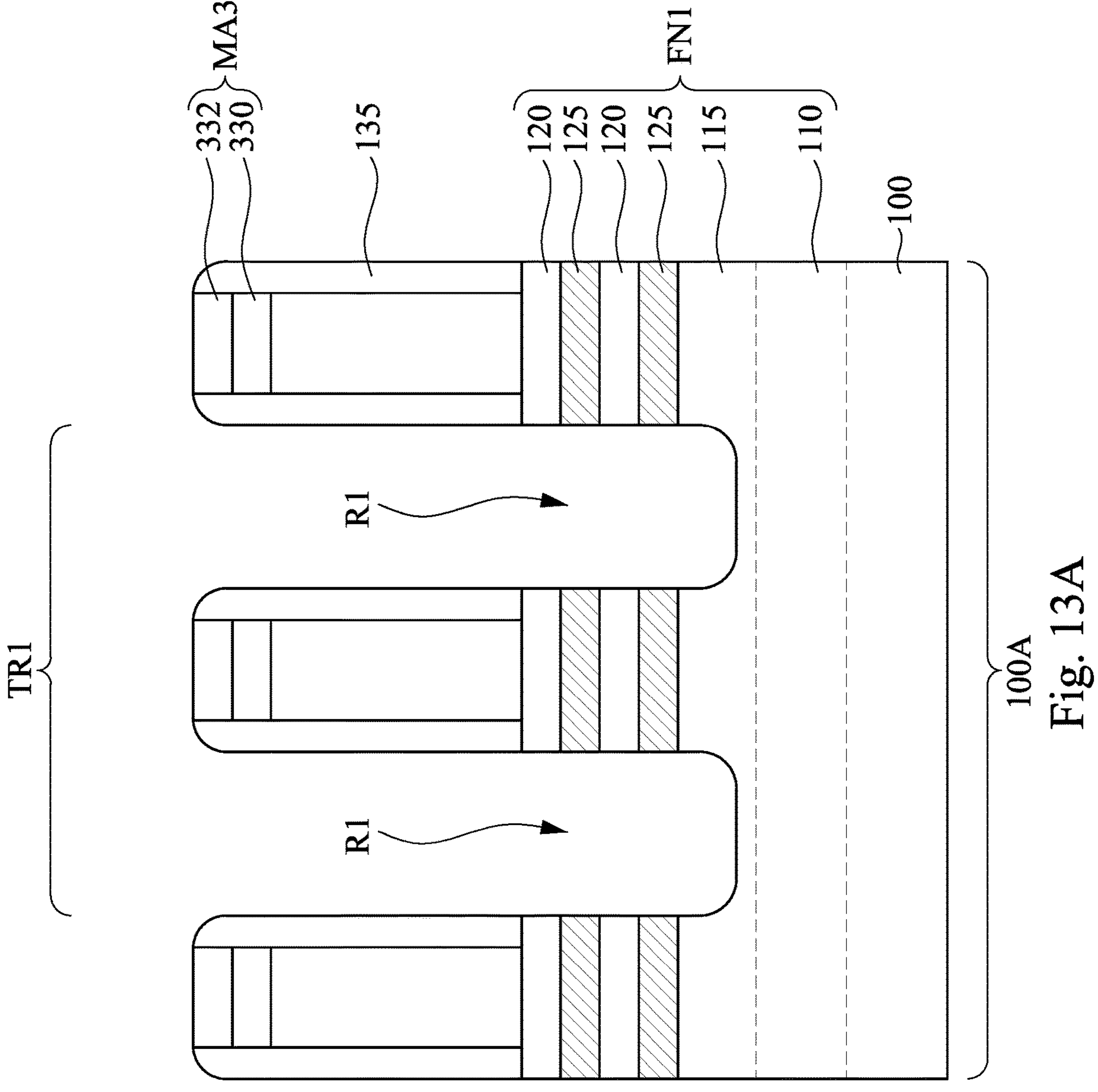
Figure 13B:
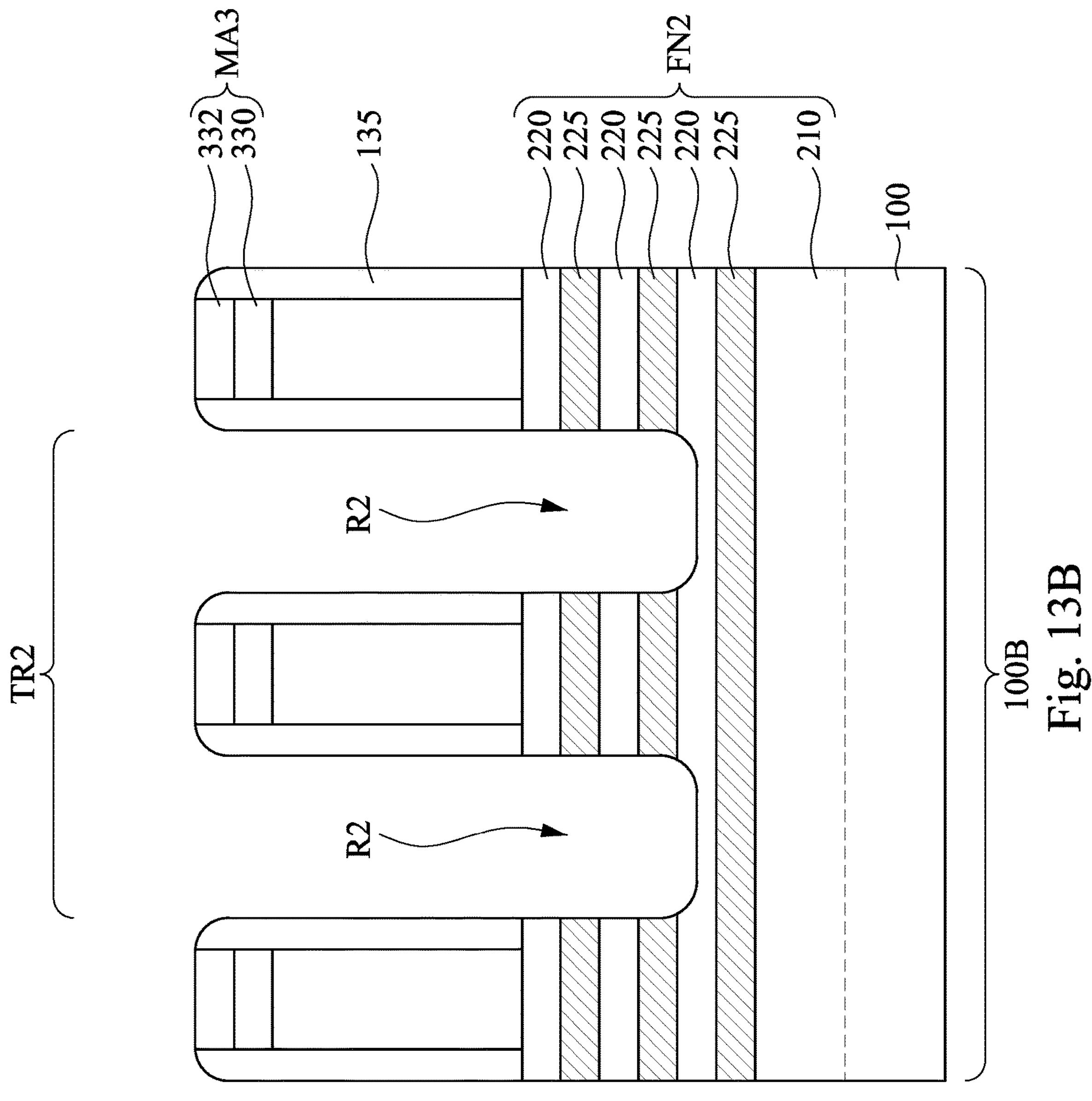

Reference is made to FIGS. 13A and 13B. An anisotropic etching process is performed to remove horizontal portions of the spacer layer 137, such that vertical portions of the spacer layer 137 remain on sidewalls of the dummy gate structures 130. In some embodiments, the remaining vertical portions of the spacer layer 137 on sidewalls of the dummy gate structures 130 can be referred to as gate spacers 135.

Afterward, an etching process may be performed to remove portions of the stack of the semiconductor layers 115, 120, and 125 that are exposed by the dummy gate structures 130 and the gate spacers 135, so as to form recesses R1 in the stack of the semiconductor layers 115, 120, and 125 (or in the fin structure FN1). The etching process also removes portions of the stack of the semiconductor layers 220 and 225 that are exposed by the dummy gate structures 130 and the gate spacers 135, so as to form recesses R2 in the stack of the semiconductor layers 220 and 225 (or in the fin structure FN2).

In some embodiments, the etching process may be control such that the bottom end of each recess R1 is higher than the semiconductor strip 110, and the bottom end of each recess R2 is higher than the semiconductor strip 210. In some embodiments, the bottom end of each recess R2 is higher than the bottom surface of the bottommost semiconductor layer 225. That is, the etching process does not etch through the bottommost semiconductor layer 225.

Figure 14A:
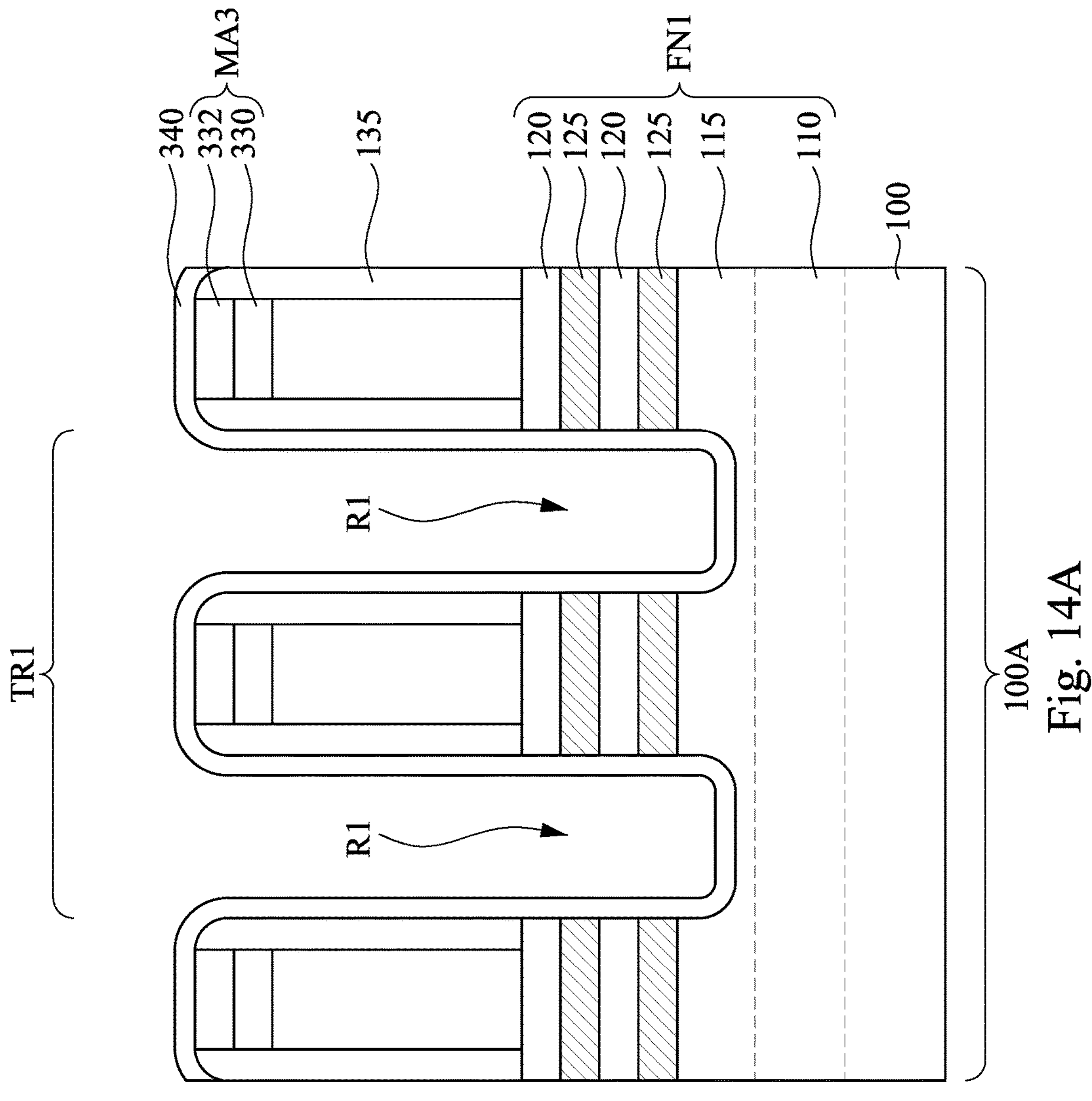
Figure 14B:
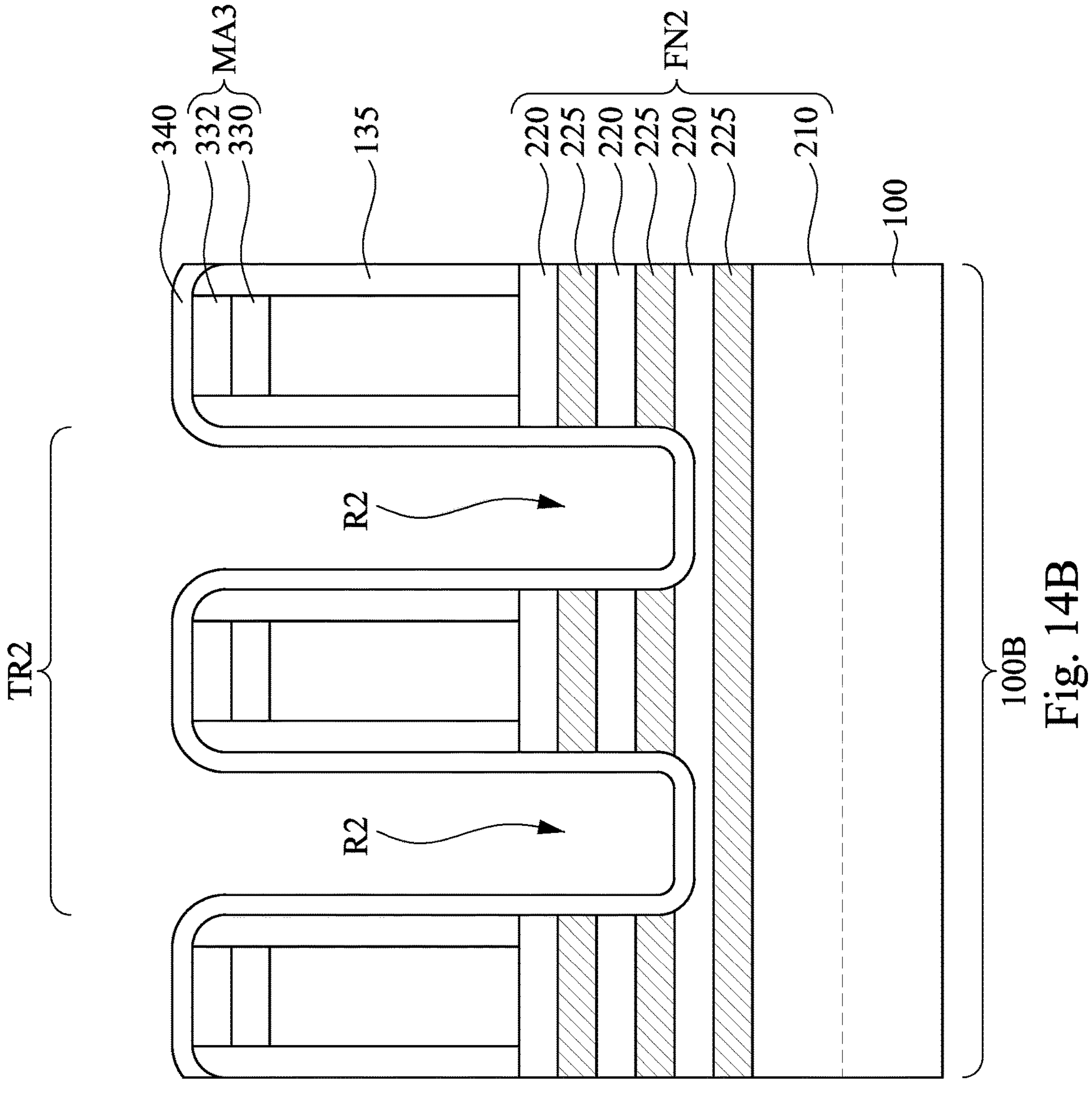

Reference is made to FIGS. 14A and 14B. A hard mask layer 340 is deposited over the substrate 100 and conformal to the structure of FIGS. 13A and 13B. In greater details, the hard mask layer 340 may be conformal to the dummy gate structures 130, the gate spacers 135, and the recesses R1 and R2. In some embodiments, the material of the hard mask layer 340 may include silicon oxide, silicon nitride, silicon oxynitride, aluminum oxide, or other suitable materials. In some embodiments, the hard mask layer 340 may be deposited using suitable deposition process, such as CVD, ALD, or the like.

Figure 15A:
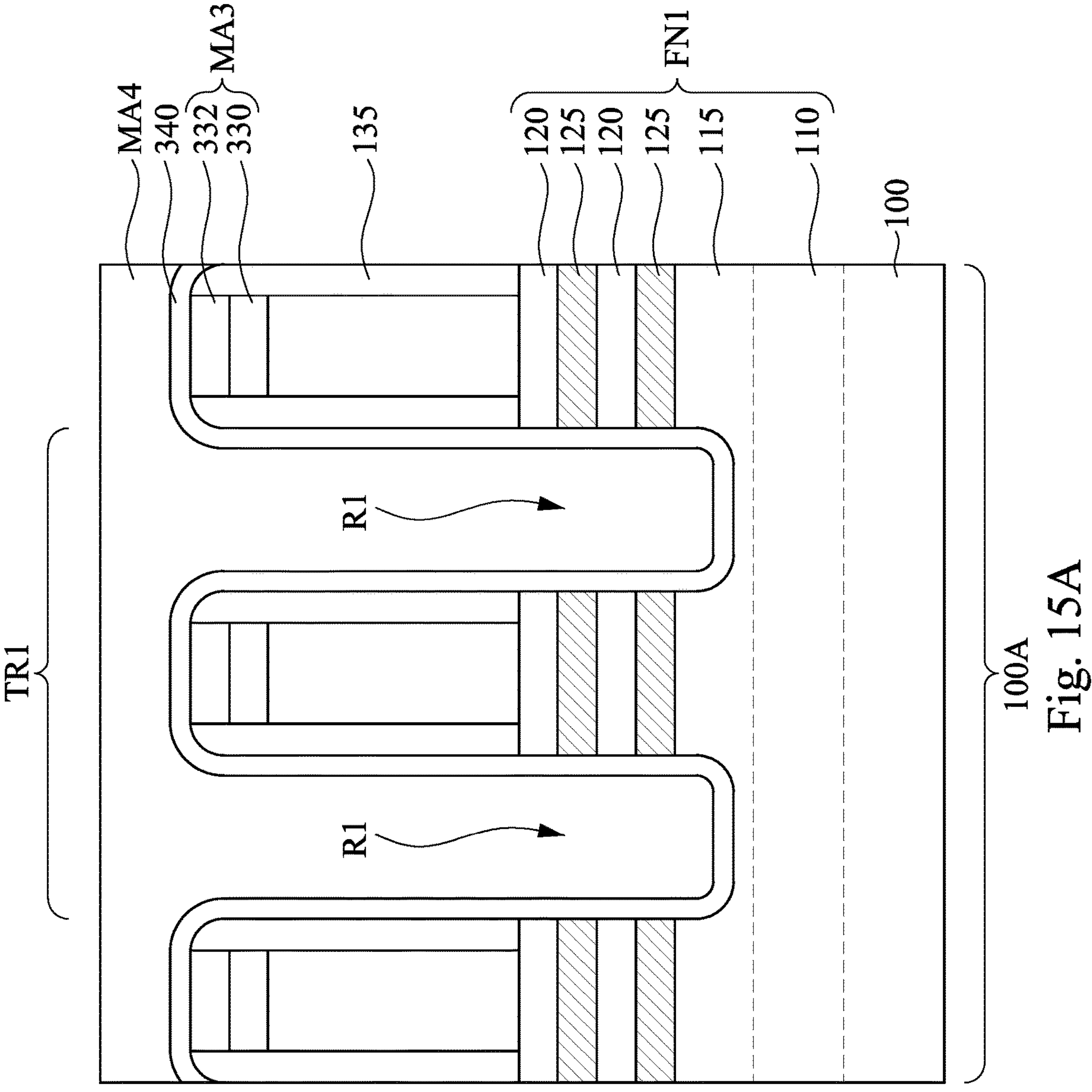
Figure 15B:
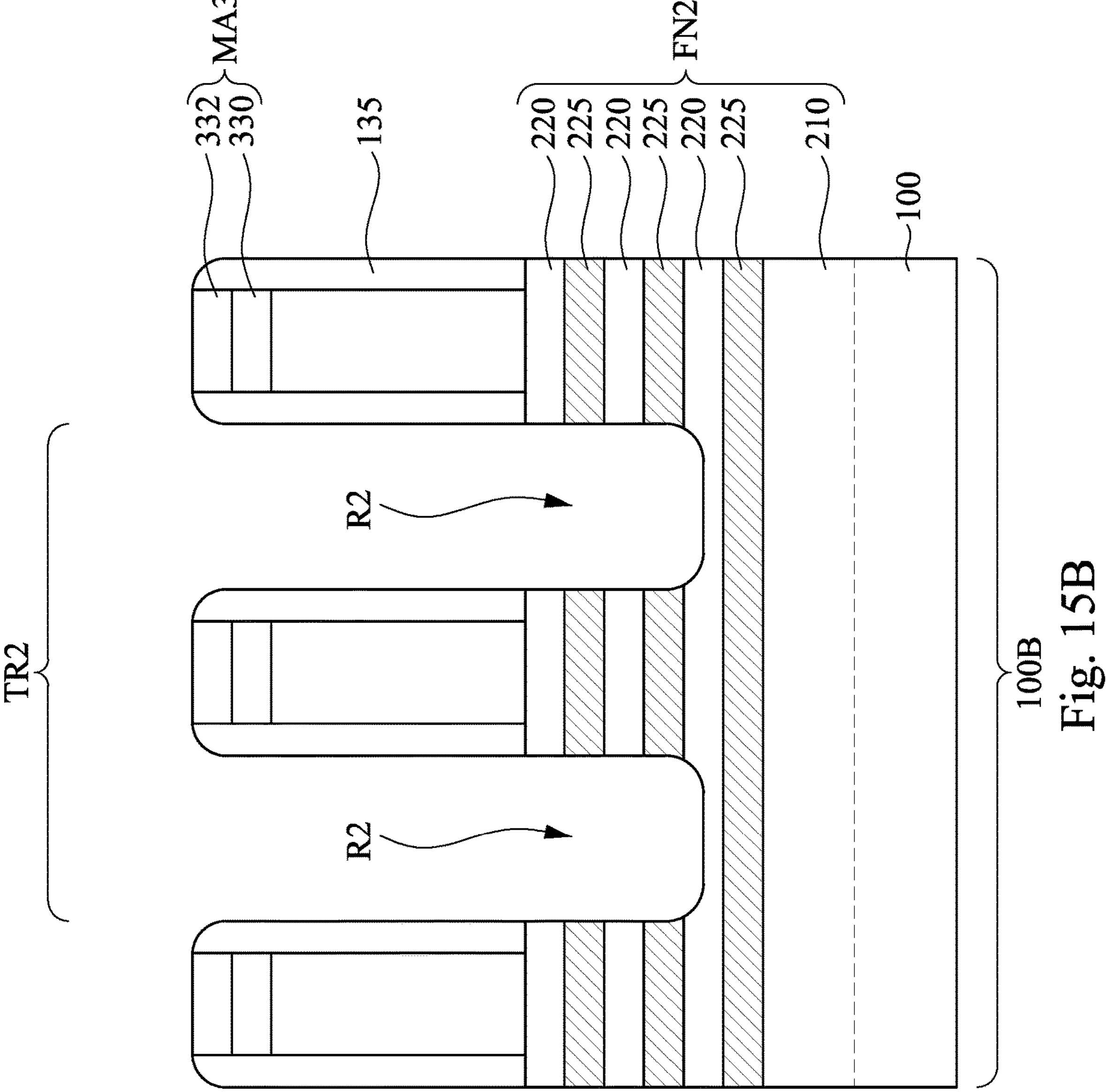

Reference is made to FIGS. 15A and 15B. A patterned mask MA4 is formed covering the first region 100A of the substrate 100, while leaving the second region 100B of the substrate 100 exposed. In greater details, the patterned mask MA4 may fill the recesses R1 and covering portion of the hard mask layer 340 within the first region 100A of the substrate 100.

Afterward, an etching process is performed to remove a portion of the hard mask layer 340 exposed by the patterned mask MA4. In greater details, the etching process is performed to remove the portion of the hard mask layer 340 within the second region 100B of the substrate 100. On the other hand, the portion of the hard mask layer 340 within the first region 100A of the substrate 100 is protected by the patterned mask MA4 during the etching process. In some embodiments, the patterned mask MA4 may include photoresist, and may be formed by suitable photolithography process.

Figure 16A:
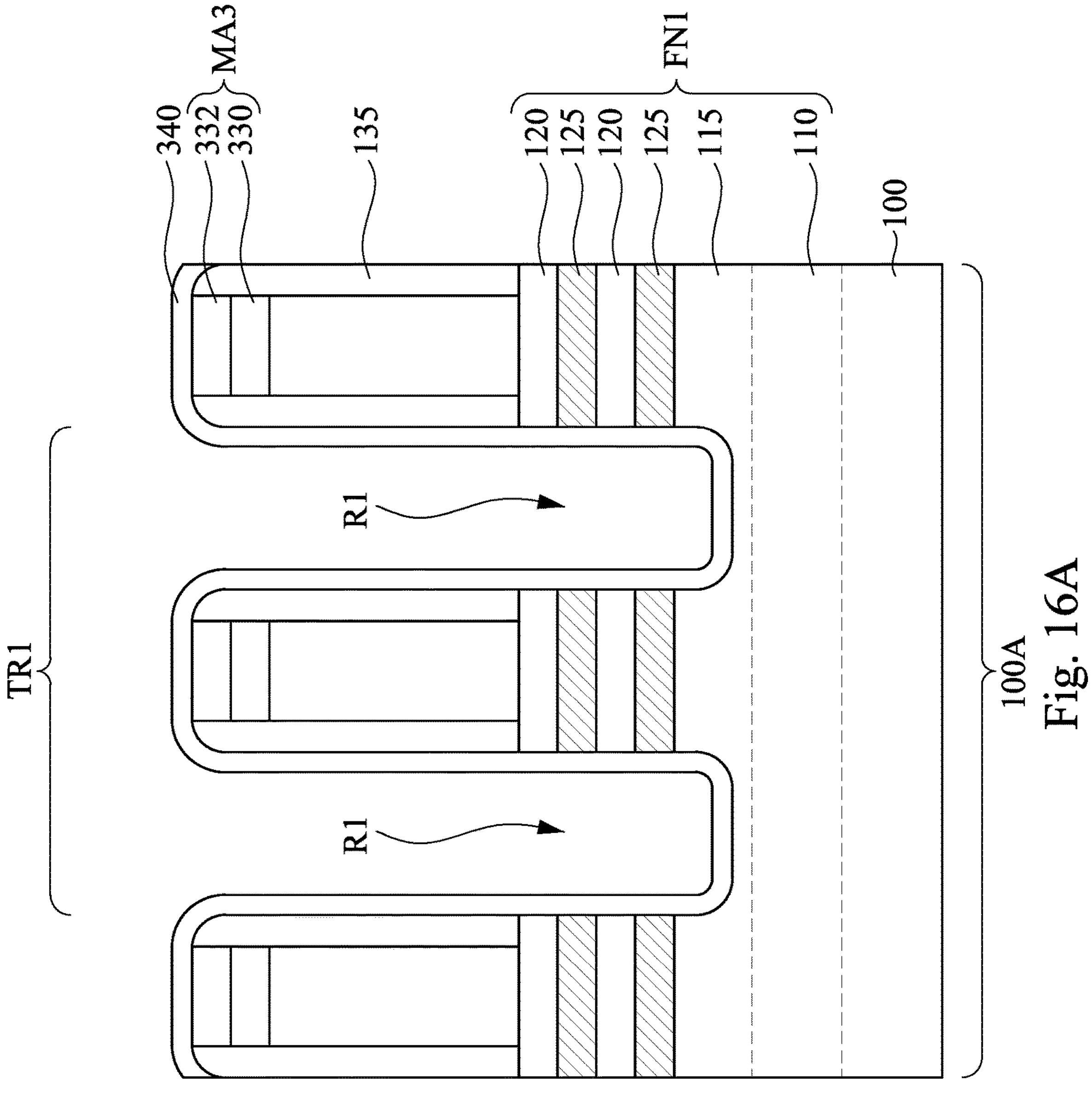
Figure 16B:
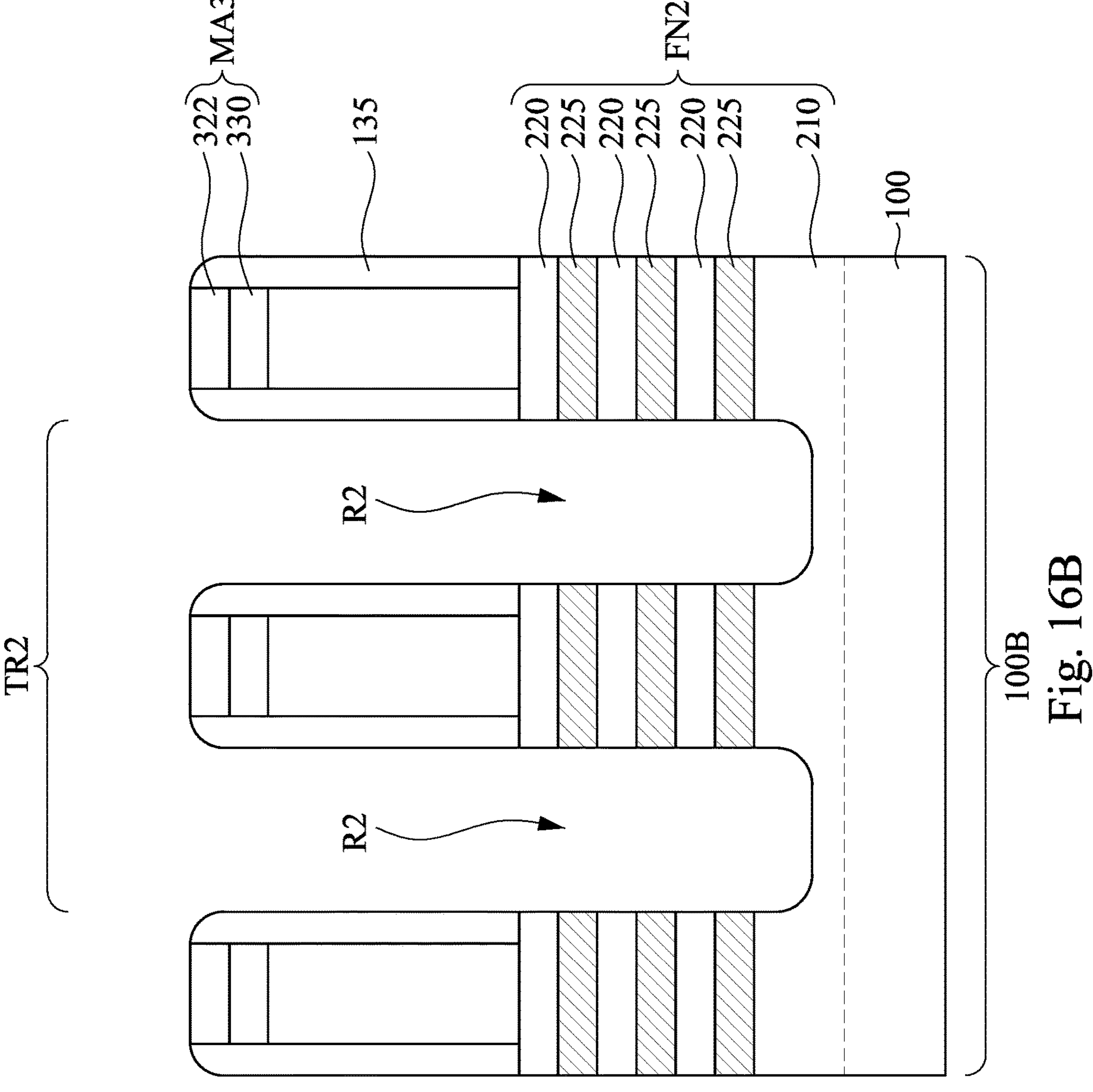

Reference is made to FIGS. 16A and 16B. The patterned mask MA4 is removed, so as to expose the remaining portion of the hard mask layer 340 within the first region 100A of the substrate 100. In some embodiments where the patterned mask MA4 is made of photoresist, the patterned mask MA4 can be removed using suitable process, such as ashing.

Afterwards, an etching process is performed to deepen the recesses R2, such that the bottom end of each recess R2 is lowered to a position that is below the top surface of the semiconductor strip 210. In some embodiments, during the etching process for deepening the recesses R2, the recesses R1 within the fin structure FN1 is protected by the hard mask layer 340, and thus the etching process would not affect the depth of the recesses R1. In some embodiments, the etching process may include dry etch, wet etch, or combinations thereof.

Figure 17A:
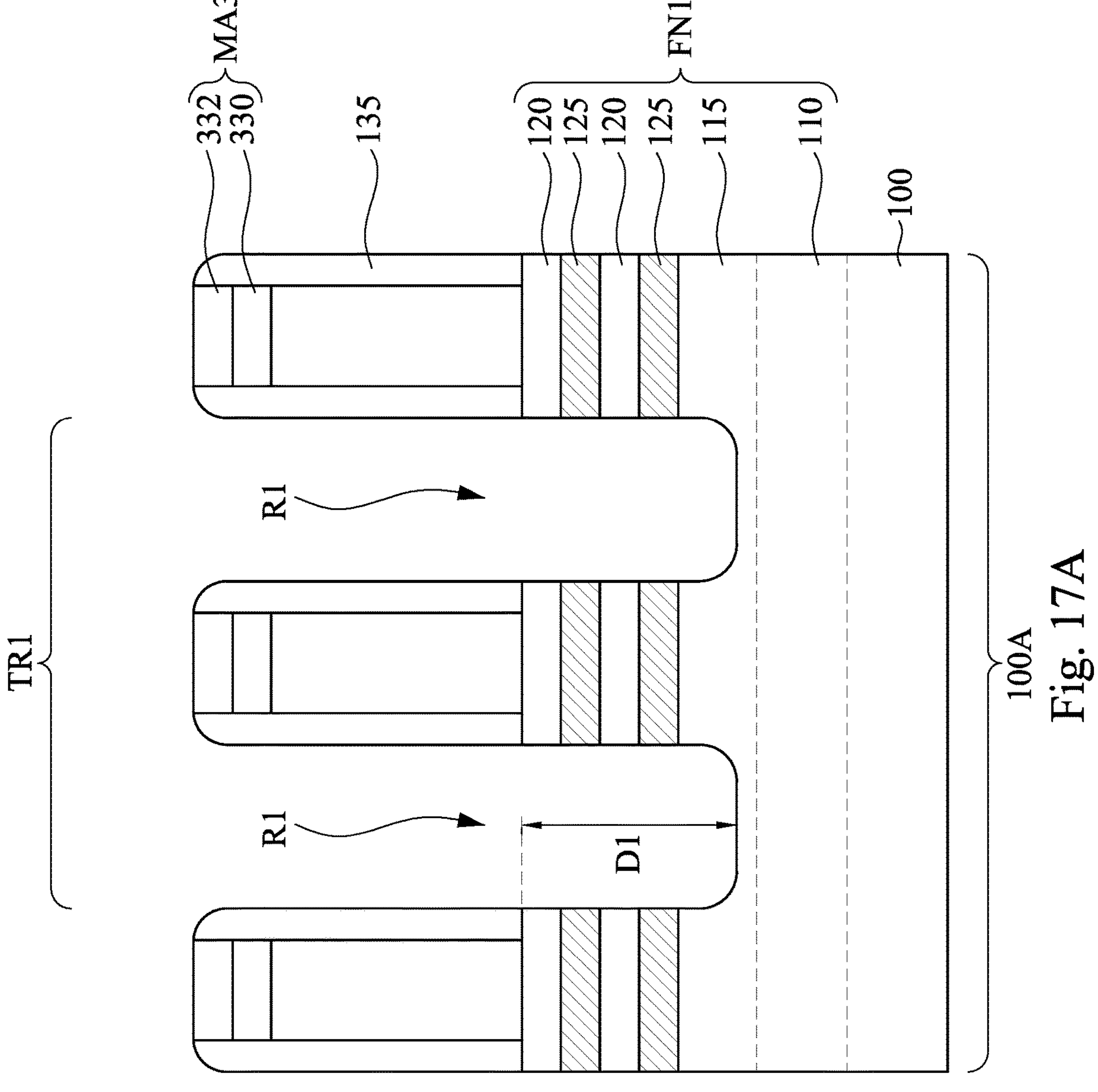
Figure 17B:
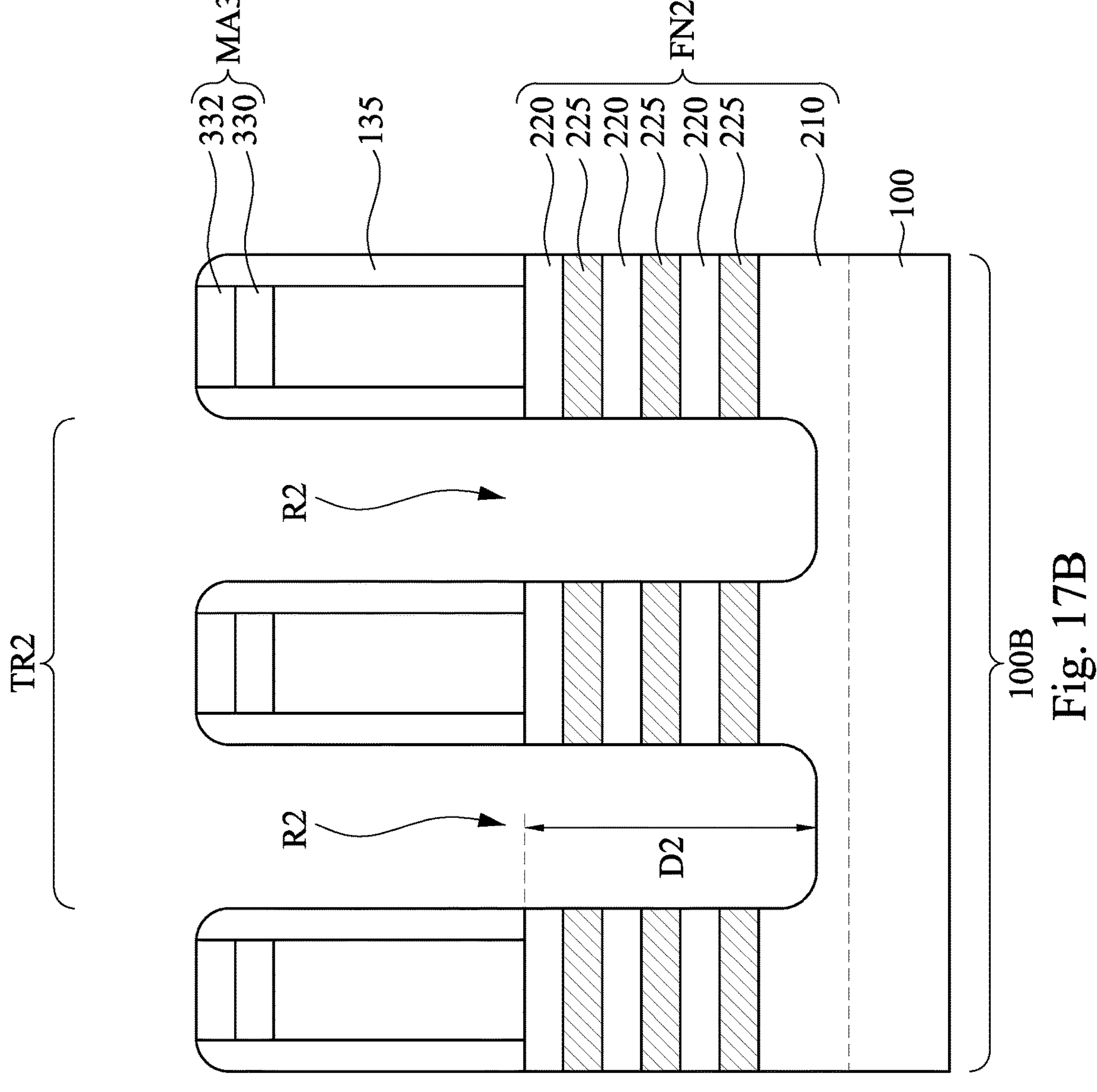

Reference is made to FIGS. 17A and 17B. The hard mask layer 340 is removed, so as to expose the recesses R1. In some embodiments, the hard mask layer 340 may be removed using suitable etching process. In some embodiments, because the recesses R2 are deepened during the etching process discussed in FIGS. 16A and 16B, each of the recesses R2 may include a depth D2 that is greater than the depth D1 of each of the recesses R1.

Figure 18A:
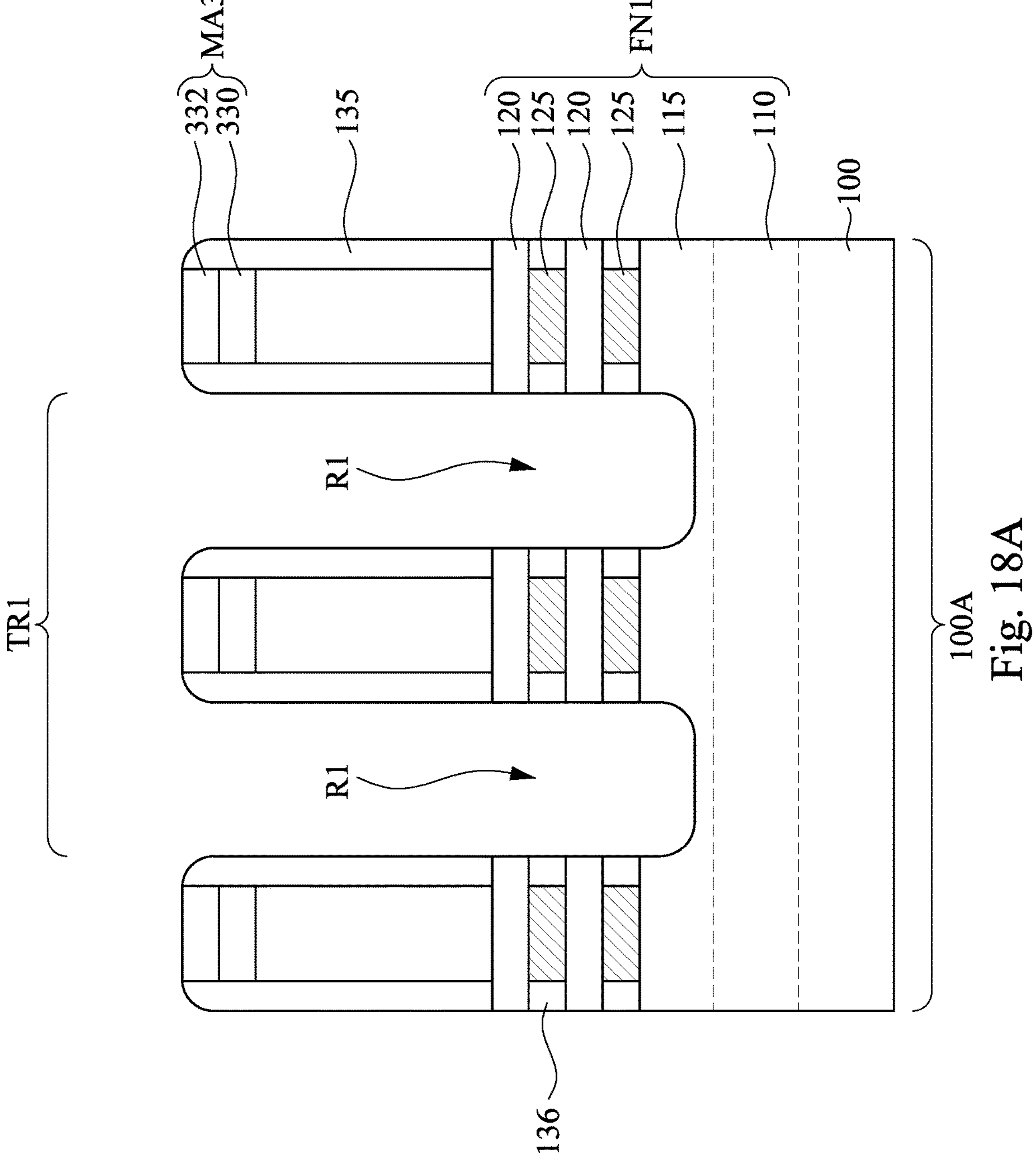
Figure 18B:
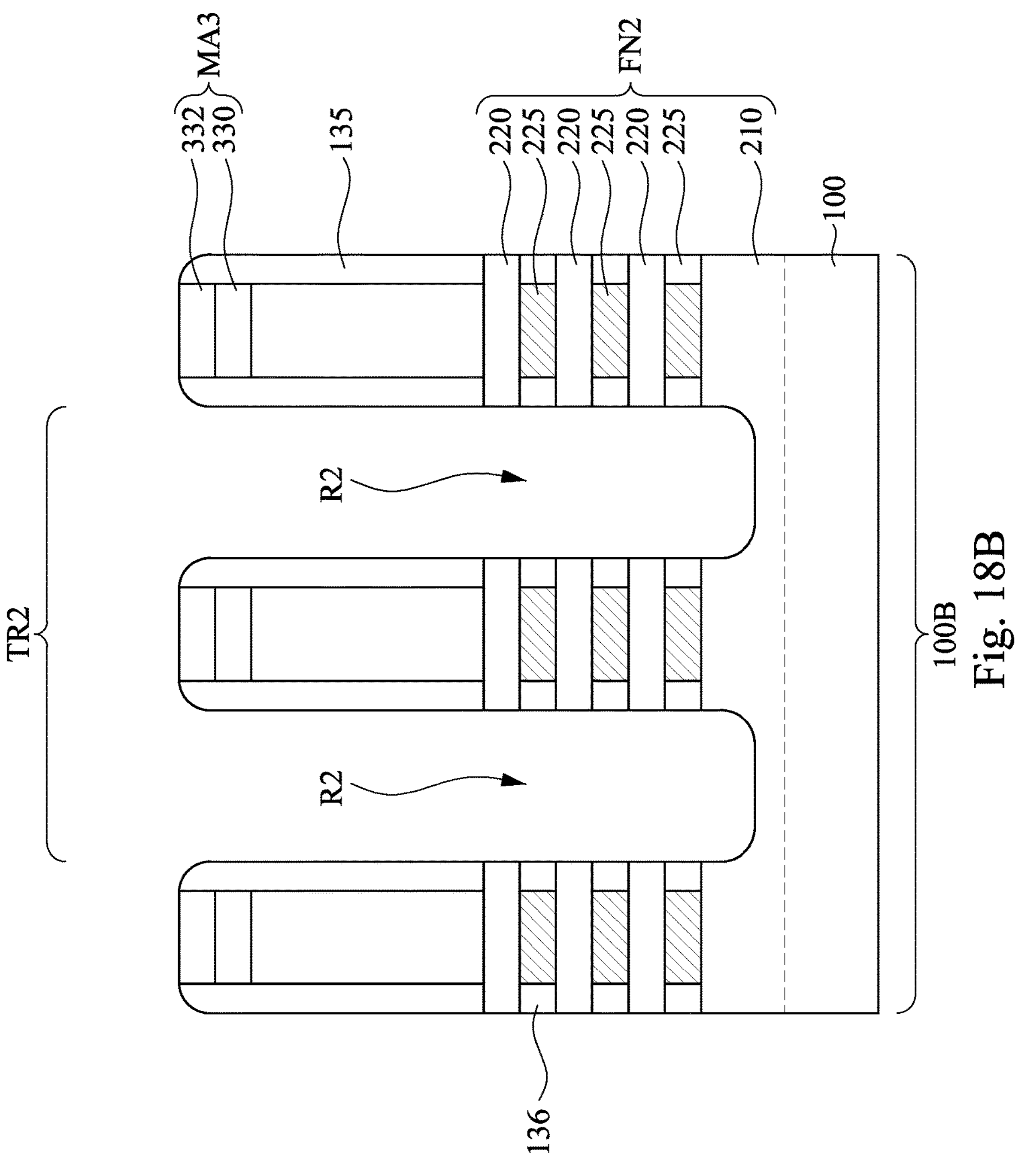

Reference is made to FIGS. 18A and 18B. Portions of the semiconductor layers 125 exposed by the recesses R1 are laterally etched to form sidewall recesses, and portions of the semiconductor layers 225 exposed by the recesses R2 are laterally etched to form sidewall recesses, and then inner spacers 136 are formed in the sidewall recesses. In some embodiments, the sidewalls of the semiconductor layers 125 and 225 may be etched using isotropic etching processes, such as wet etching or the like. In some embodiments where the semiconductor layers 125 and 225 include, e.g., SiGe, and the semiconductor layers 120 and 220 include, e.g., Si, a dry etch process with tetramethylammonium hydroxide (TMAH), ammonium hydroxide ($NH_4OH$), or the like may be used to etch sidewalls of the semiconductor layers 125 and 225.

The inner spacers 136 may be deposited by a conformal deposition process, such as CVD, ALD, or the like. The inner spacer layer may include a material such as SiN, SiOCN, SiCN, SIOC, although any suitable material, such as low-dielectric constant (low-k) materials having a k-value less than about 3.5, may be utilized. The inner spacers 136 may be formed by, for example, depositing an inner spacer layer blanket over the substrate 100 and filling the sidewall recesses of the semiconductor layers 125 and 225, and then performing an anisotropic etching to remove portions of the inner spacer layer outside the sidewall recesses.

Figure 19A:
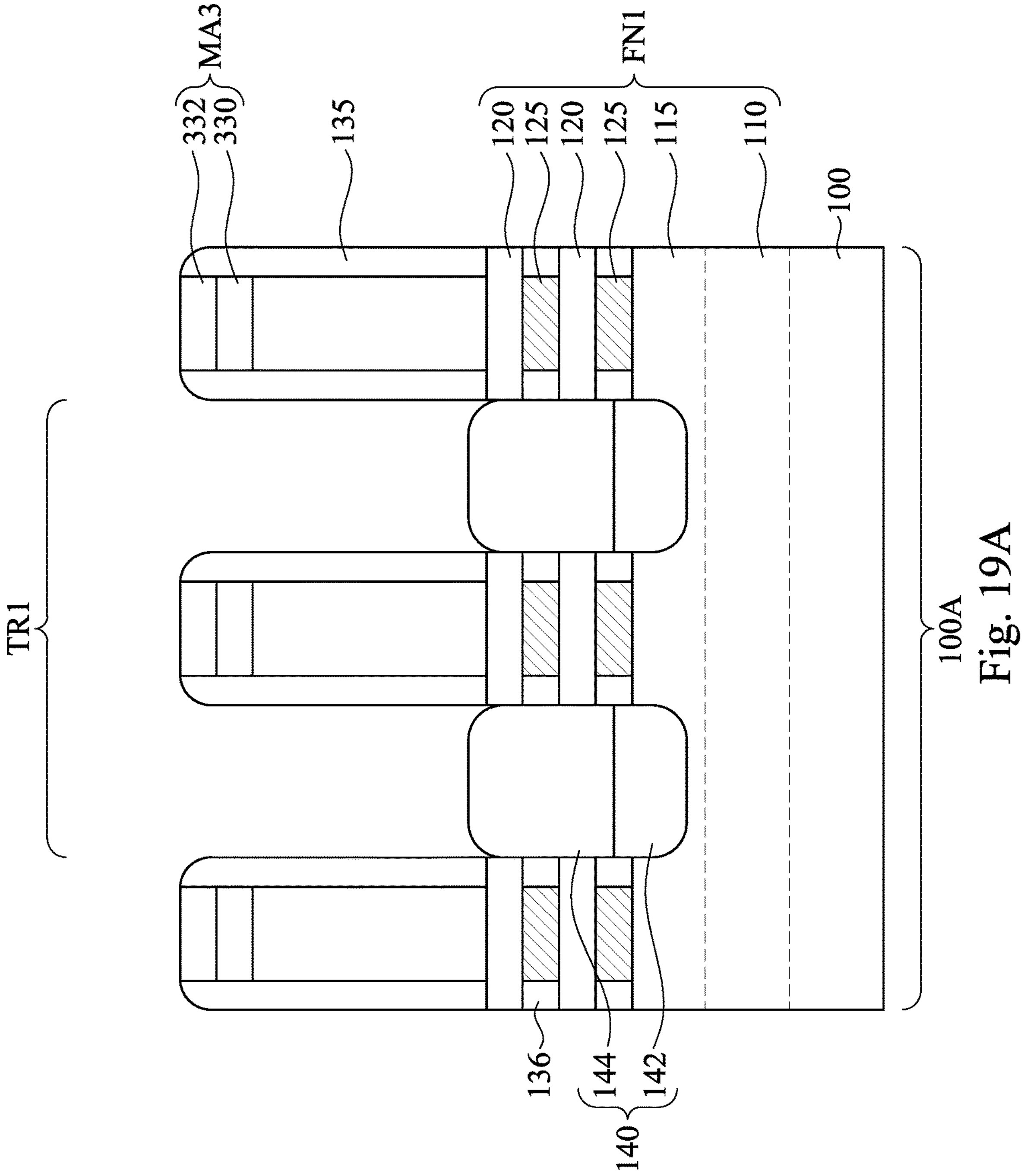
Figure 19B:
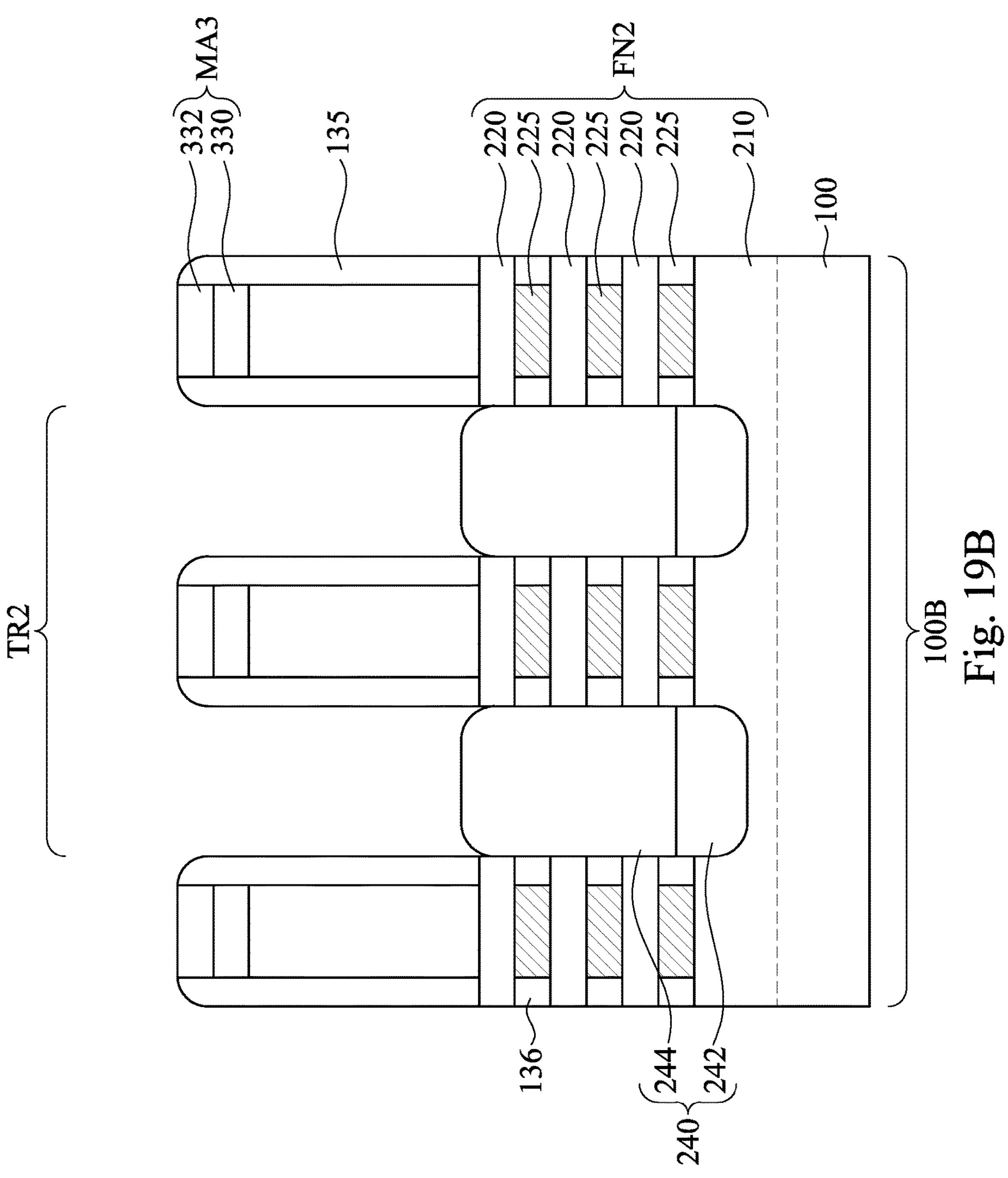

Reference is made to FIGS. 19A and 19B. Source/drain epitaxy structures 140 and 240 are formed in the recesses R1 and R2, respectively. In some embodiments, epitaxy layers 142 and 242 are formed in the recesses R1 and R2, respectively. After the epitaxy layers 142 and 242 are formed, epitaxy layers 144 and 244 are formed over the epitaxy layers 142 and 242, respectively.

In some embodiments, the formation of the epitaxy layers 142 and 242 may include a plurality of deposition cycles, in which each deposition cycle may include a selective epitaxial growth (SEG) process and an etching process. In some embodiments, the SEG process may selectively grow a semiconductor material on exposed semiconductor surfaces, such as the exposed surfaces of the semiconductor strips 110 and 210 and the exposed surfaces of the semiconductor layers 120 and 220. However, because the exposed areas of the semiconductor strips 110 and 210 are greater than the exposed area of each of the semiconductor layers 120 and 220, the semiconductor material may include higher growing rate on the exposed areas of the semiconductor strips 110 and 210 than on the exposed area of each of the semiconductor layers 120 and 220. That is, a greater amount of the semiconductor material will be grown on the exposed areas of the semiconductor strips 110 and 210 than on the exposed area of each of the semiconductor layers 120 and 220. As a result, the etching process in each deposition cycle of the epitaxy layers 142 and 242 may remove portions of the semiconductor material formed on the exposed area of each of the semiconductor layers 120 and 220, while portions of the semiconductor material may remain over the semiconductor strips 110 and 210 after the etching process. Accordingly, performing several deposition cycles may allow a bottom-up deposition for the epitaxy layers 142 and 242. That is, the epitaxy layers 142 and 242 may be formed from the bottoms of the recesses R1 and R2 via a bottom-up manner. In some embodiments, the thicknesses of the epitaxy layers 142 and 242 are substantially the same.

The epitaxy layers 144 and 244 may be formed by suitable deposition process, such as a selective epitaxial growth (SEG) process. In some embodiments, the SEG process may selectively grow a semiconductor material on exposed semiconductor surfaces, such as the exposed surfaces of the epitaxy layers 142 and 242 and the exposed surfaces of the semiconductor layers 120 and 220. Because there are more semiconductor layers 220 than the semiconductor layers 120, a greater amount of the semiconductor material will be grown in the recesses R2 than in the recesses R1, which results in that the epitaxy layer 244 is thicker than the epitaxy layer 144. In some embodiments, an implantation process may be performed to the epitaxy layers 144 and 244. In some embodiments, the epitaxy layers 142 and 242 may be formed without performing an implantation process, and thus the epitaxy layers 142 and 242 are un-doped.

Figure 20A:
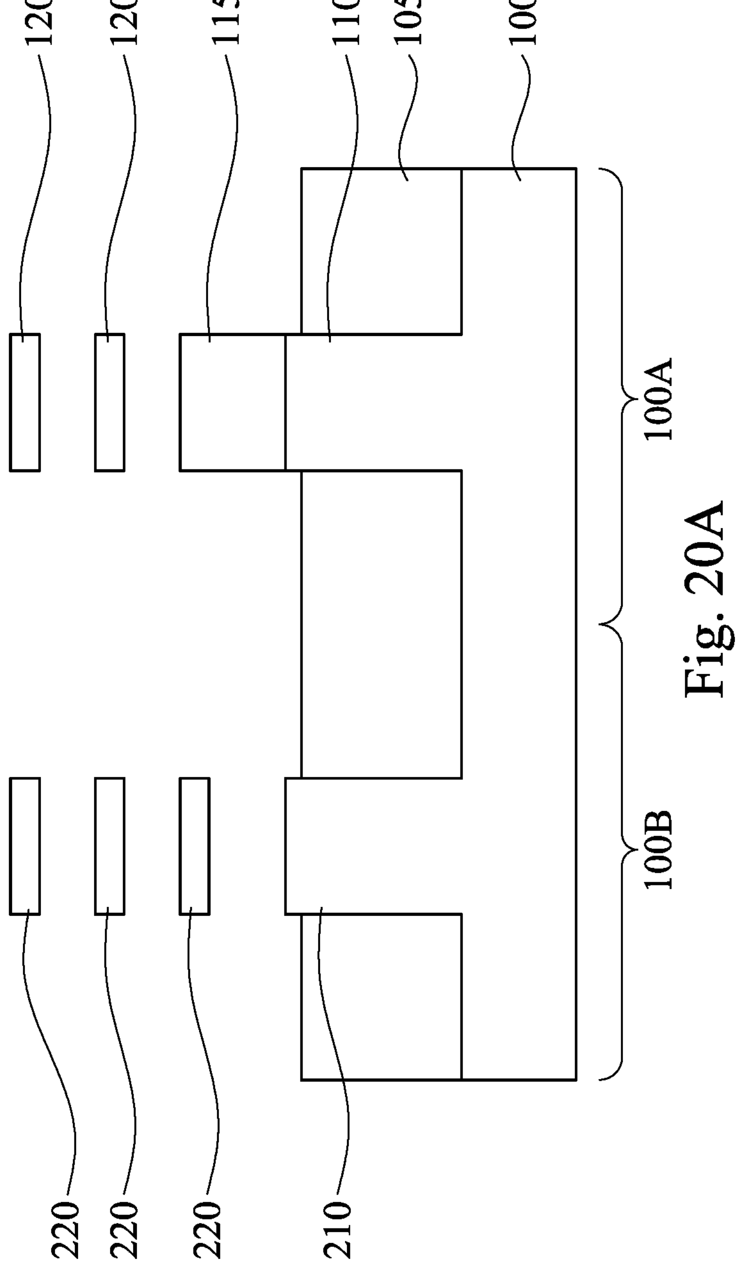
Figure 20B:
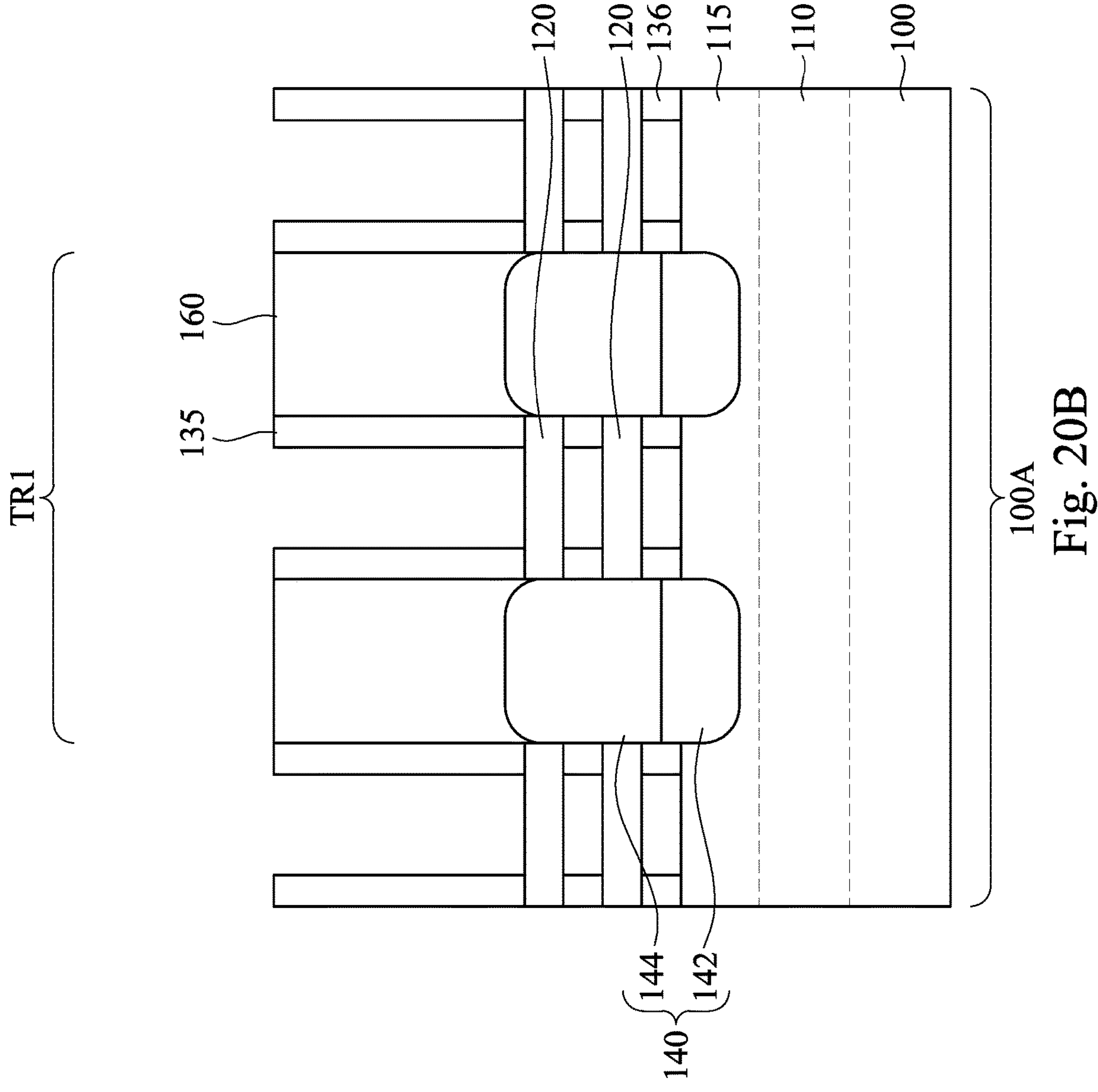
Figure 20C:
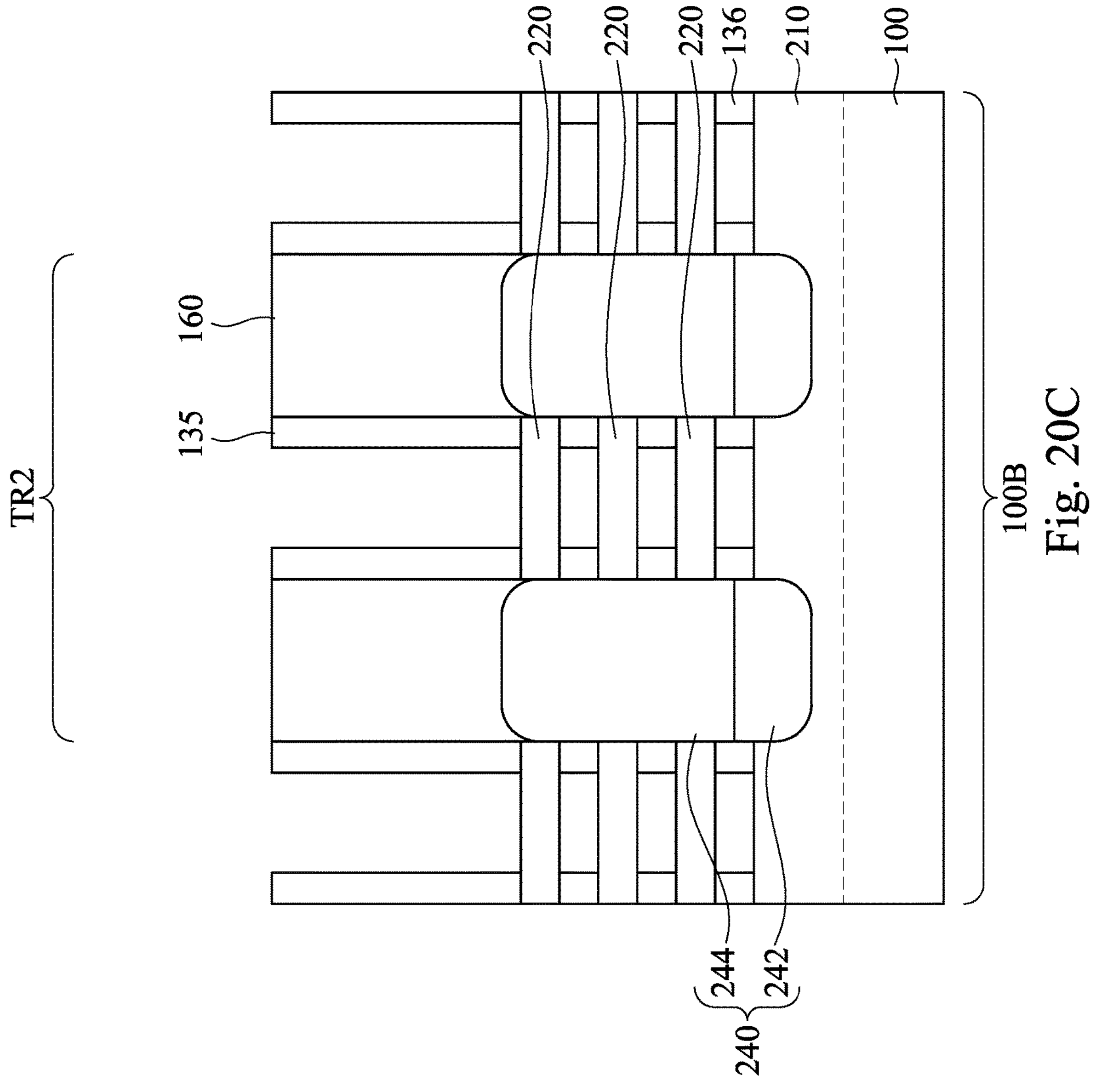

Reference is made to FIGS. 20A, 20B, and 20C. An interlayer dielectric (ILD) layer 160 is formed over the substrate 100 and covering the source/drain epitaxy structures 140 and 240. In some embodiments, the ILD layer 160 can be formed by, for example, depositing a dielectric material over the substrate 100, followed by a CMP process to remove the excessive dielectric material until the dummy gate structures 130 are exposed.

After the ILD layer 160 is formed. The dummy gate structures 130 are removed to form gate trenches between each pair of the gate spacers 135. Then, portions of the semiconductor layers 125 and 225 exposed through the gate trenches are removed, such that semiconductor layers 120 and 220 are suspended over the substrate 100.

Figure 21A:
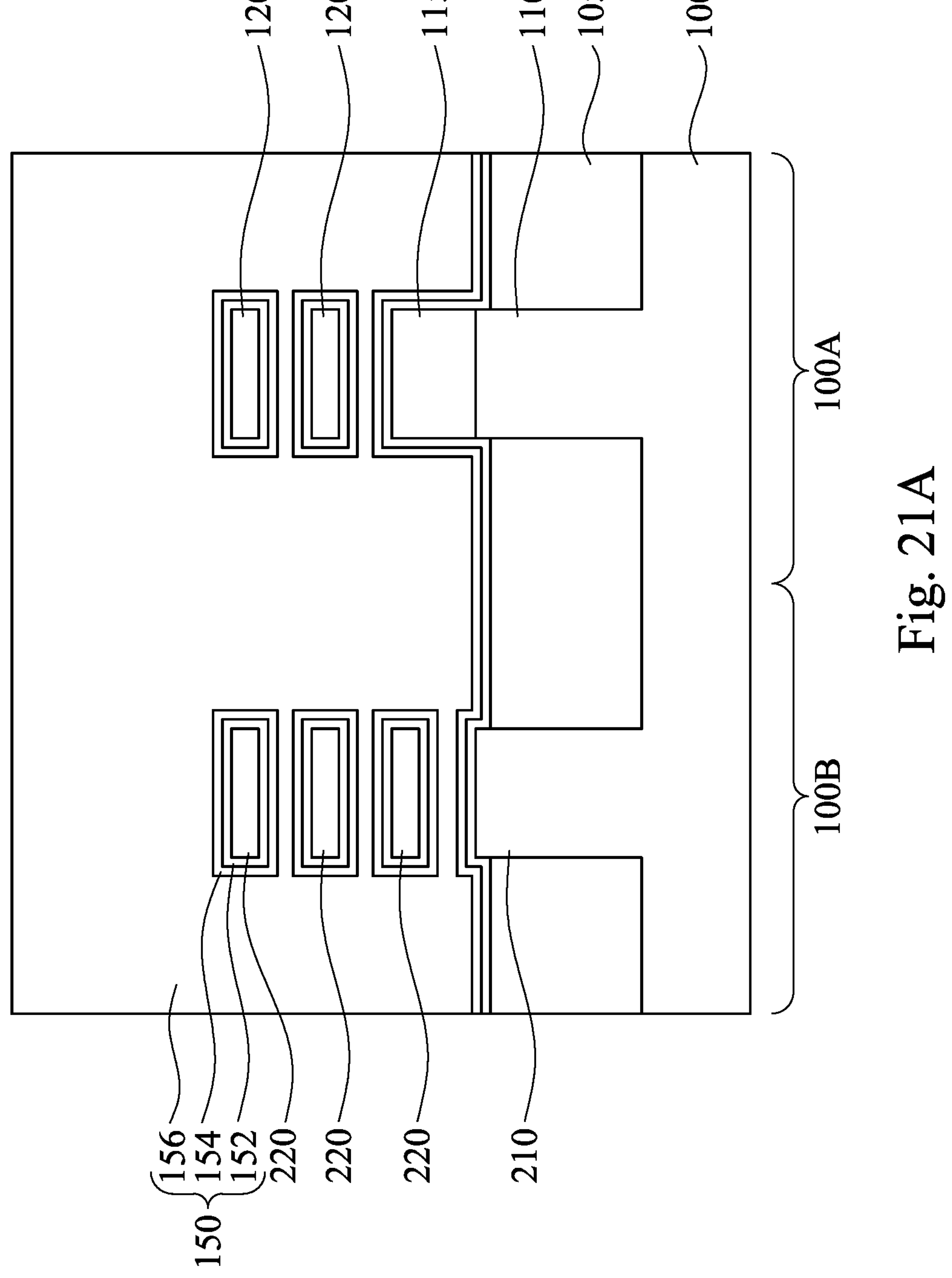
Figure 21B:
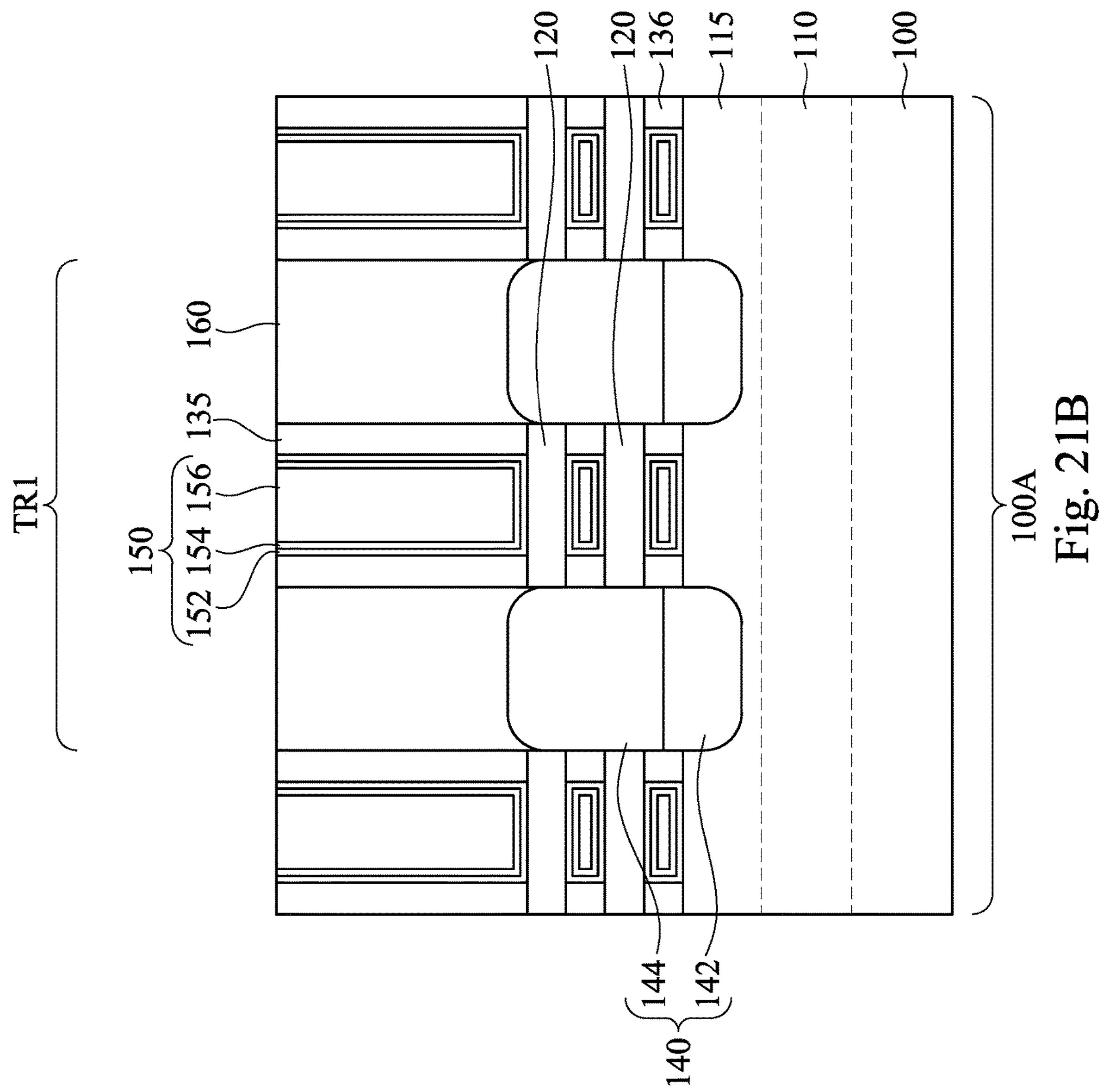
Figure 21C:
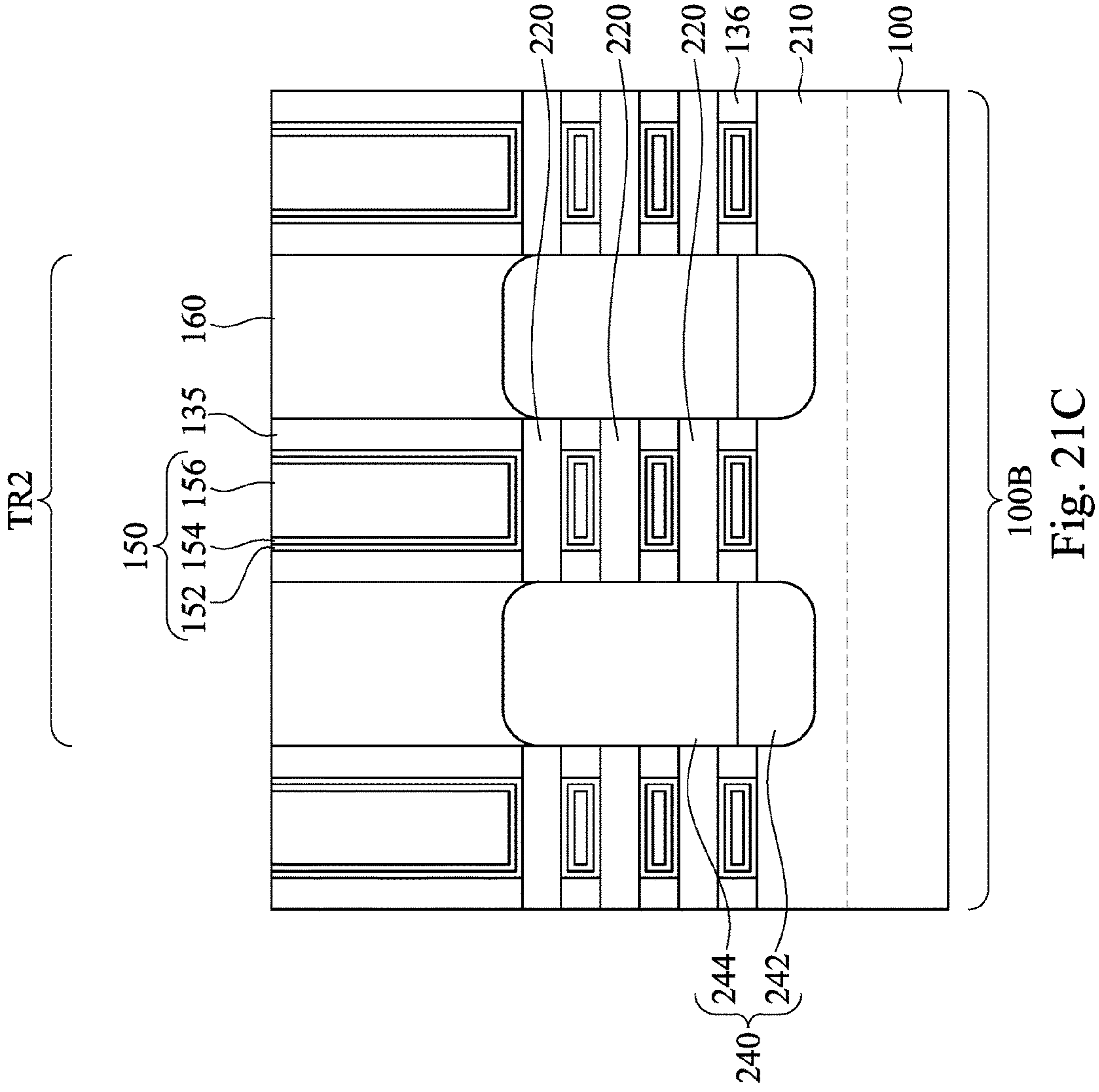

Reference is made to FIGS. 21A, 21B, and 21C. Metal gate structures 150 are formed over the substrate 100. In greater details, metal gate structures 150 are formed in the gate trenches between the gate spacers 135 wrap around each of the semiconductor layers 120 and 220. In some embodiments, the metal gate structures 150 may be formed by, for example, sequentially depositing a gate dielectric layer 152, a work function metal layer 154, and a gate electrode 156 over the substrate 100 and filling the gate trenches between the gate spacers 135, and then performing a CMP process to remove excess material of gate dielectric layer 152, excess material of work function metal layer 154, and excess material of gate electrode 156 until the ILD layer 160 is exposed.

Figure 22A:
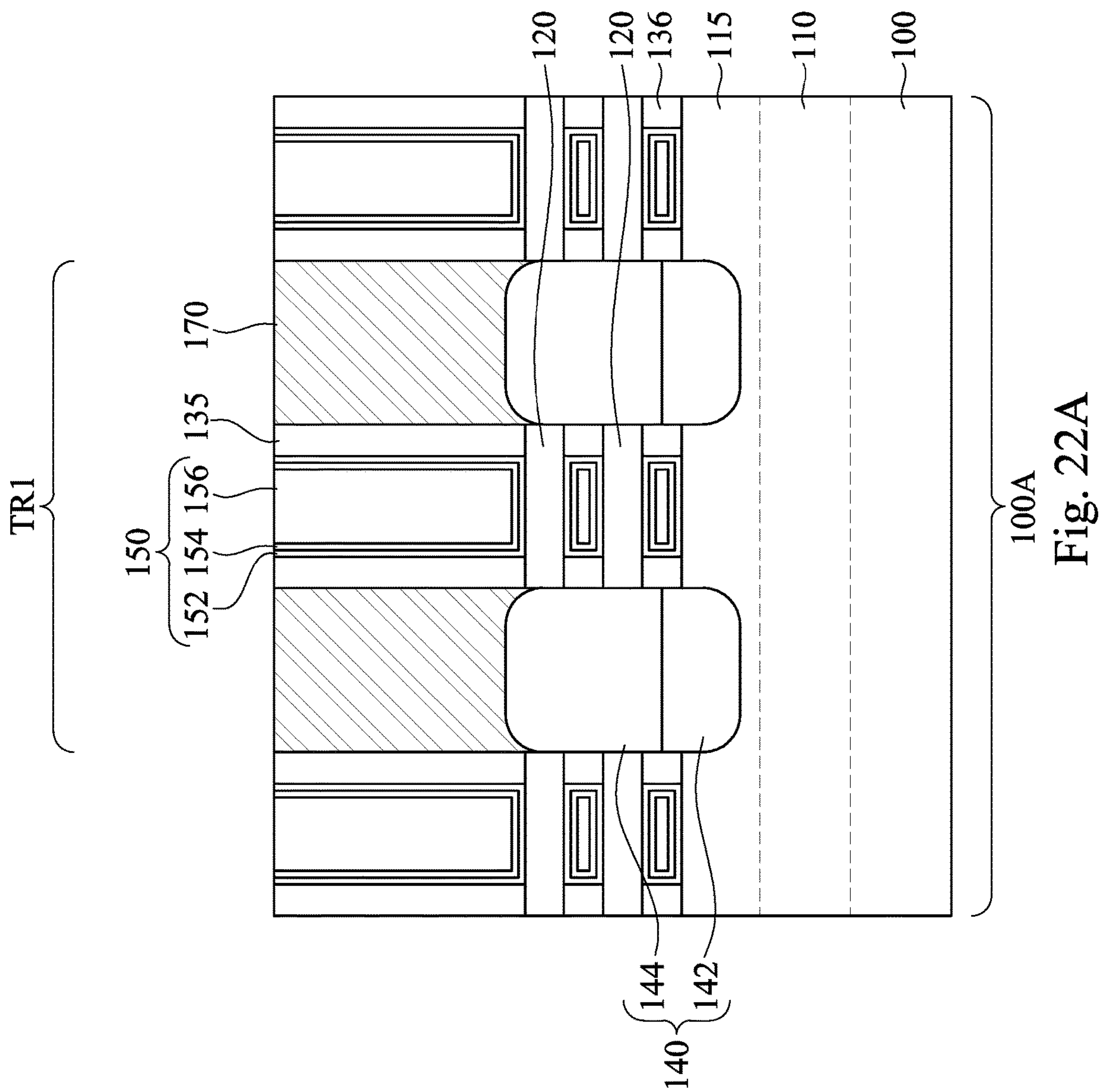
Figure 22B:
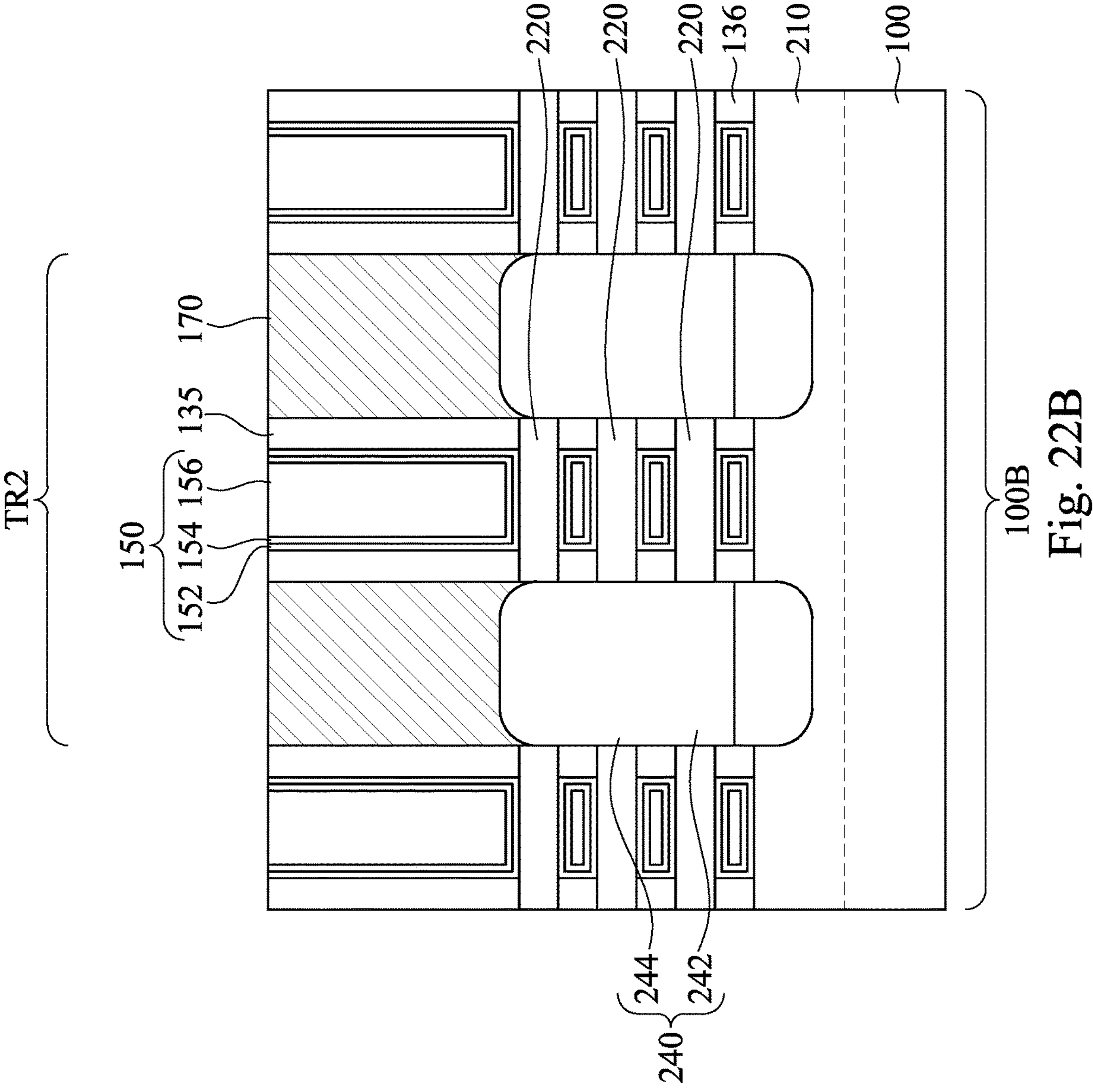

Reference is made to FIGS. 22A and 22B. Portions of the ILD layer 160 are removed to form openings exposing the source/drain epitaxy structures 140 and 240. Source/drain contacts 170 are then formed in the openings. In some embodiments, the source/drain contacts 170 may be formed by, for example, depositing conductive material(s) in the openings, and then performing a CMP process to remove excess materials of the conductive material until the gate structures 150 are exposed.

Figure 23A:
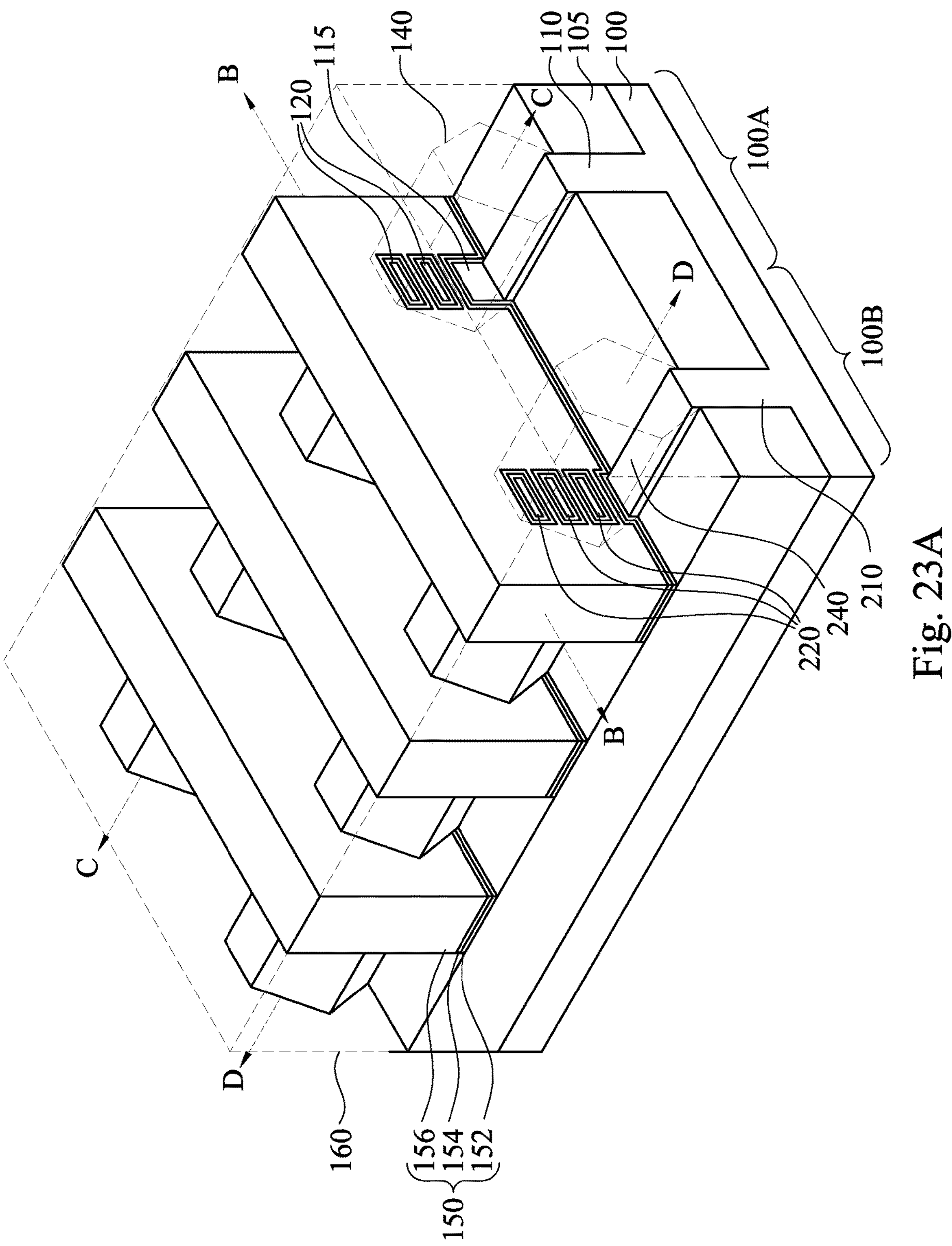
FIG. 23A is a schematic view of a semiconductor device in accordance with some embodiments.
Figure 23B:
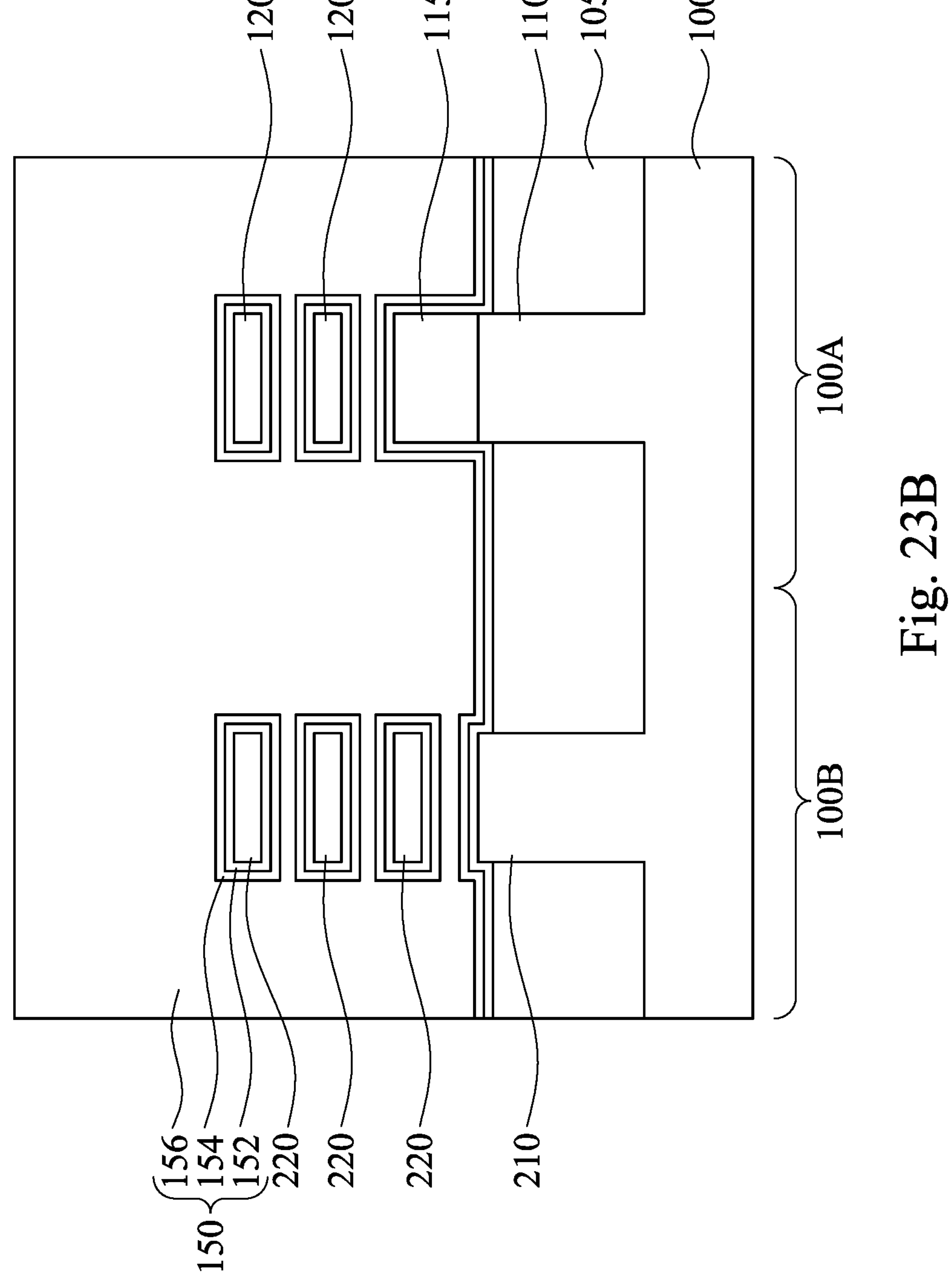
FIGS. 23B to 23D are cross-sectional views of a semiconductor device in accordance with some embodiments.
Figure 23C:
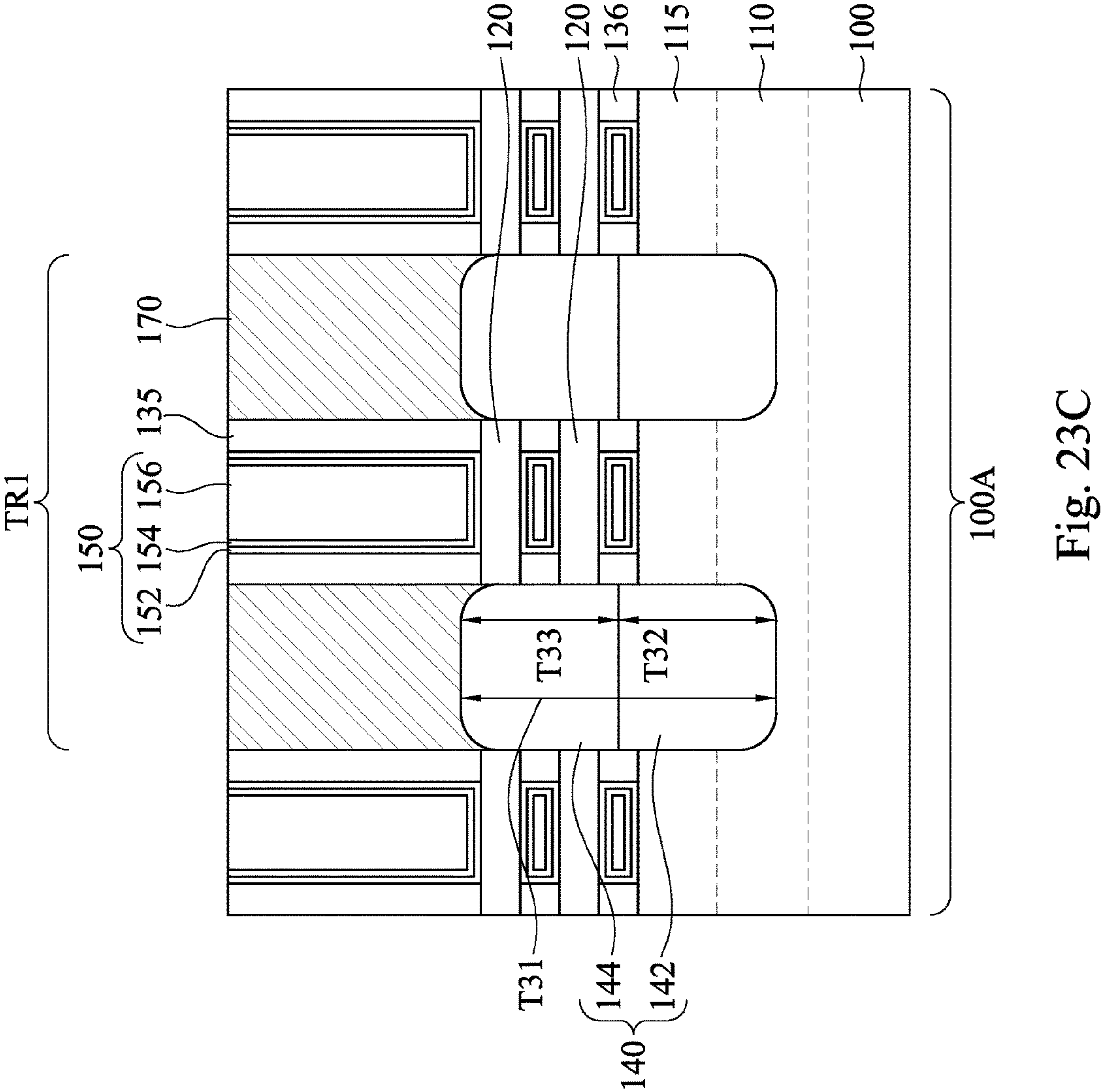
Figure 23D:
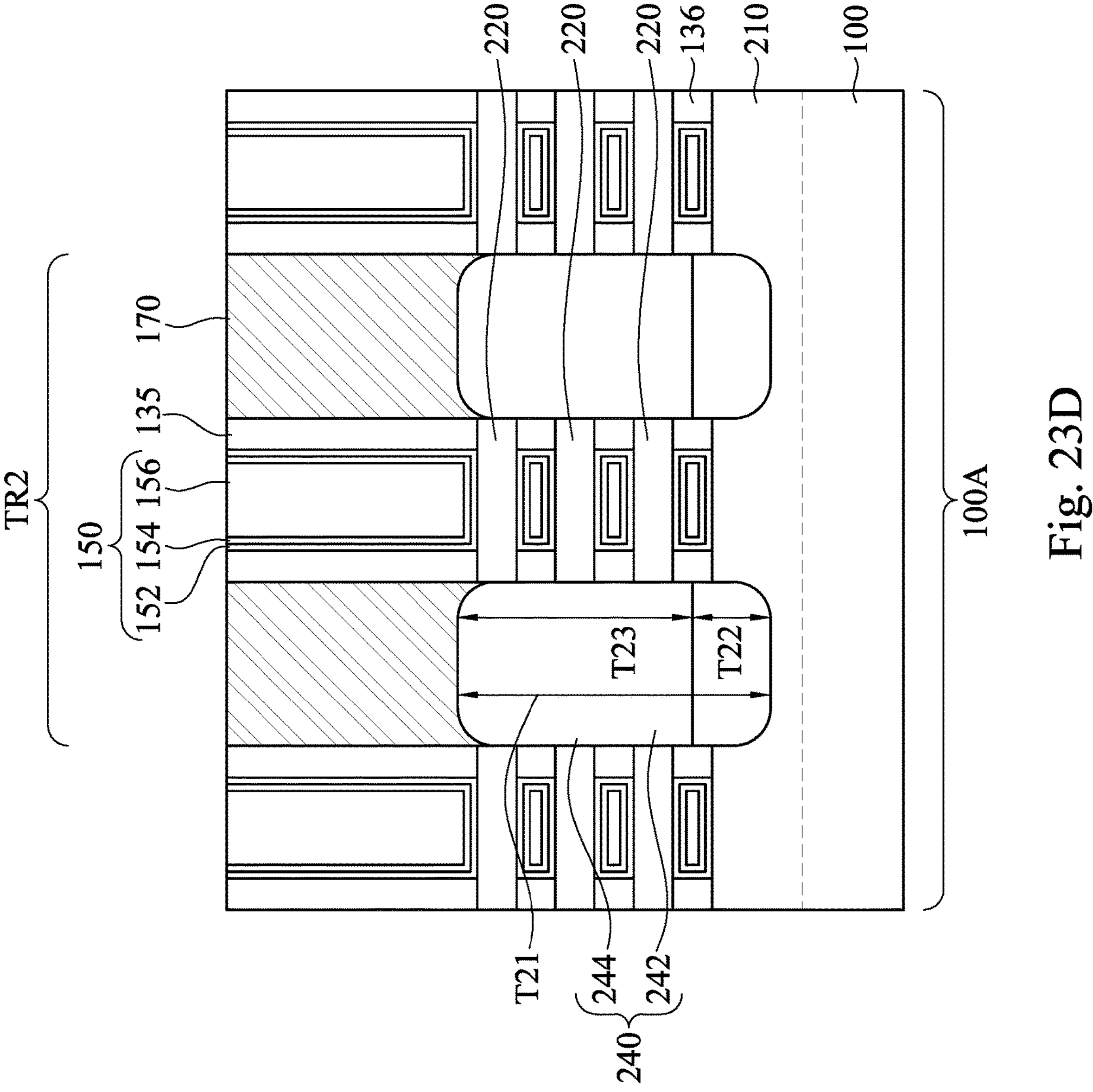

FIG. 23A is a schematic view of a semiconductor device in accordance with some embodiments. FIGS. 23B to 23D are cross-sectional views of a semiconductor device in accordance with some embodiments. In greater details, FIGS. 23B to 23D are cross-sectional views along lines B-B, C-C, and D-D of FIG. 23A. It is noted that the structure of FIGS. 23A to 23D are similar or the same as the structure described with respect to FIGS. 1A to 1D, such element are labeled the same, and relevant details will not be repeated for brevity.

The structure of FIGS. 23A to 23D is different from the structure of FIGS. 1A to 1D, in that the thickness of the source/drain epitaxy structure 140 of FIGS. 23A to 23D is different from the source/drain epitaxy structure 140 of FIGS. 1A to 1D. In some embodiments of FIGS. 23A to 23D, the source/drain epitaxy structure 140 has a thickness T31, the epitaxy layer 142 has a thickness T32, and the epitaxy layer 144 has a thickness T33. In some embodiments, the thickness T31 of the source/drain epitaxy structure 140 may be equal to the thickness T21 of the source/drain epitaxy structure 240. The thickness T32 of the epitaxy layer 142 is greater than the thickness T22 of the epitaxy layer 242. The thickness T33 of the epitaxy layer 144 is less than the thickness T23 of the epitaxy layer 244.

In some embodiments, the top surface of the epitaxy layer 142 is higher than the top surface of the epitaxy layer 242. The top surface of the epitaxy layer 142 is higher than the top surface of the semiconductor layer 115. The bottom surface of the epitaxy layer 142 may be substantially level with the bottom surface of the epitaxy layer 242. The bottom surface of the epitaxy layer 142 may be lower than the bottom surface of the semiconductor layer 115.

FIGS. 24A to 34B are schematic views of a semiconductor device in various stages of fabrication in accordance with some embodiments of the present disclosure. In greater details, FIGS. 24A to 34B illustrate a method for forming the structure shown in FIGS. 23A to 23D. FIGS. 32A and 33A are cross-sectional views the same as the cross-sectional view of FIG. 23B. FIGS. 24A, 25A, 26A, 27A, 28A, 29A, 30A, 31A, 32B, 33B, and 34A are cross-sectional views the same as the cross-sectional view of FIG. 1C. FIGS. 24B, 25B, 26B, 27B, 28B, 29B, 30B, 31B, 32C, 33C, and 34B are cross-sectional views the same as the cross-sectional view of FIG. 23D. It is noted that some processes for forming the structure shown in FIGS. 23A to 23D may be similar or the same as the processes for forming the structure shown in FIGS. 1A to 1D, and thus relevant details will not be repeated for brevity.

Figure 24A:
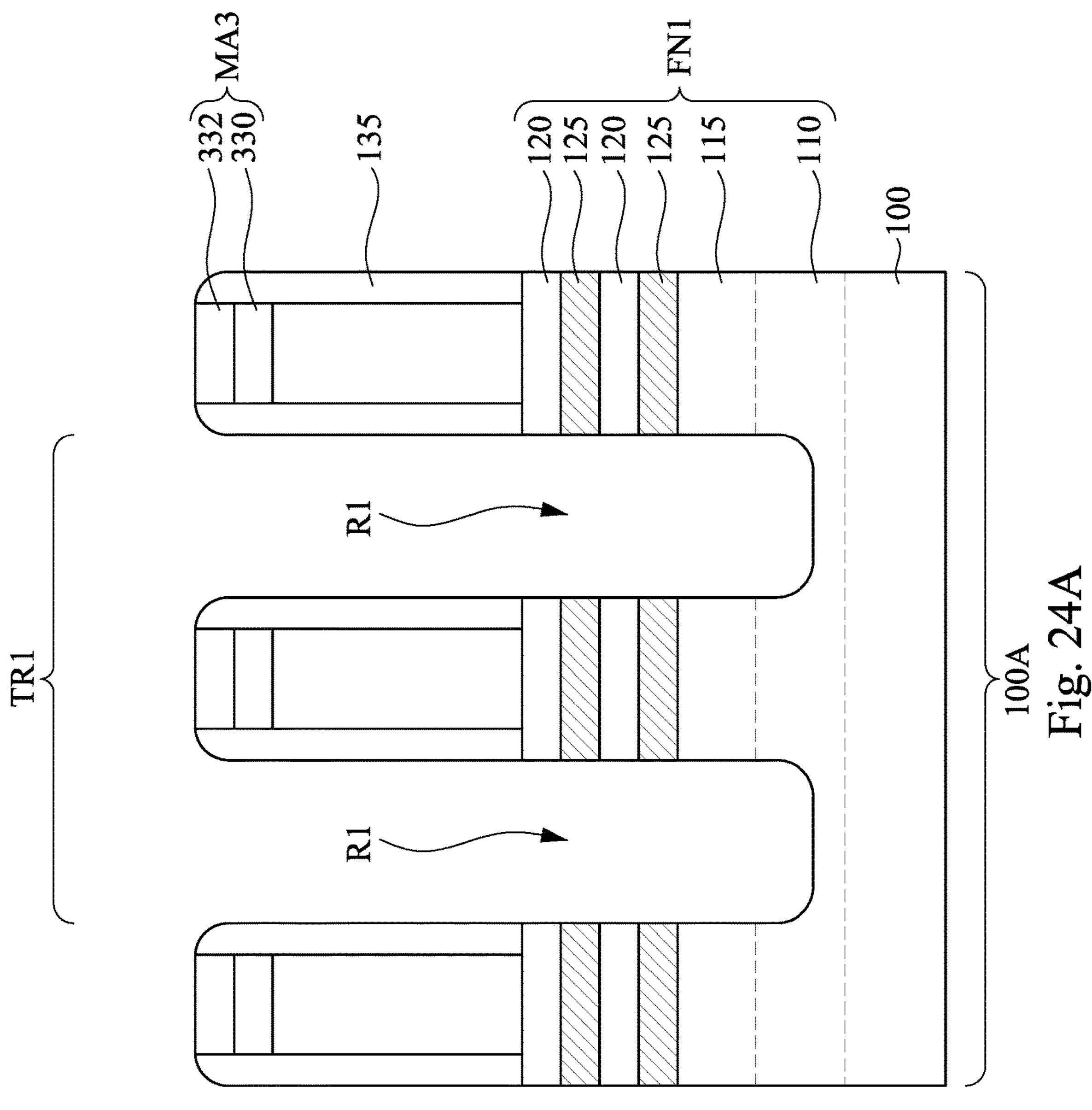
FIGS. 24A to 34B are schematic views of a semiconductor device in various stages of fabrication in accordance with some embodiments of the present disclosure.
Figure 24B:
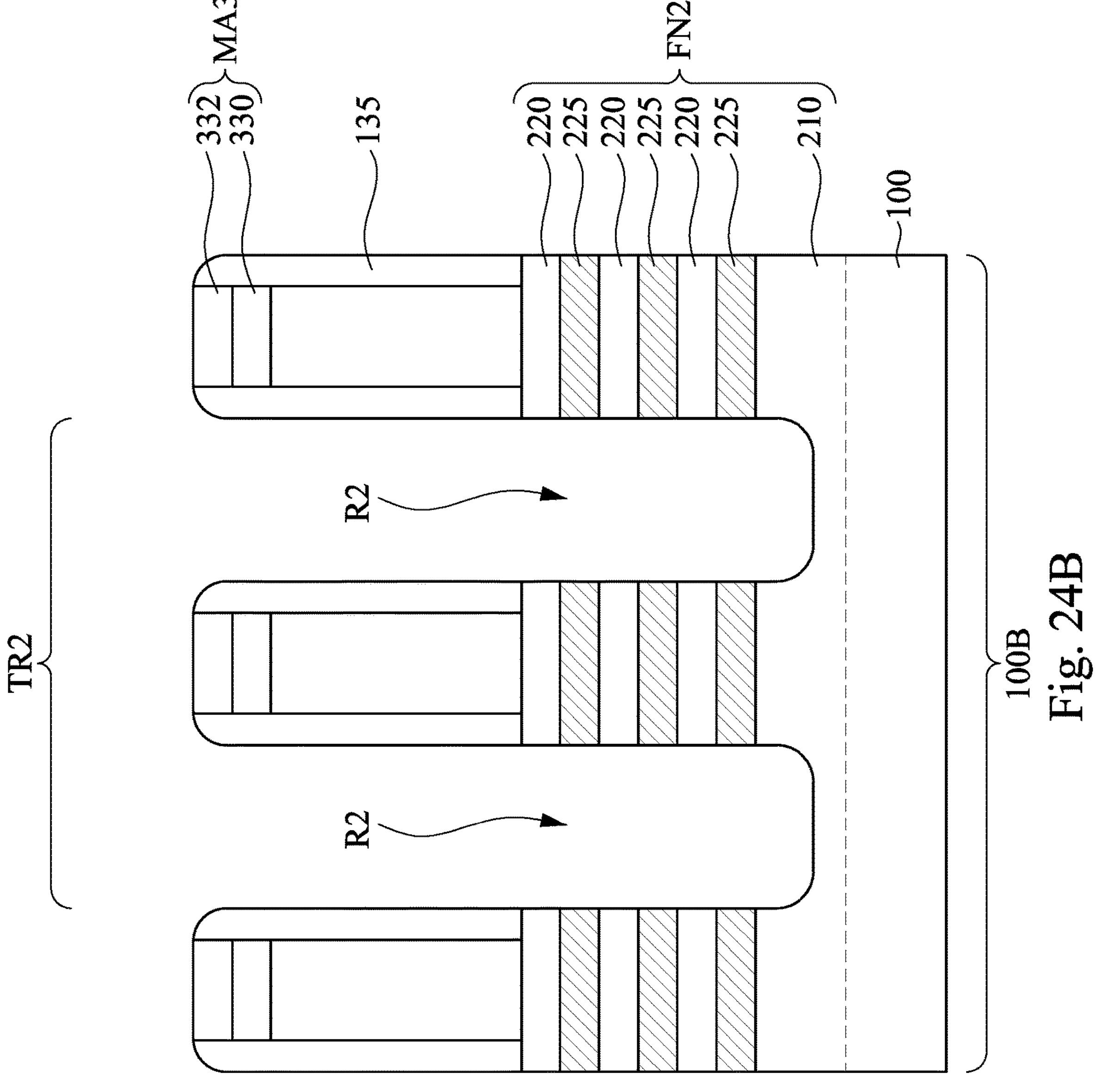

Reference is made to FIGS. 24A and 24B. An anisotropic etching process is performed to the structure shown in FIGS. 12A and 12B. In greater details, the anisotropic etching process removes horizontal portions of the spacer layer 137, such that vertical portions of the spacer layer 137 remain on sidewalls of the dummy gate structures 130. In some embodiments, the remaining vertical portions of the spacer layer 137 on sidewalls of the dummy gate structures 130 can be referred to as gate spacers 135.

Afterward, an etching process may be performed to remove portions of the stack of the semiconductor layers 115, 120, and 125 that are exposed by the dummy gate structures 130 and the gate spacers 135, so as to form recesses R1 in the stack of the semiconductor layers 115, 120, and 125 (or in the fin structure FN1). The etching process also removes portions of the stack of the semiconductor layers 220 and 225 that are exposed by the dummy gate structures 130 and the gate spacers 135, so as to form recesses R2 in the stack of the semiconductor layers 220 and 225 (or in the fin structure FN2). In some embodiments, the etching process is control such that the bottommost end of each recess R1 is lower than the bottom surface of the semiconductor layer 115, and the bottommost end of each recess R2 is lower than the bottom surface of the bottommost semiconductor layer 225. In some embodiments, the bottommost end of each recess R1 may be substantially level with the bottommost end of each recess R2.

Figure 25A:
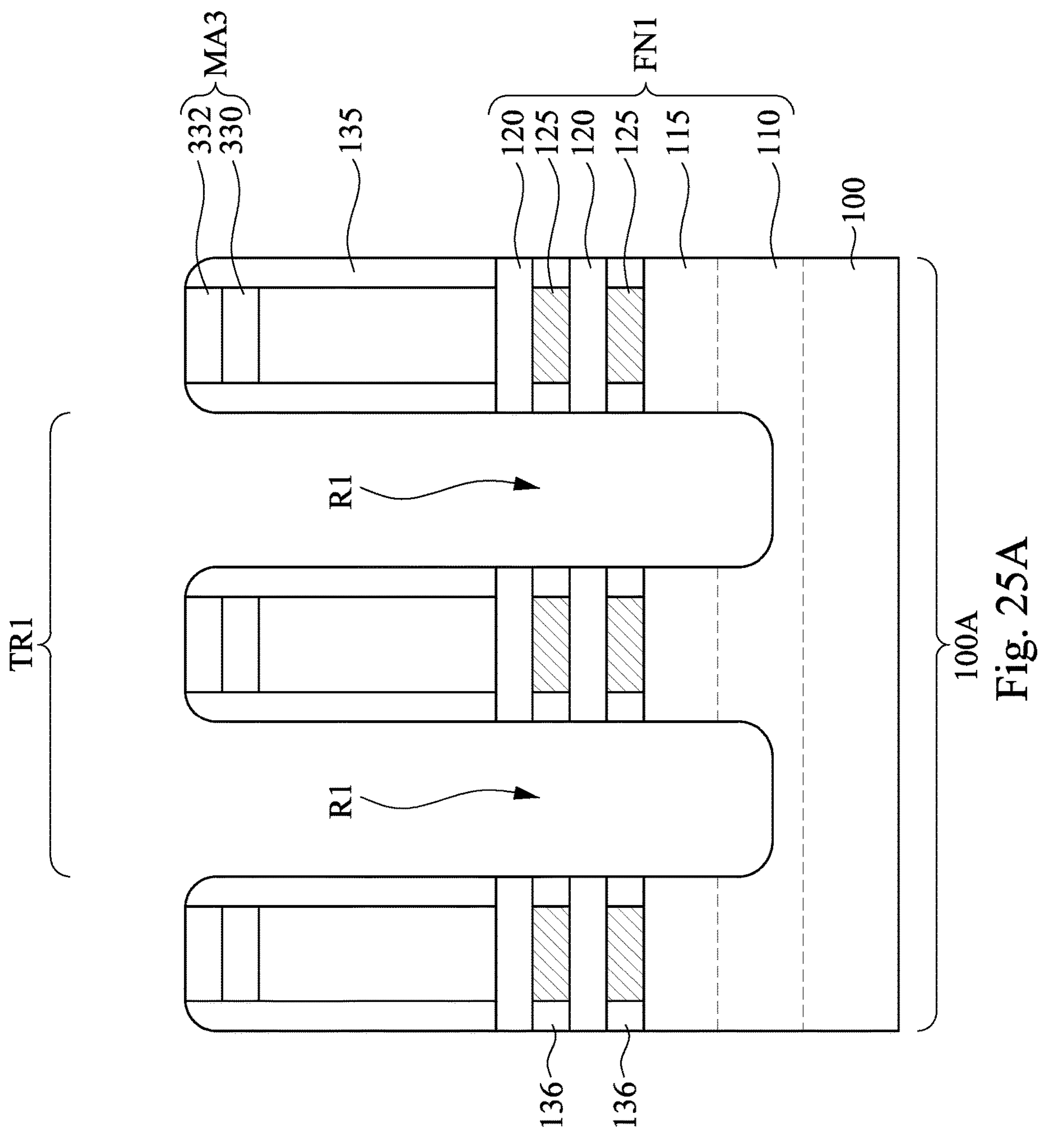
Figure 25B:
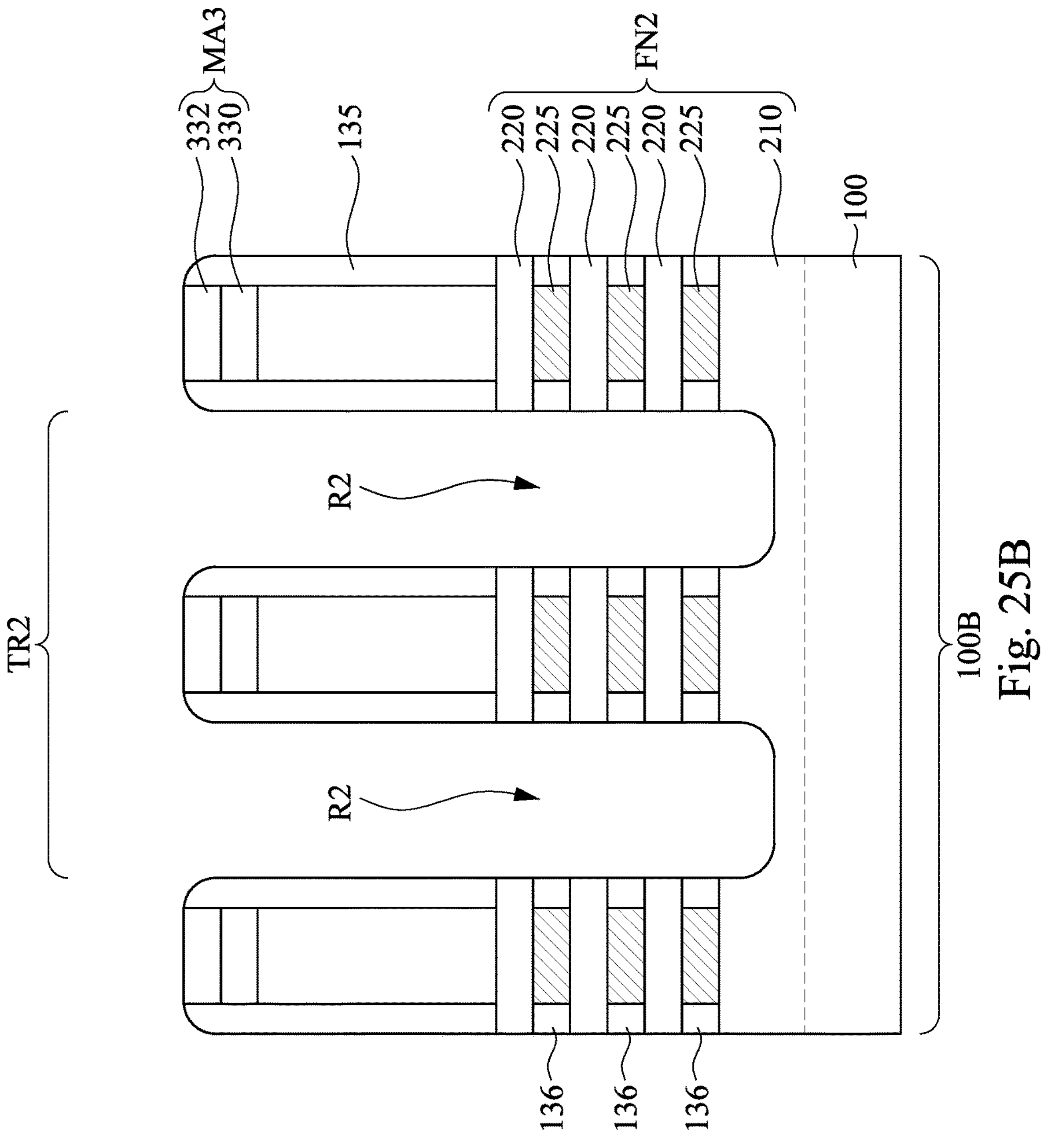

Reference is made to FIGS. 25A and 25B. Portions of the semiconductor layers 125 exposed by the recesses R1 are laterally etched to form sidewall recesses, and portions of the semiconductor layers 225 exposed by the recesses R2 are laterally etched to form sidewall recesses, and then inner spacers 136 are formed in the sidewall recesses.

Figure 26A:
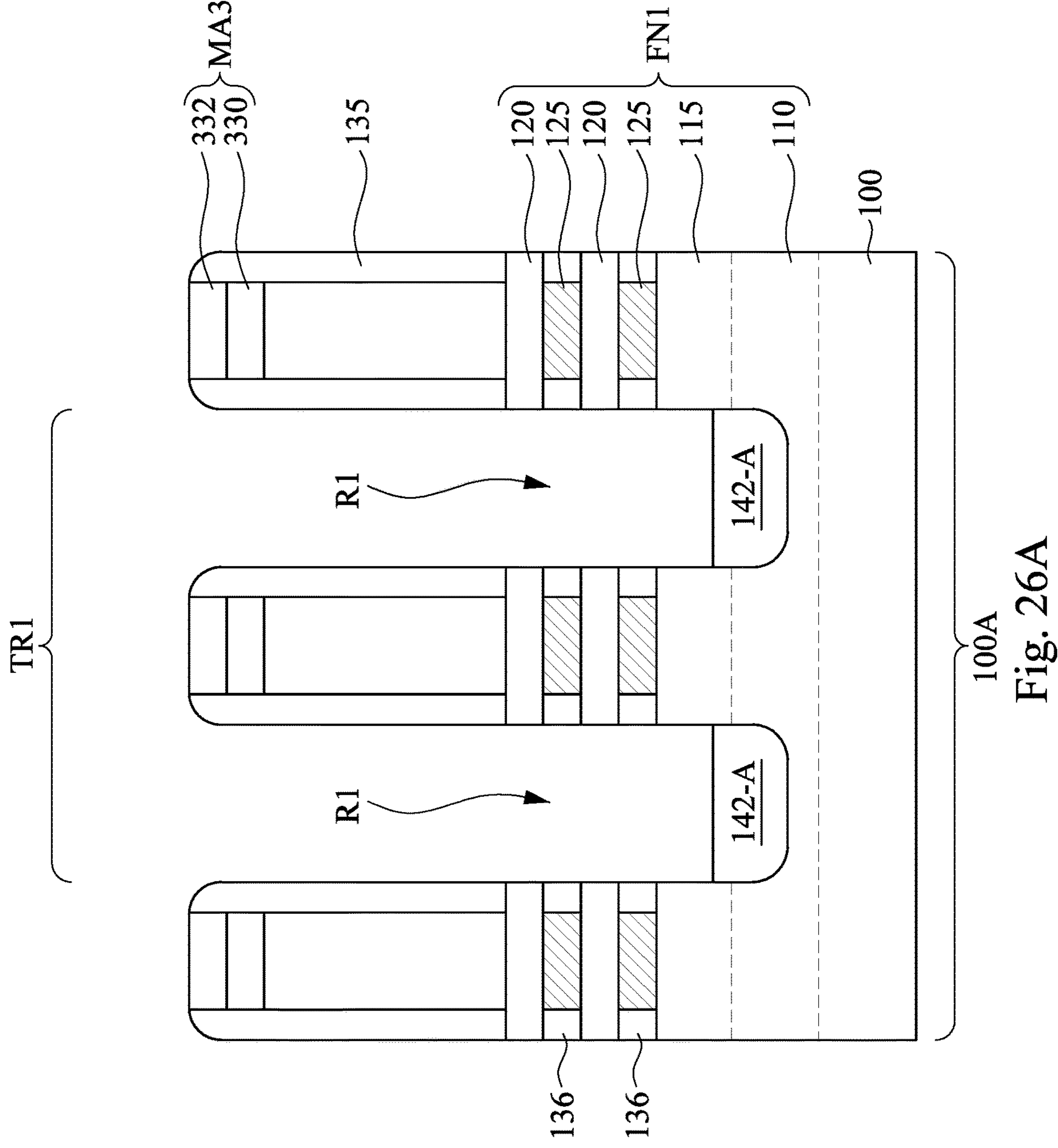
Figure 26B:
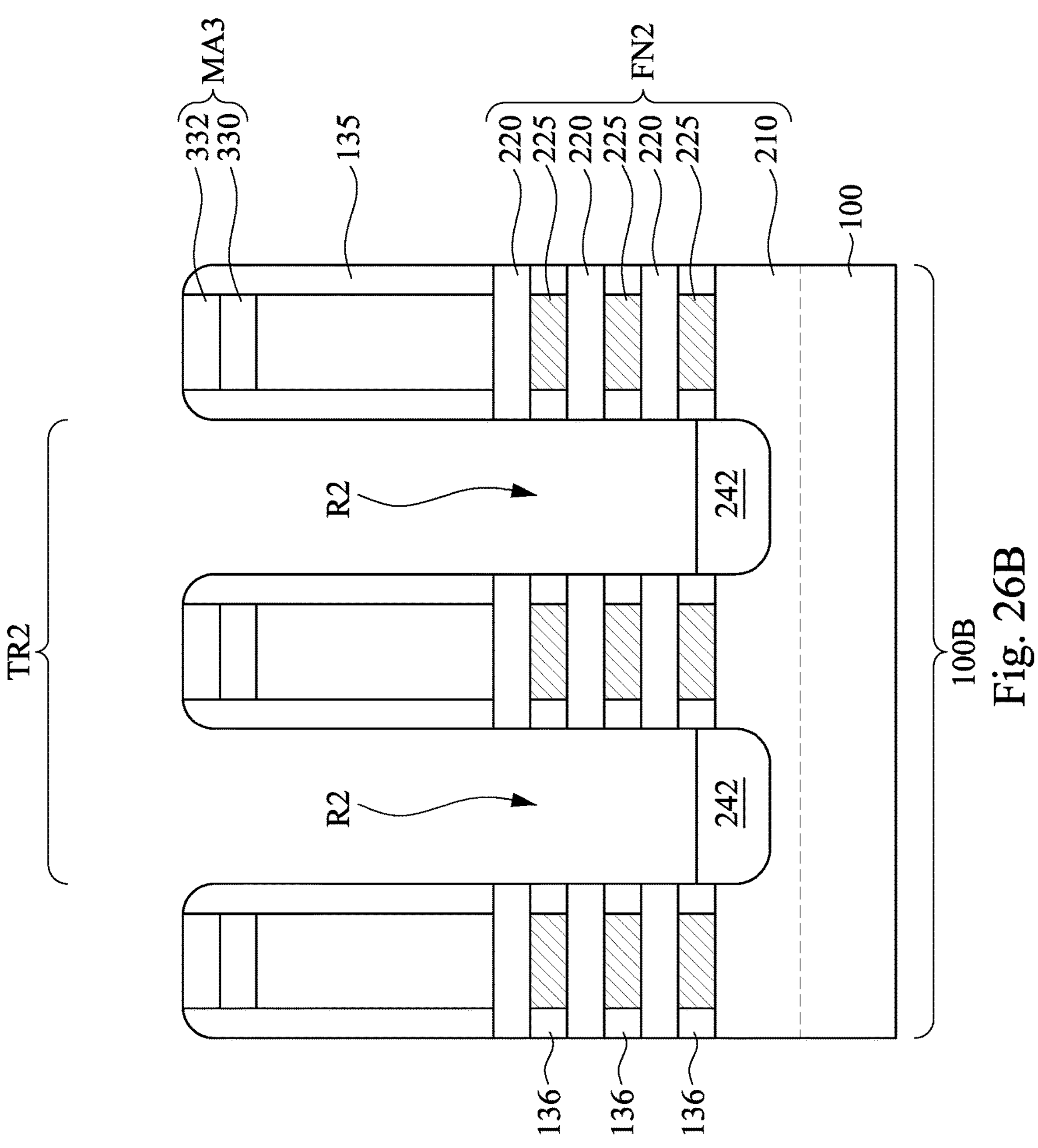

Reference is made to FIGS. 26A and 26B. Epitaxy layers 142-A and 242 are formed in the recesses R1 and R2, respectively. In some embodiments, the formation of the epitaxy layers 142-A and 242 may include a plurality of deposition cycles, in which each deposition cycle may include a selective epitaxial growth (SEG) process and an etching process. In some embodiments, the SEG process may selectively grow a semiconductor material on exposed semiconductor surfaces, such as the exposed surfaces of the semiconductor strips 110 and 210 and the exposed surfaces of the semiconductor layers 120 and 220. However, because the exposed areas of the semiconductor strips 110 and 210 are greater than the exposed area of each of the semiconductor layers 120 and 220, the semiconductor material may include higher growing rate on the exposed areas of the semiconductor strips 110 and 210 than on the exposed area of each of the semiconductor layers 120 and 220. That is, a greater amount of the semiconductor material will be grown on the exposed areas of the semiconductor strips 110 and 210 than on the exposed area of each of the semiconductor layers 120 and 220. As a result, the etching process in each deposition cycle of the epitaxy layers 142-A and 242 may remove portions of the semiconductor material formed on the exposed area of each of the semiconductor layers 120 and 220, while portions of the semiconductor material may remain over the semiconductor strips 110 and 210 after the etching process. Accordingly, performing several deposition cycles may allow a bottom-up deposition for the epitaxy layers 142-A and 242. That is, the epitaxy layers 142-A and 242 may be formed from the bottoms of the recesses R1 and R2 via a bottom-up manner. In some embodiments, the thicknesses of the epitaxy layers 142-A and 242 are substantially the same.

Figure 27A:
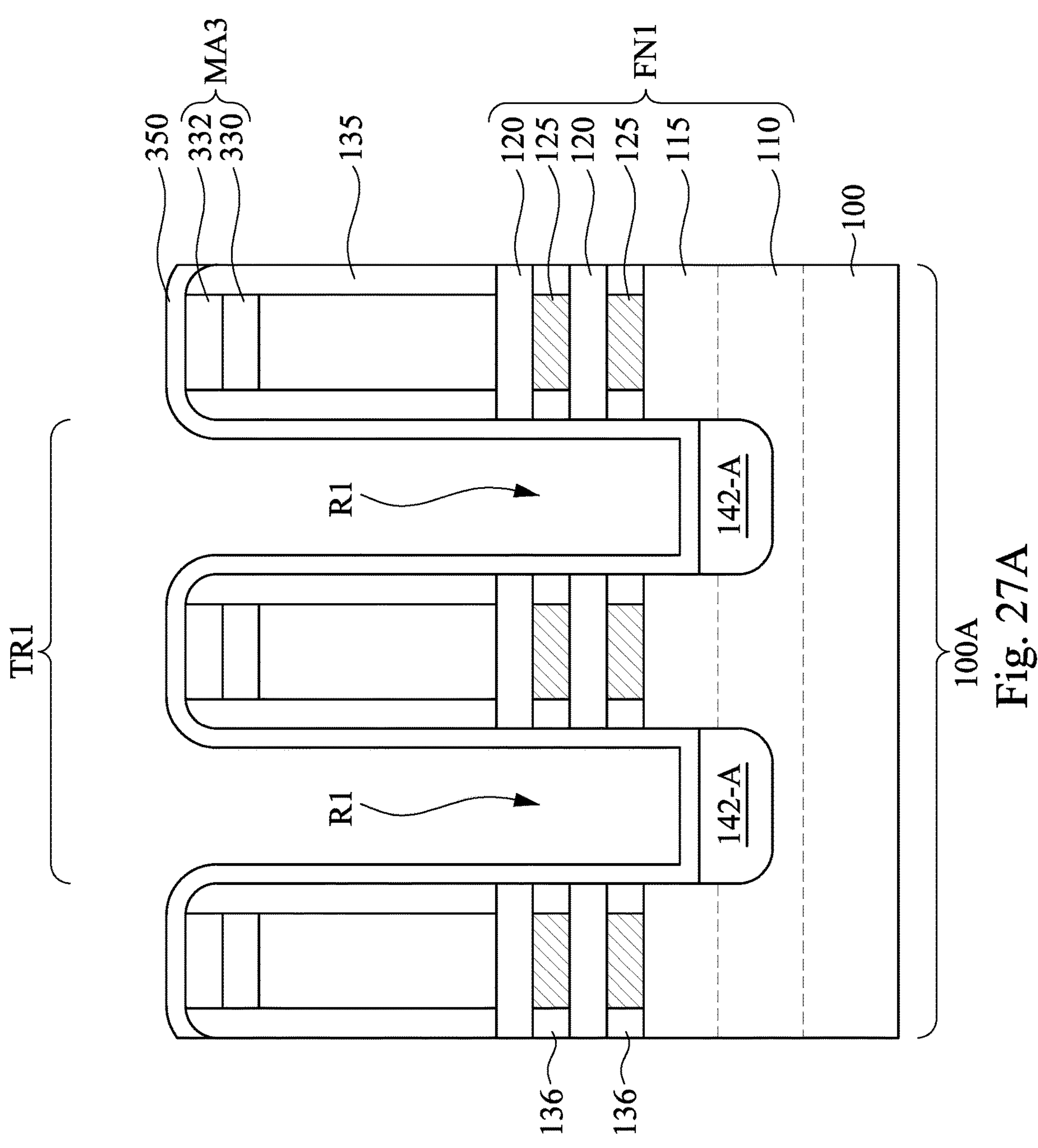
Figure 27B:
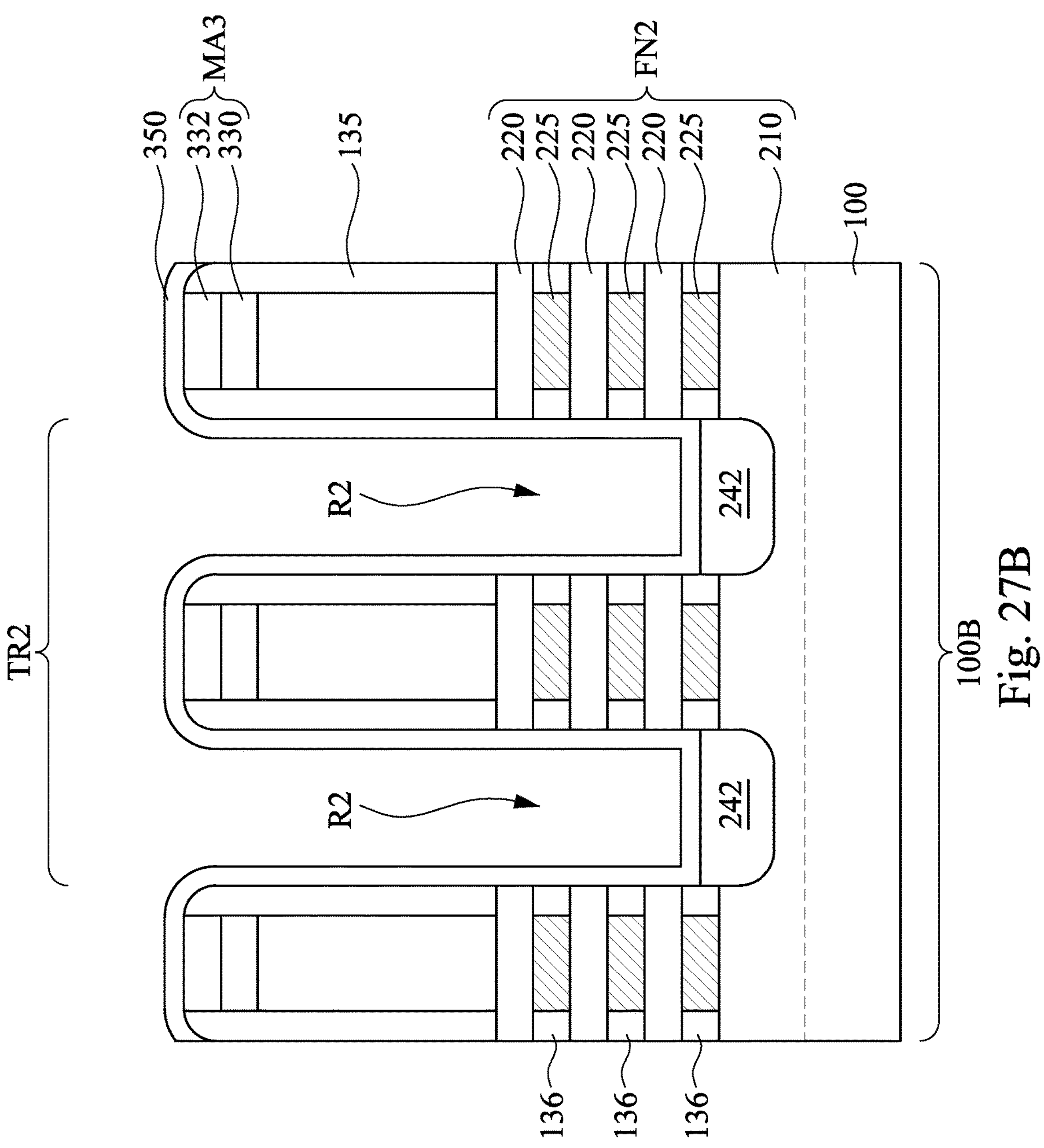

Reference is made to FIGS. 27A and 27B. A hard mask layer 350 is deposited over the substrate 100 and conformal to the structure of FIGS. 26A and 26B. In greater details, the hard mask layer 350 may be conformal to the dummy gate structures 130, the gate spacers 135, and the recesses R1 and R2. In some embodiments, the material of the hard mask layer 350 may include silicon oxide, silicon nitride, silicon oxynitride, aluminum oxide, or other suitable materials. In some embodiments, the hard mask layer 350 may be deposited using suitable deposition process, such as CVD, ALD, or the like.

Figure 28A:
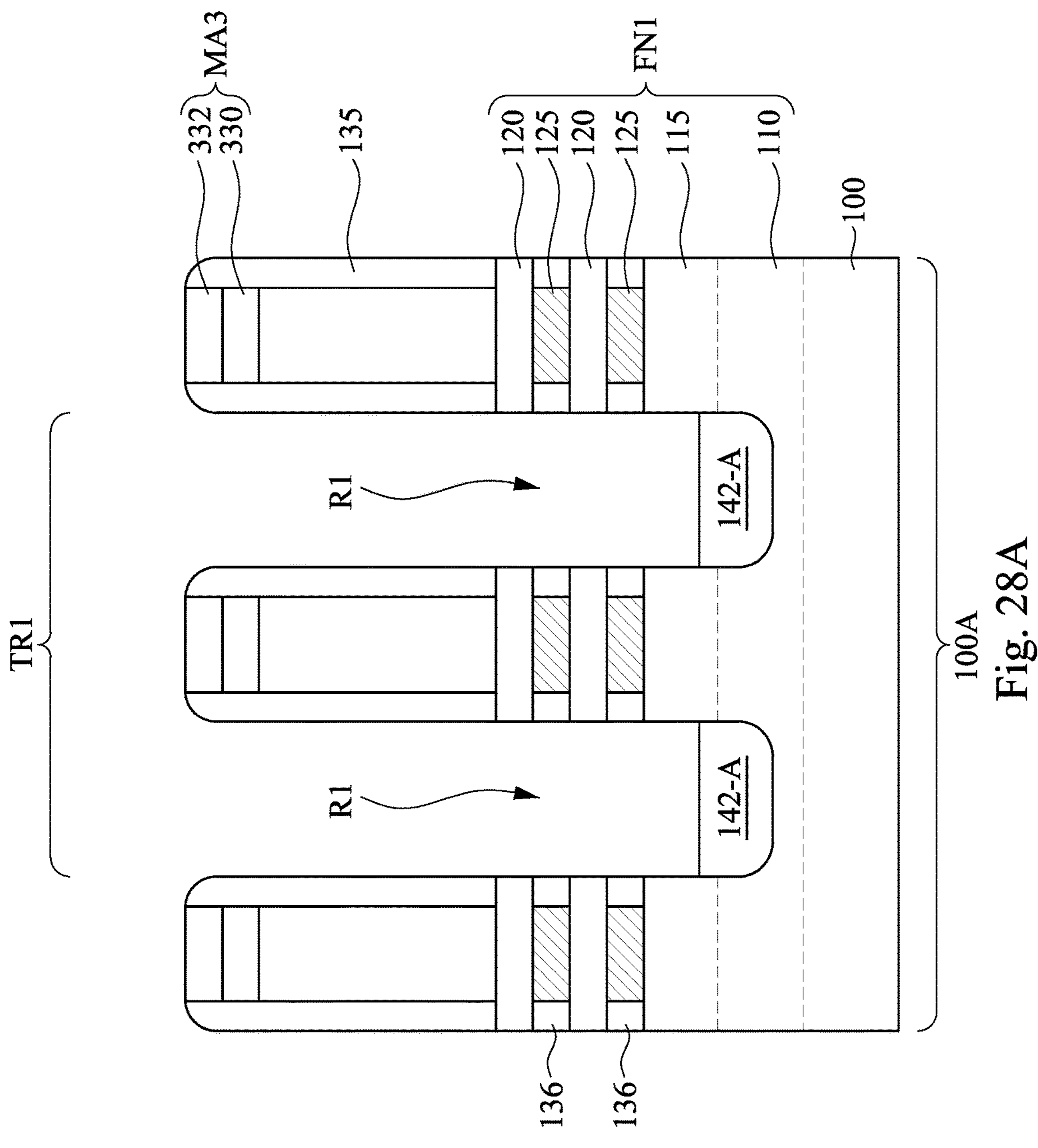
Figure 28B:
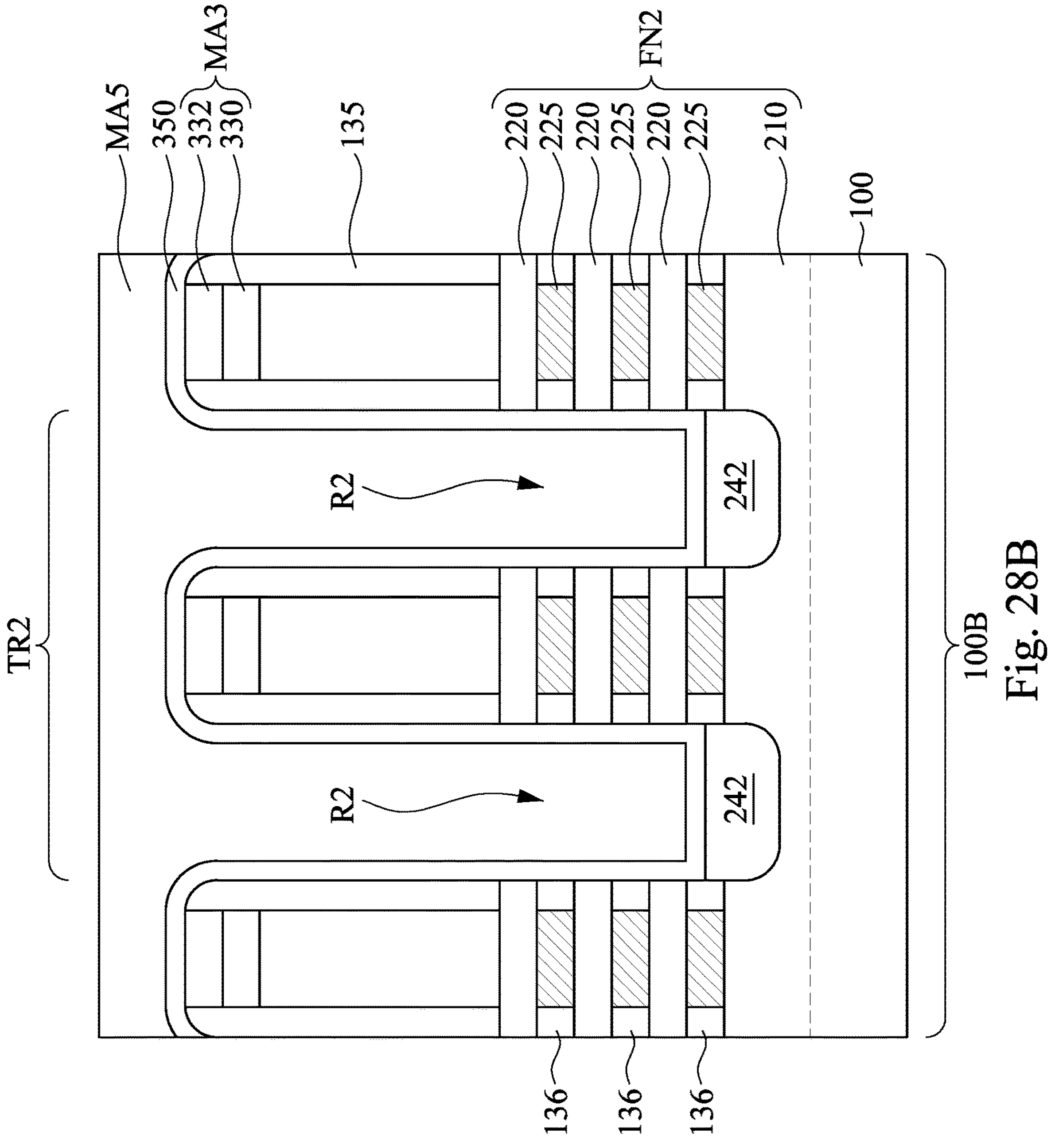

Reference is made to FIGS. 28A and 28B. A patterned mask MA5 is formed covering the second region 100B of the substrate 100, while leaving the first region 100A of the substrate 100 exposed. In greater details, the patterned mask MA5 may fill the recesses R2 and covering portion of the hard mask layer 350 within the second region 100B of the substrate 100.

Afterward, an etching process is performed to remove a portion of the hard mask layer 350 exposed by the patterned mask MA5. In greater details, the etching process is performed to remove the portion of the hard mask layer 350 within the first region 100A of the substrate 100, so as to expose the epitaxy layer 142-A. On the other hand, the portion of the hard mask layer 350 within the second region 100B of the substrate 100 is protected by the patterned mask MA5 during the etching process. In some embodiments, the patterned mask MA5 may include photoresist, and may be formed by suitable photolithography process.

Figure 29A:
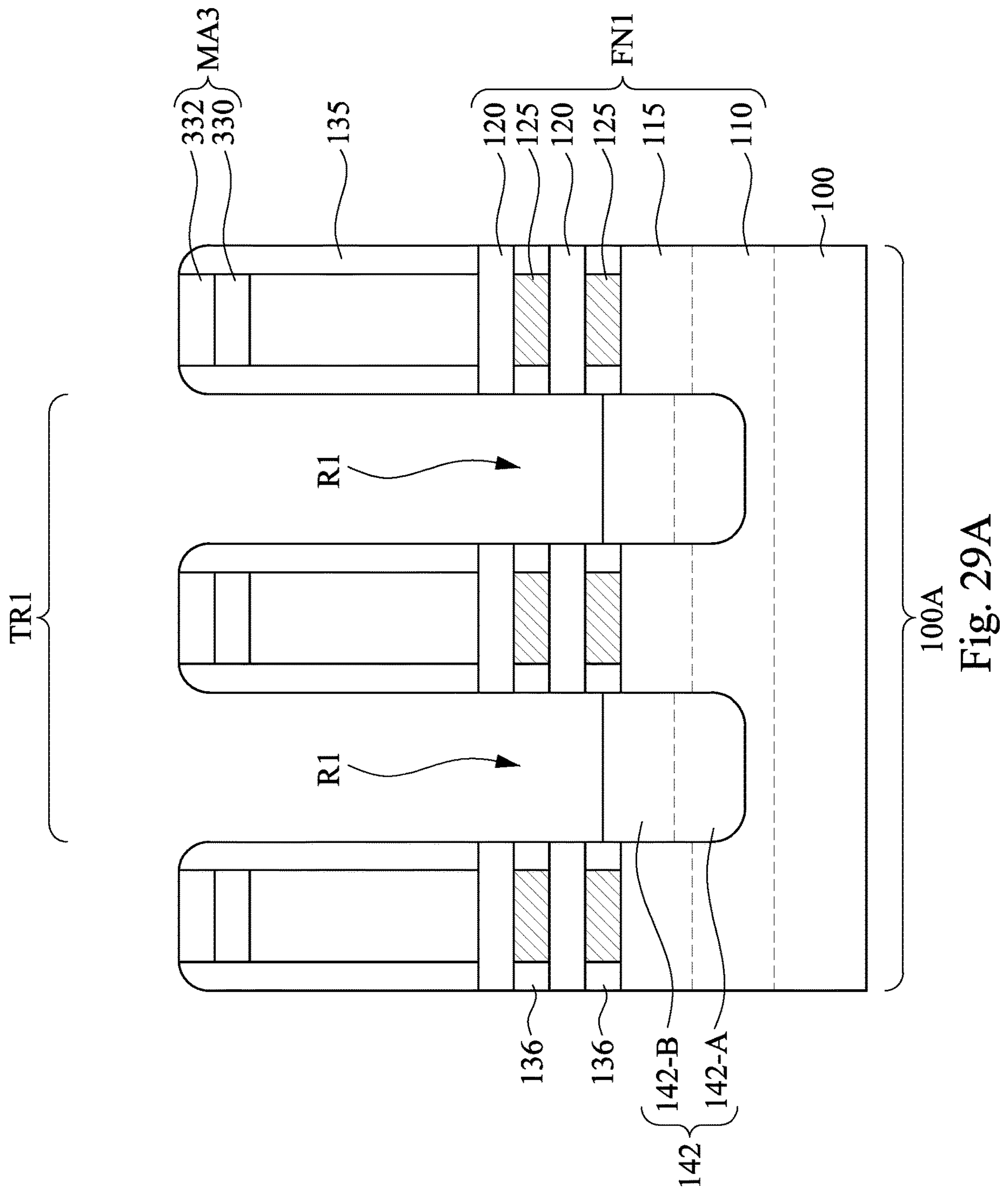
Figure 29B:
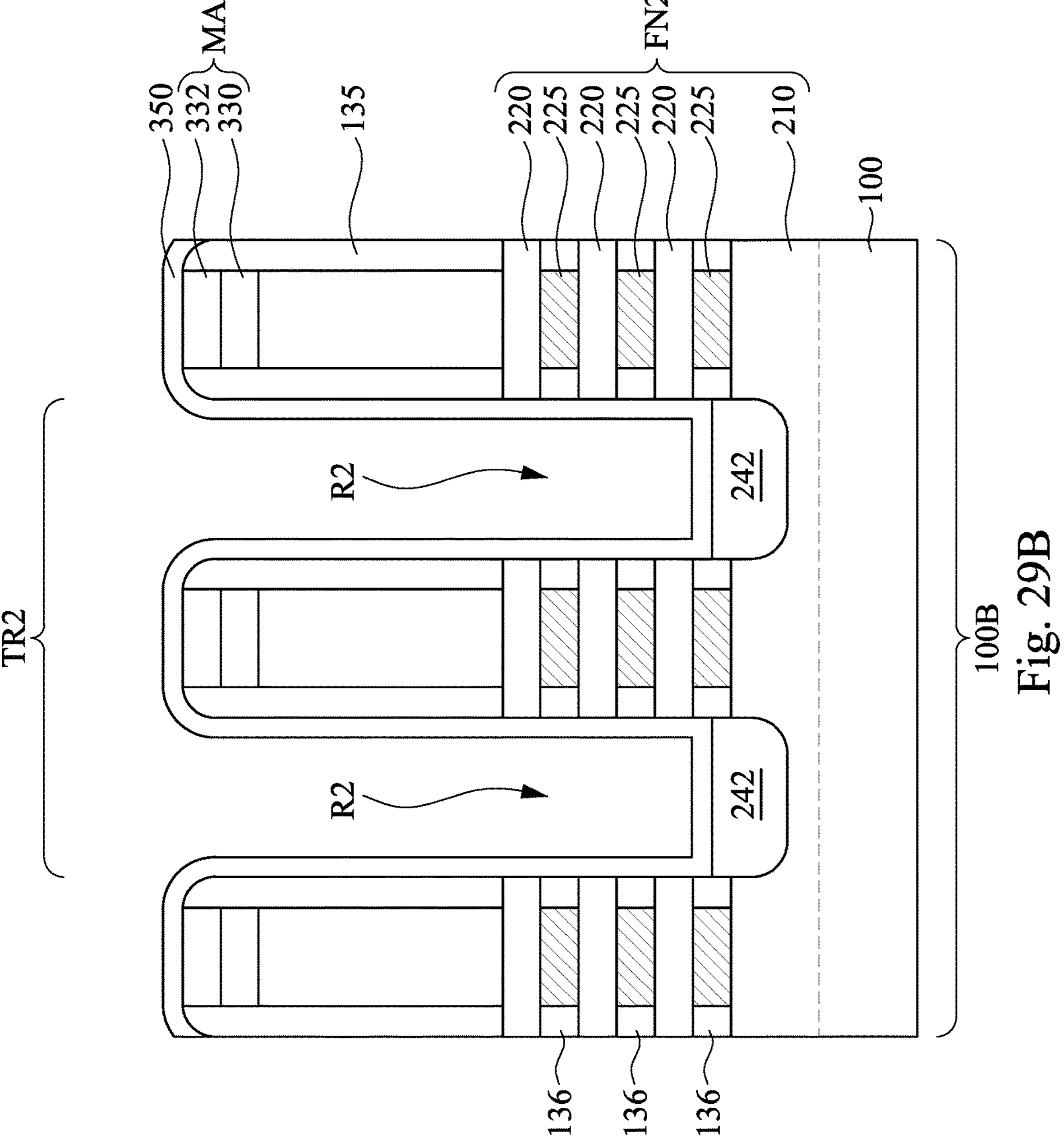

Reference is made to FIGS. 29A and 29B. The patterned mask MA5 is removed, so as to expose the remaining hard mask layer 350 within the second region 100B of the substrate 100. Afterwards, epitaxy layers 142-B are formed over the epitaxy layers 142-A. In some embodiments, the epitaxy layers 142-B may be formed using a bottom-up deposition similar to the deposition of the epitaxy layers 142-A. In some embodiments, each of the epitaxy layers 142-A and the overlying one of the epitaxy layers 142B can be collectively referred to as the epitaxy layer 142.

Figure 30A:
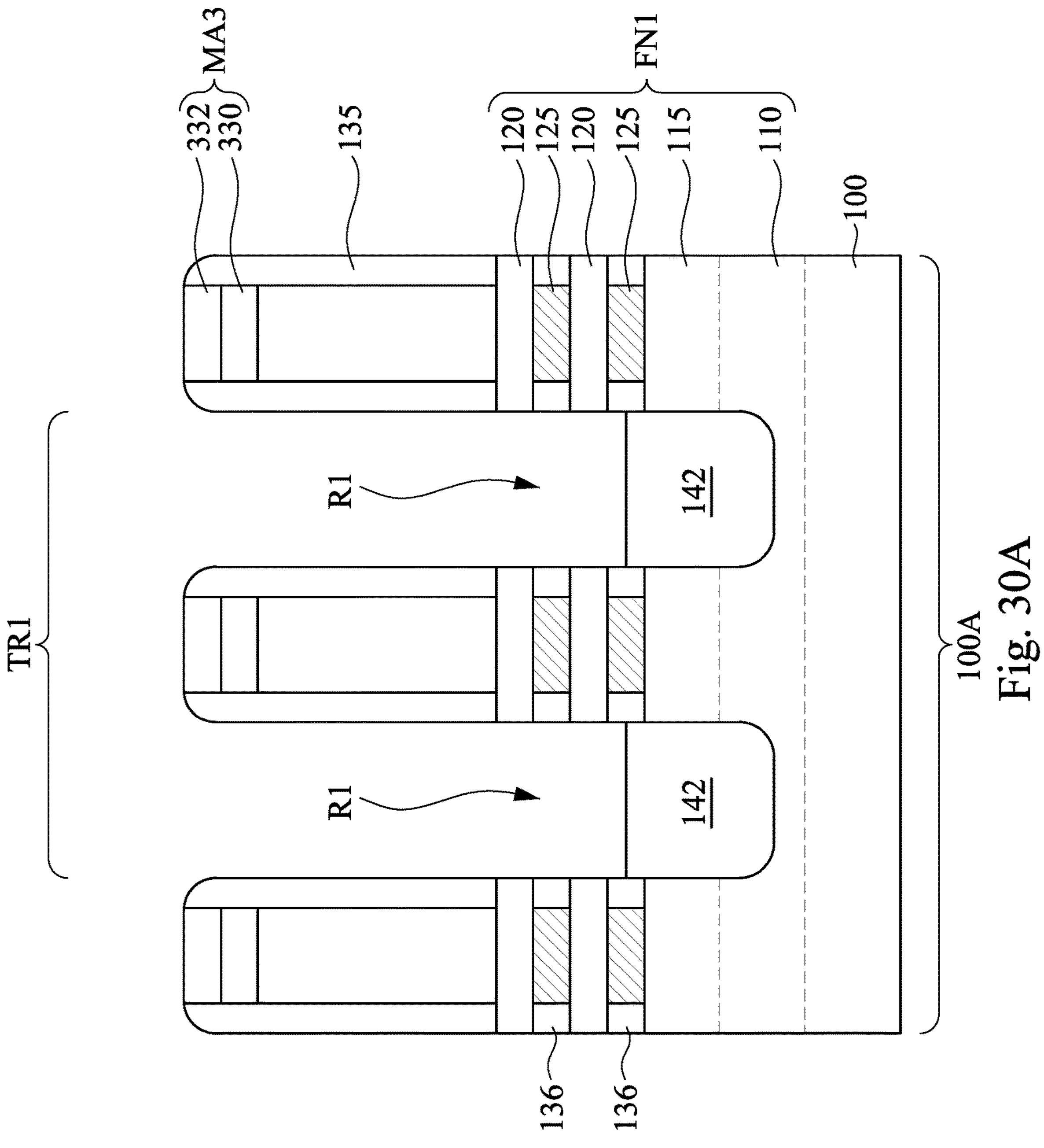
Figure 30B:
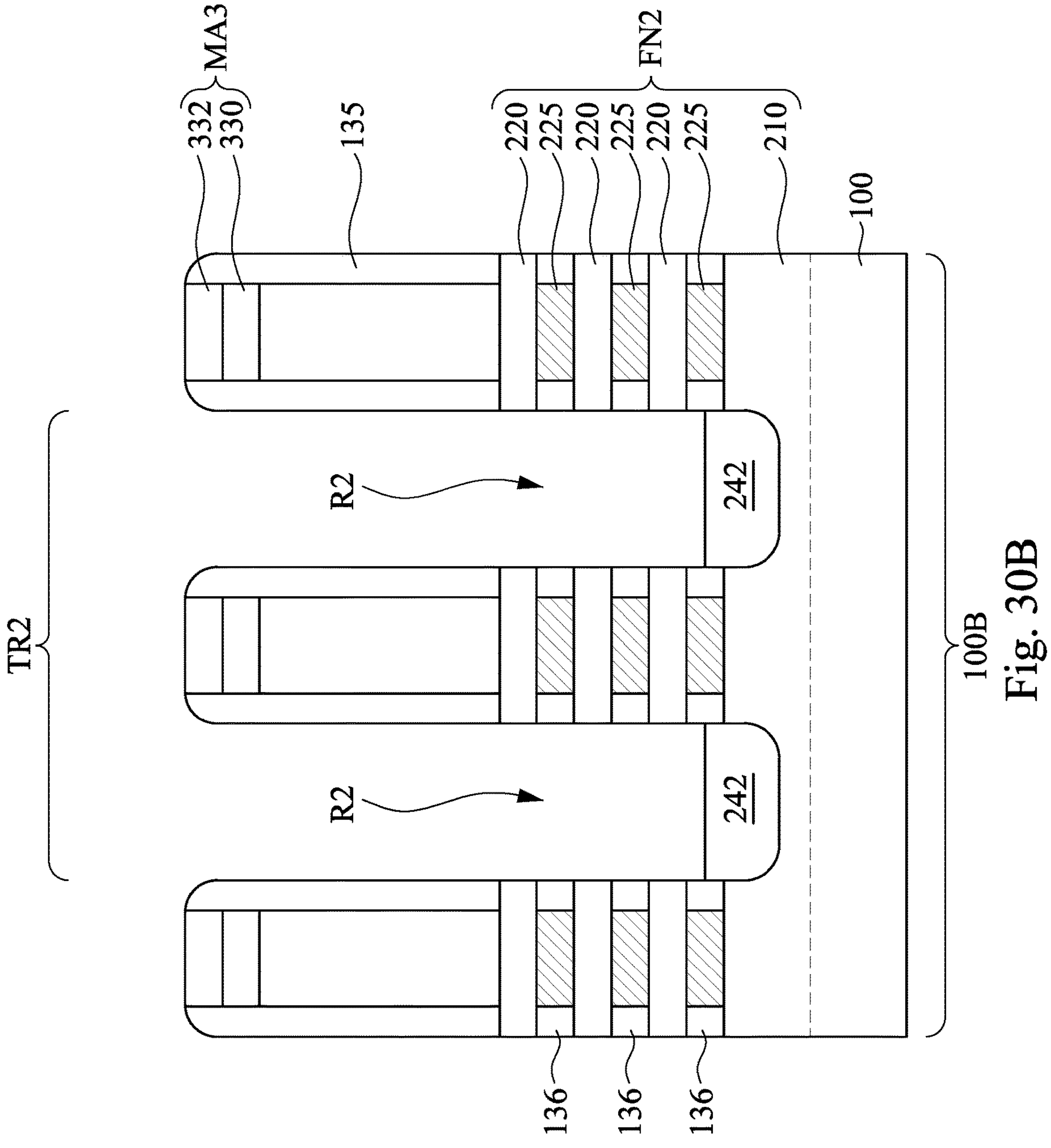

Reference is made to FIGS. 30A and 30B. The hard mask layer 350 is removed, so as to expose the epitaxy layers 242. In some embodiments, the hard mask layer 350 may be removed using suitable etching process.

Figure 31A:
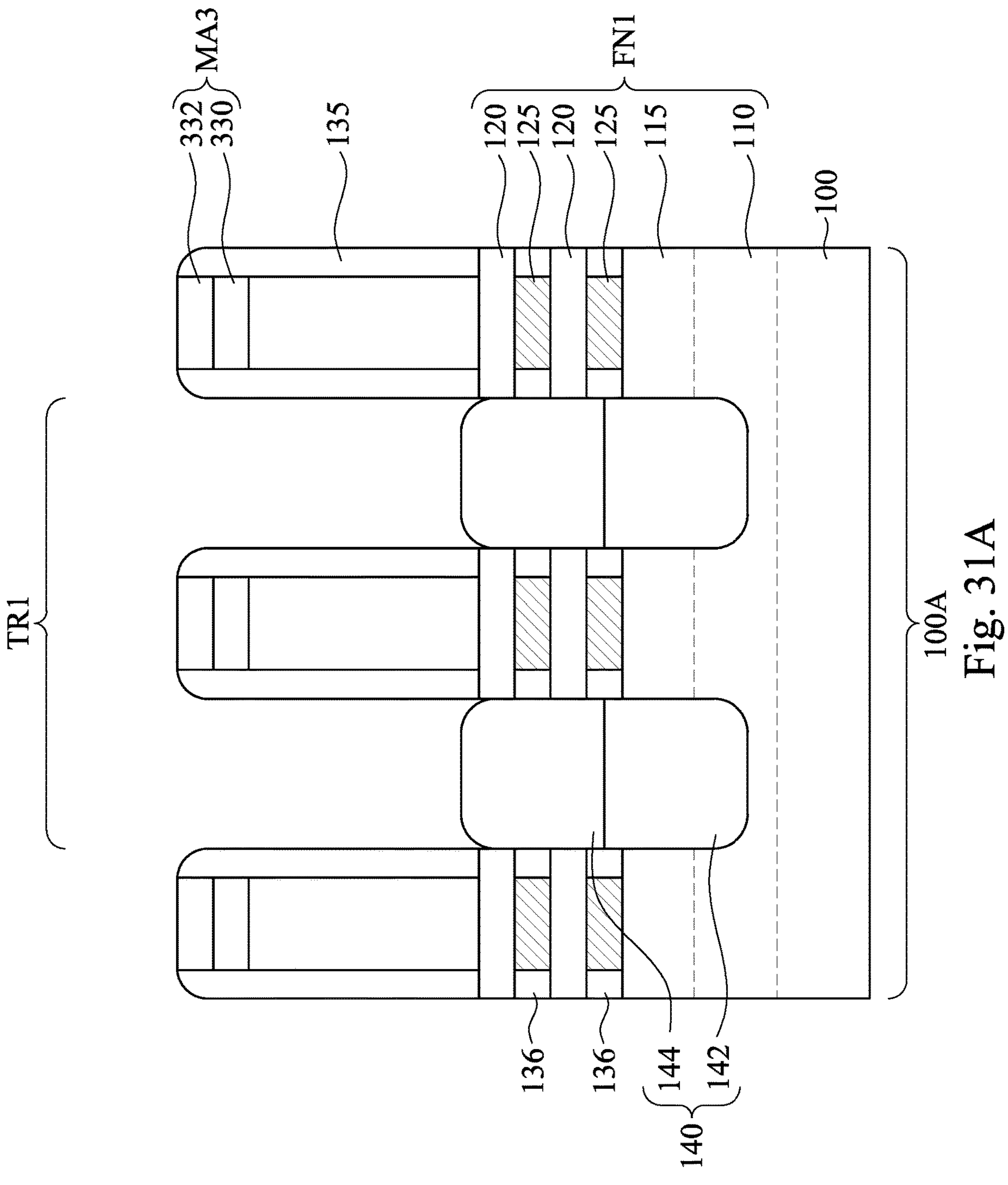
Figure 31B:
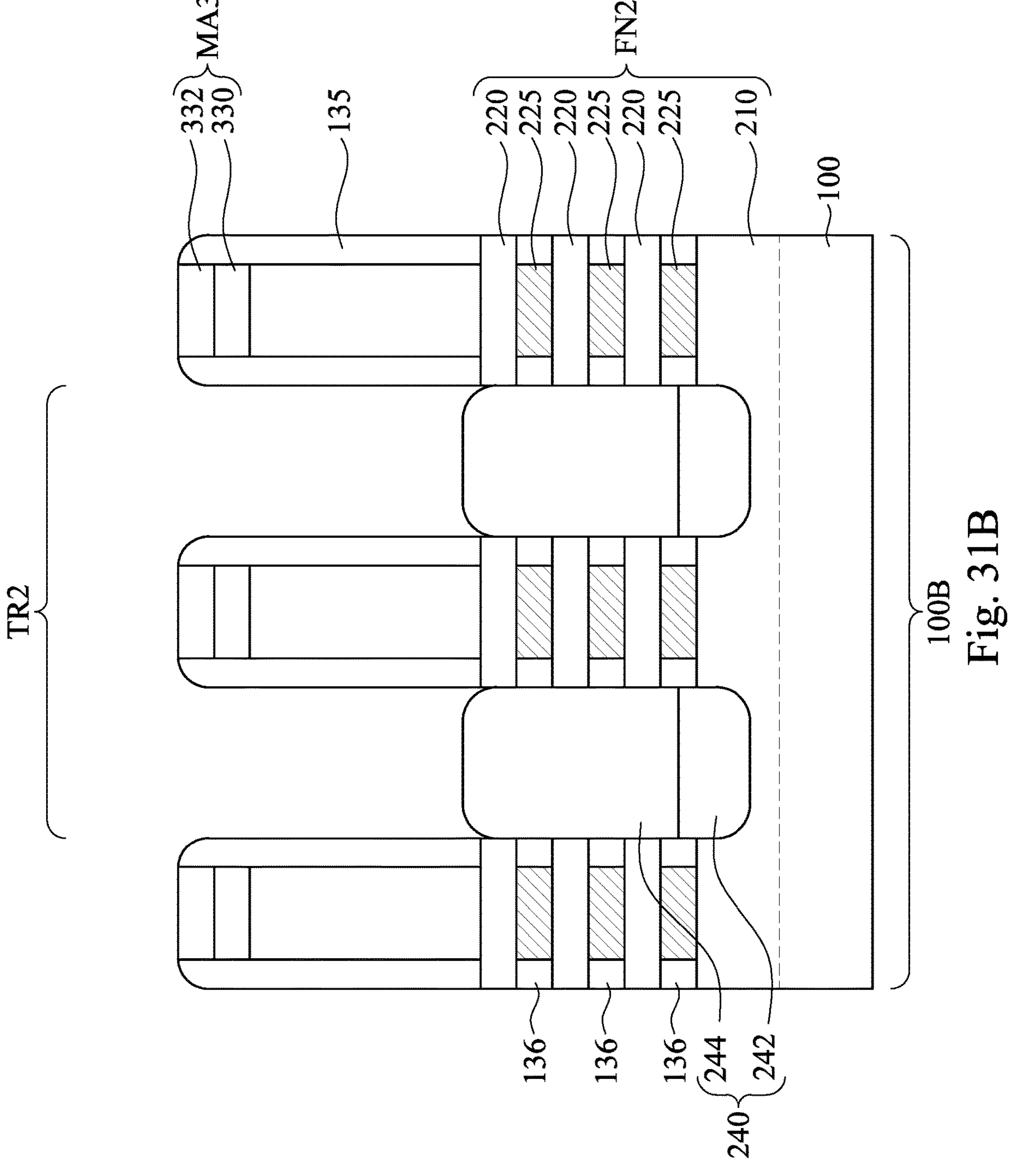
Figure 32A:
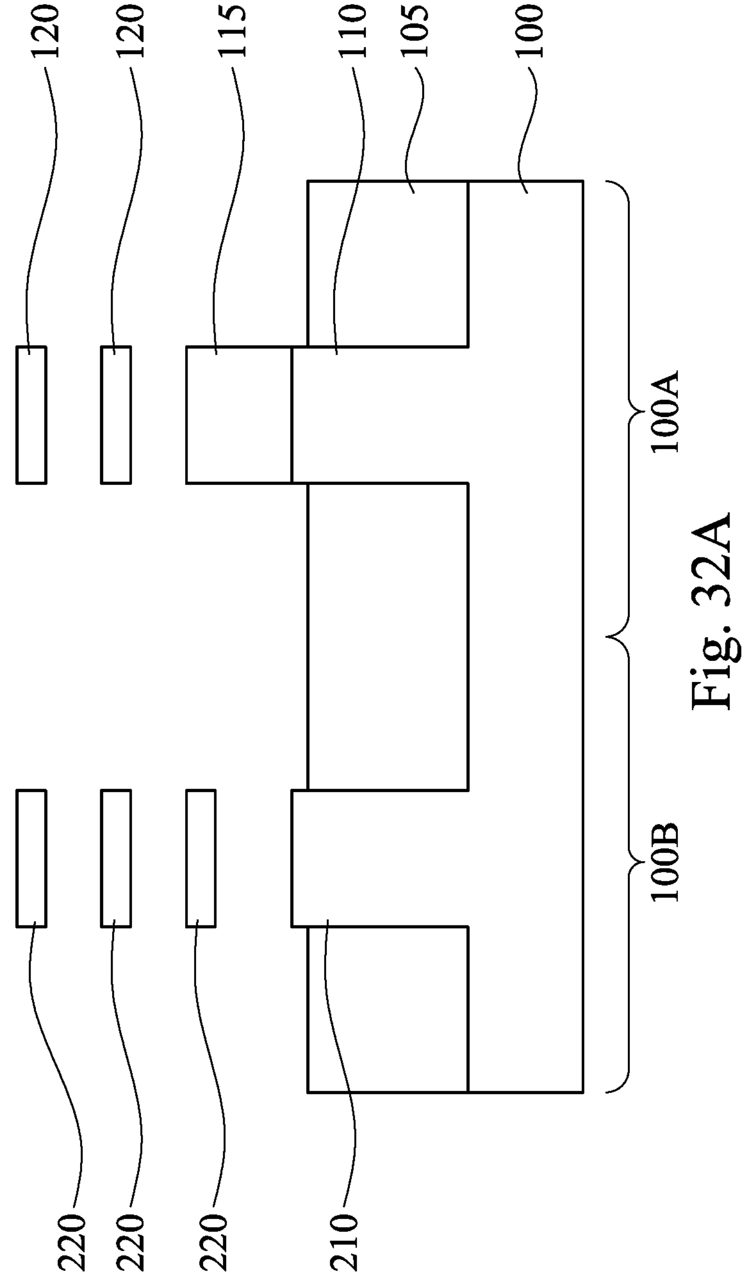

Reference is made to FIGS. 31A and 31B. Epitaxy layers 144 and 244 are formed over the epitaxy layers 142 and 242, respectively. The epitaxy layers 144 and 244 may be formed by suitable deposition process, such as a selective epitaxial growth (SEG) process. In some embodiments, the SEG process may selectively grow a semiconductor material on exposed semiconductor surfaces, such as the exposed surfaces of the epitaxy layers 142 and 242 and the exposed surfaces of the semiconductor layers 120 and 220. Because there are more semiconductor layers 220 than the semiconductor layers 120, a greater amount of the semiconductor material will be grown in the recesses R2 than in the recesses R1, which results in that the epitaxy layer 244 is thicker than the epitaxy layer 144. In some embodiments, an implantation process may be performed to the epitaxy layers 144 and 244. In some embodiments, the epitaxy layers 142 and 242 may be formed without performing an implantation process, and thus the epitaxy layers 142 and 242 are un-doped.

Figure 32B:
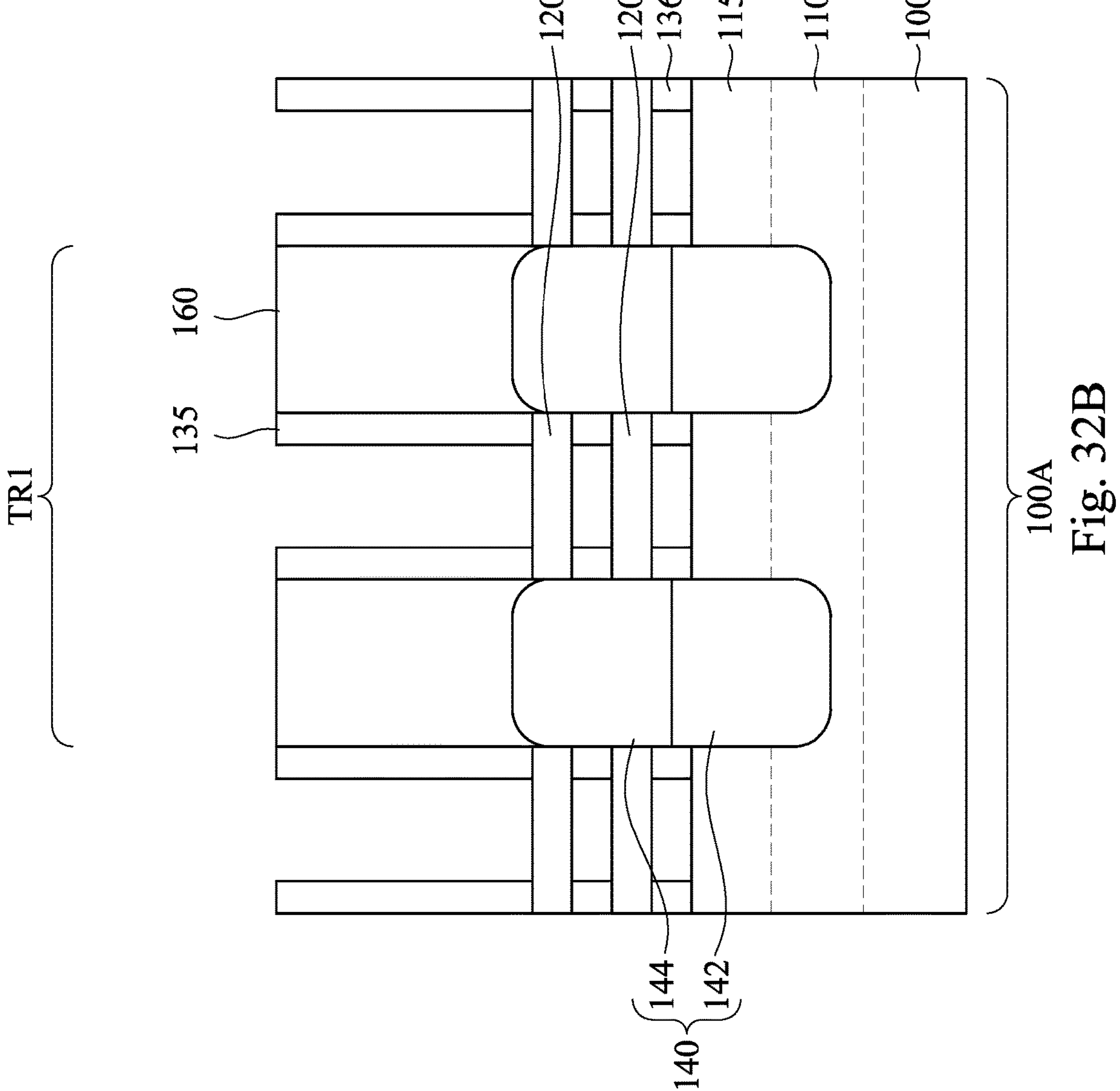
Figure 32C:
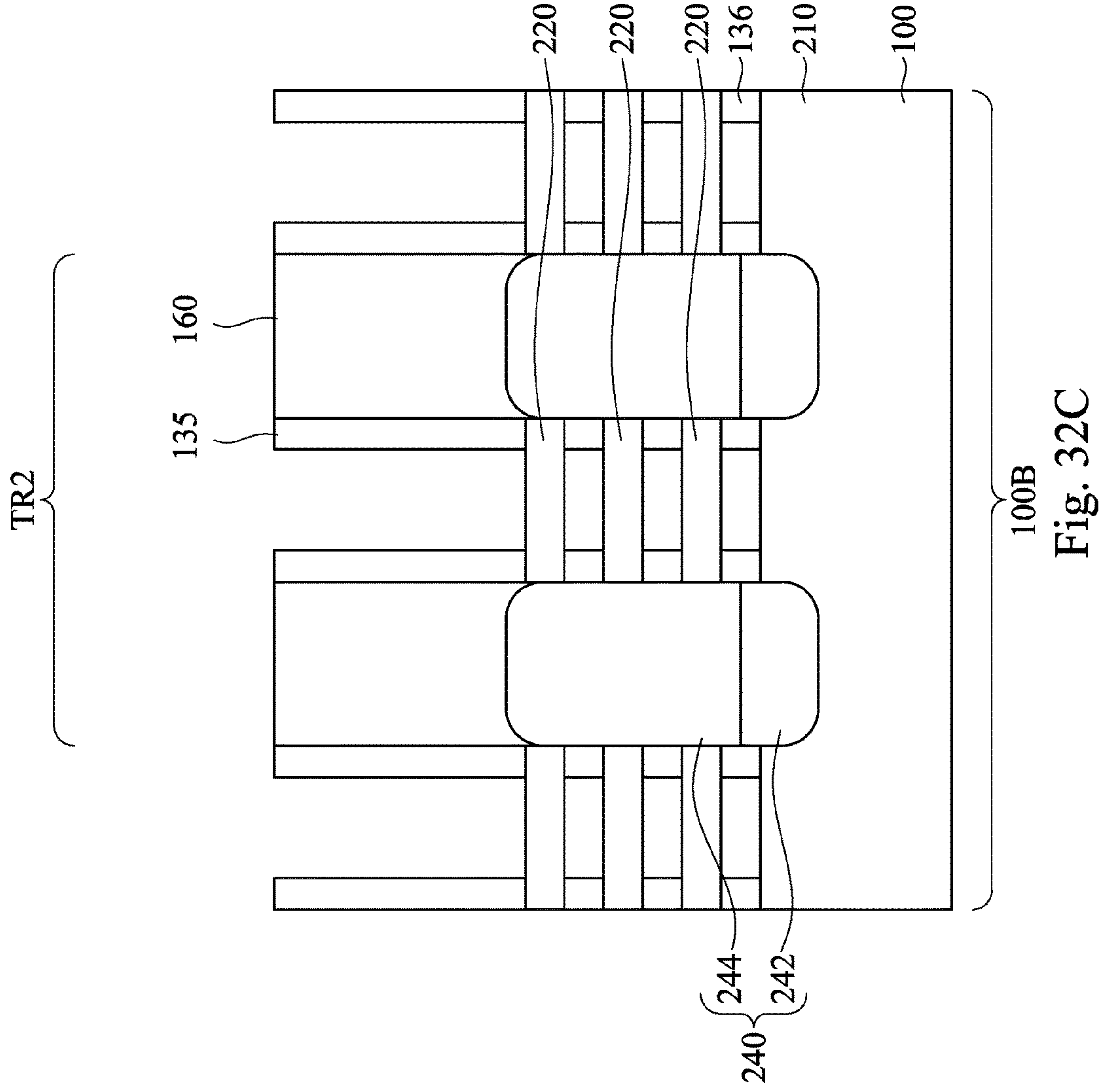
Figure 33A:
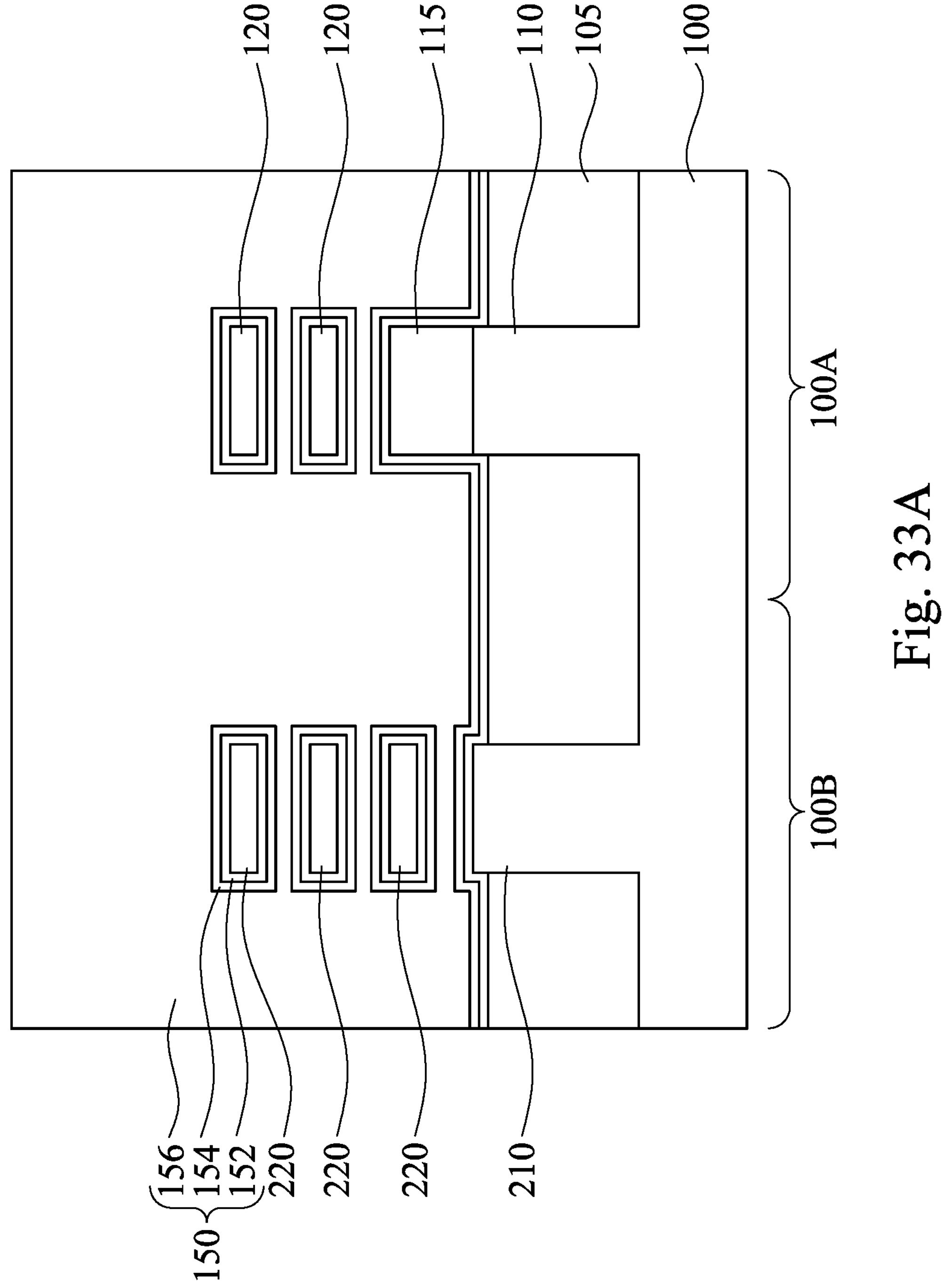

Reference is made to FIGS. 32A, 32B, and 32C. An interlayer dielectric (ILD) layer 160 is formed over the substrate 100 and covering the source/drain epitaxy structures 140 and 240. In some embodiments, the ILD layer 160 can be formed by, for example, depositing a dielectric material over the substrate 100, followed by a CMP process to remove the excessive dielectric material until the dummy gate structures 130 are exposed.

After the ILD layer 160 is formed. The dummy gate structures 130 are removed to form gate trenches between each pair of the gate spacers 135. Then, portions of the semiconductor layers 125 and 225 exposed through the gate trenches are removed, such that semiconductor layers 120 and 220 are suspended over the substrate 100.

Figure 33B:
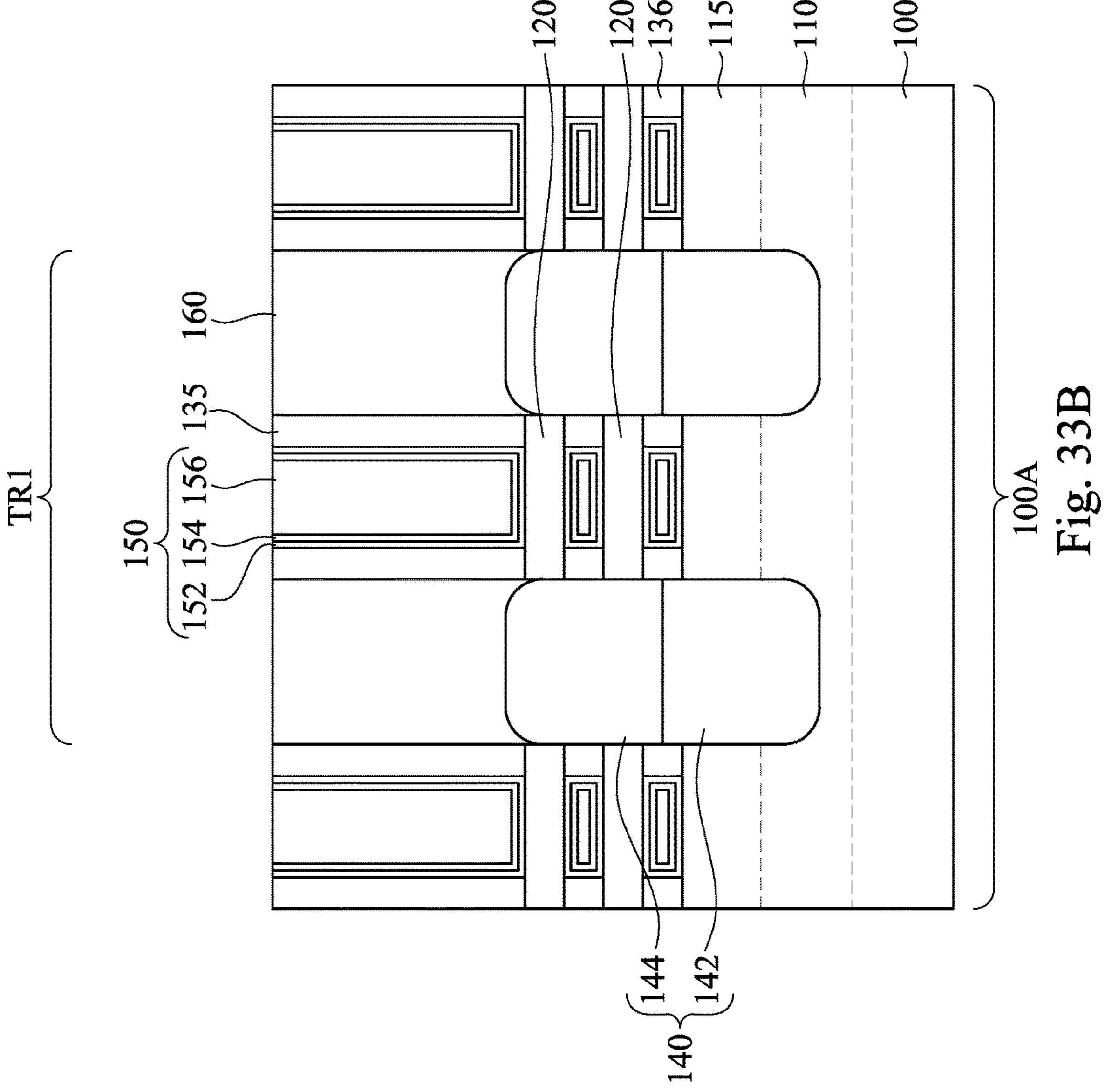
Figure 33C:
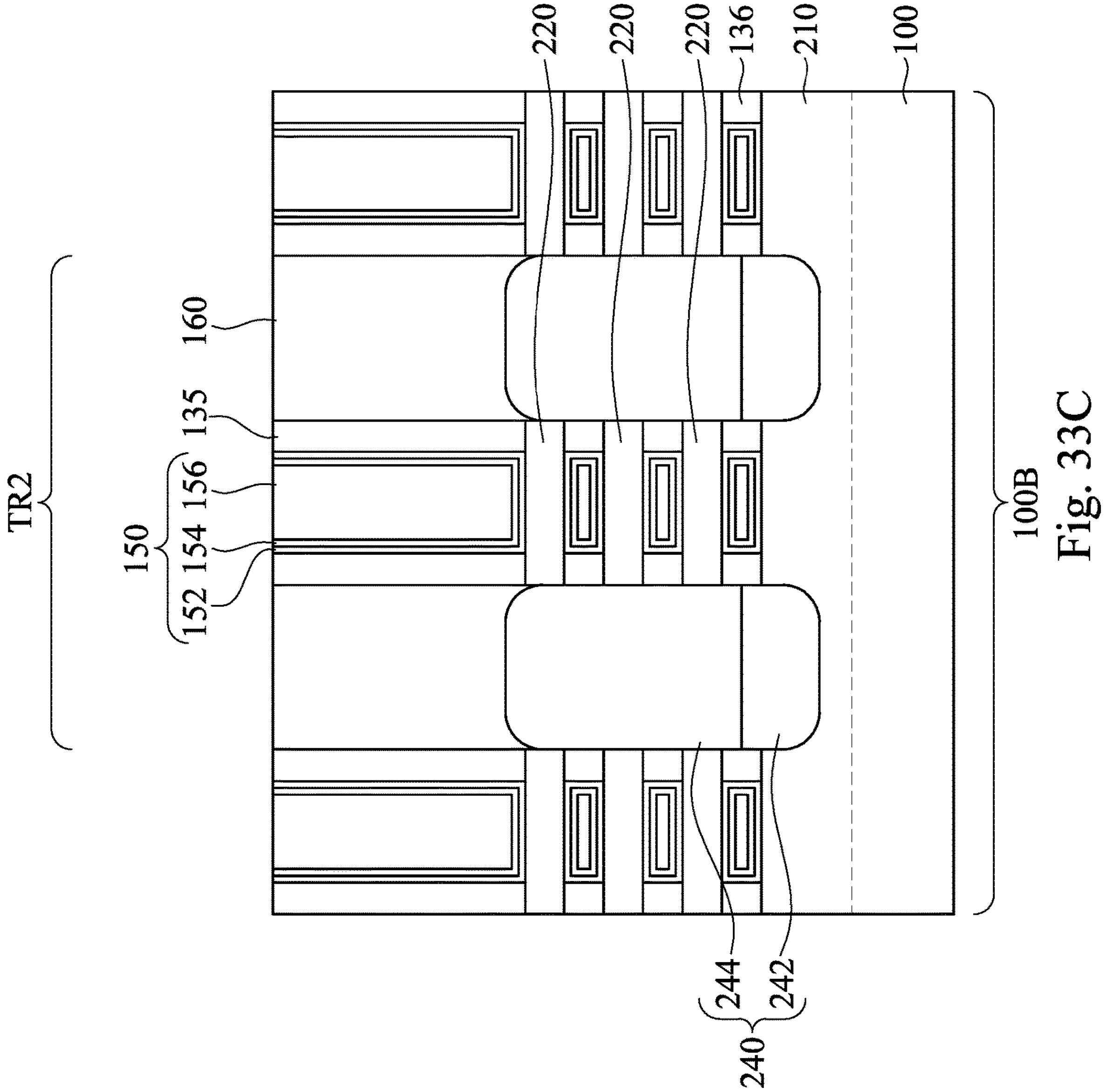

Reference is made to FIGS. 33A, 33B, and 33C. Metal gate structures 150 are formed over the substrate 100. In greater details, metal gate structures 150 are formed in the gate trenches between the gate spacers 135 wrap around each of the semiconductor layers 120 and 220. In some embodiments, the metal gate structures 150 may be formed by, for example, sequentially depositing a gate dielectric layer 152, a work function metal layer 154, and a gate electrode 156 over the substrate 100 and filling the gate trenches between the gate spacers 135, and then performing a CMP process to remove excess material of gate dielectric layer 152, excess material of work function metal layer 154, and excess material of gate electrode 156 until the ILD layer 160 is exposed.

Figure 34A:
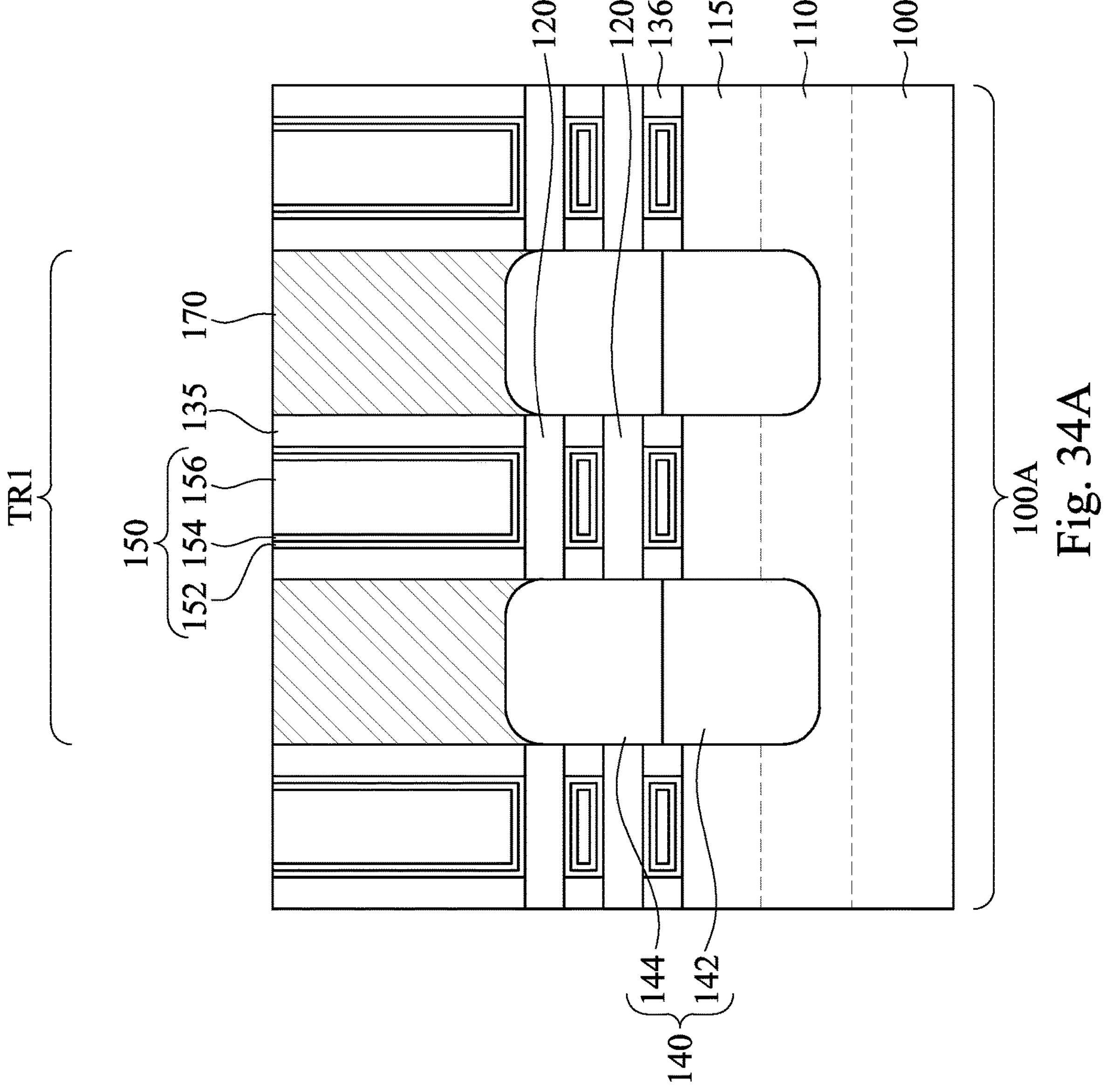
Figure 34B:
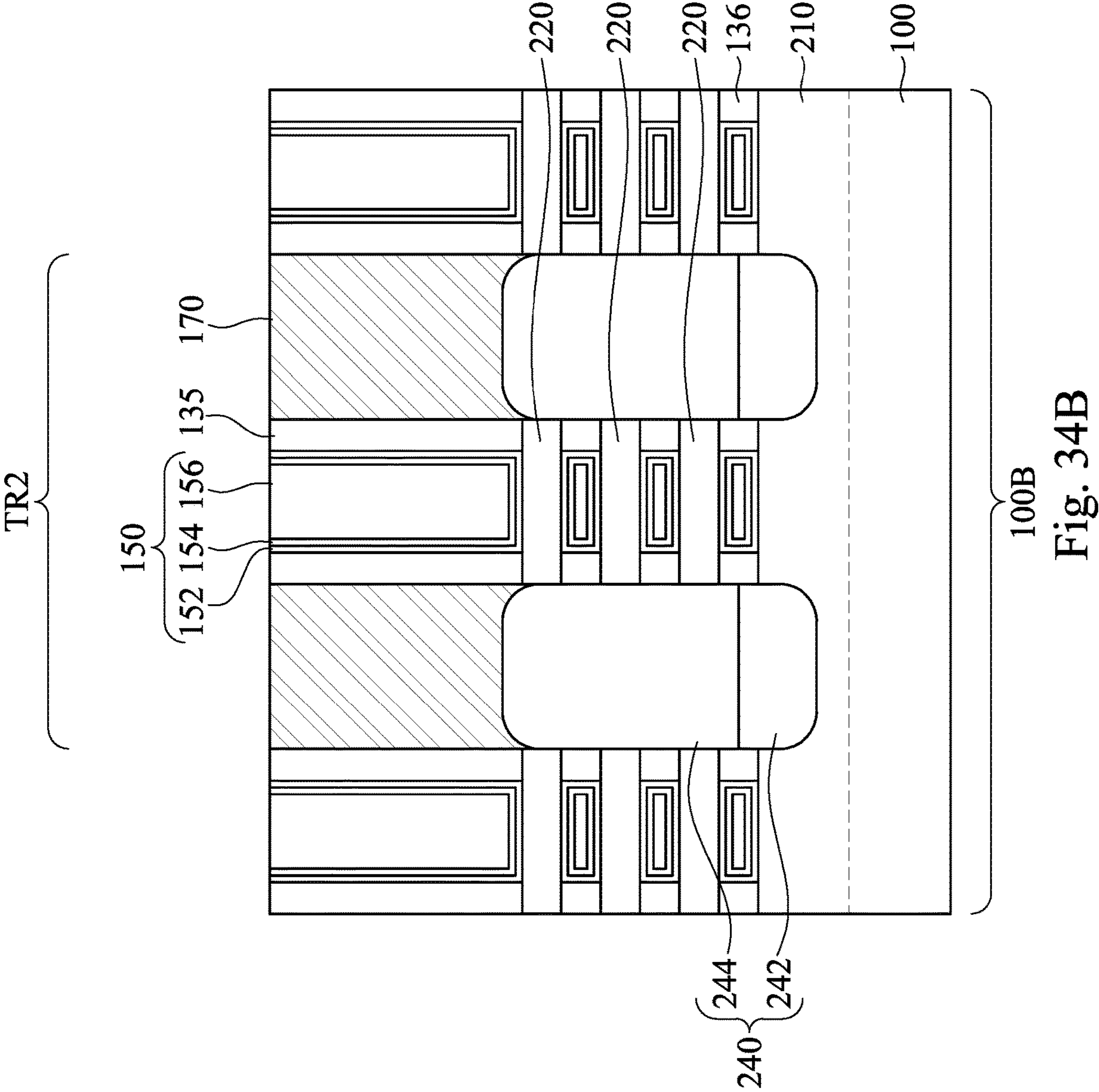

Reference is made to FIGS. 34A and 34B. Portions of the ILD layer 160 are removed to form openings exposing the source/drain epitaxy structures 140 and 240. Source/drain contacts 170 are then formed in the openings. In some embodiments, the source/drain contacts 170 may be formed by, for example, depositing conductive material(s) in the openings, and then performing a CMP process to remove excess materials of the conductive material until the gate structures 150 are exposed.

FIGS. 35 to 42 are schematic views of a semiconductor device in various stages of fabrication in accordance with some embodiments of the present disclosure. It is noted that FIGS. 35 to 42 illustrate another embodiments for forming the structure shown in FIG. 9. Some elements of FIGS. 35 to 42 may be similar to those described with respect to FIGS. 2 to 9, such elements are labeled the same, and relevant details may not be repeated for brevity.

Figure 35:
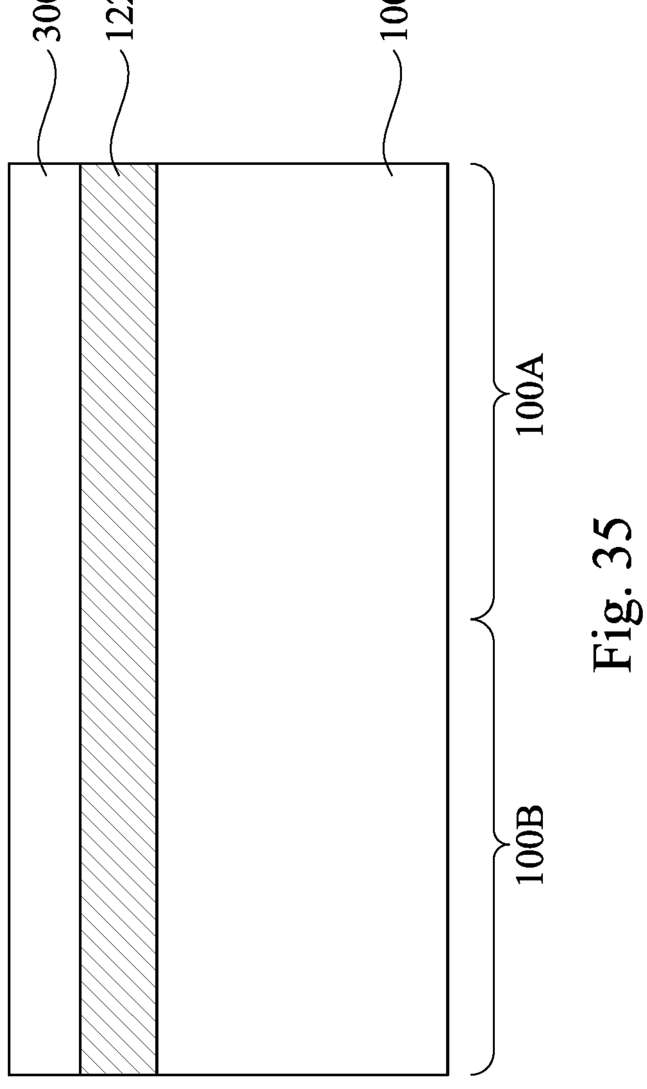
FIGS. 35 to 42 are schematic views of a semiconductor device in various stages of fabrication in accordance with some embodiments of the present disclosure.

Reference is made to FIG. 35. A substrate 100 is provided, and a semiconductor layer 122 is deposited over the substrate 100. In some embodiments, the semiconductor layer 122 may span over the first region 100A and the second region 100B of the substrate 100. In some embodiments, the semiconductor layer 122 may be deposited using suitable deposition process, such as chemical vapor deposition (CVD), molecular beam epitaxy (MBE), or other suitable process(es).

A pad layer 300 is deposited over the semiconductor layer 122. In some embodiments, the pad layer 300 may span over the first region 100A and the second region 100B of the substrate 100. In some embodiments, the pad layer 300 may be deposited using suitable deposition process, such as CVD, ALD, PVD, or the like.

Figure 36:
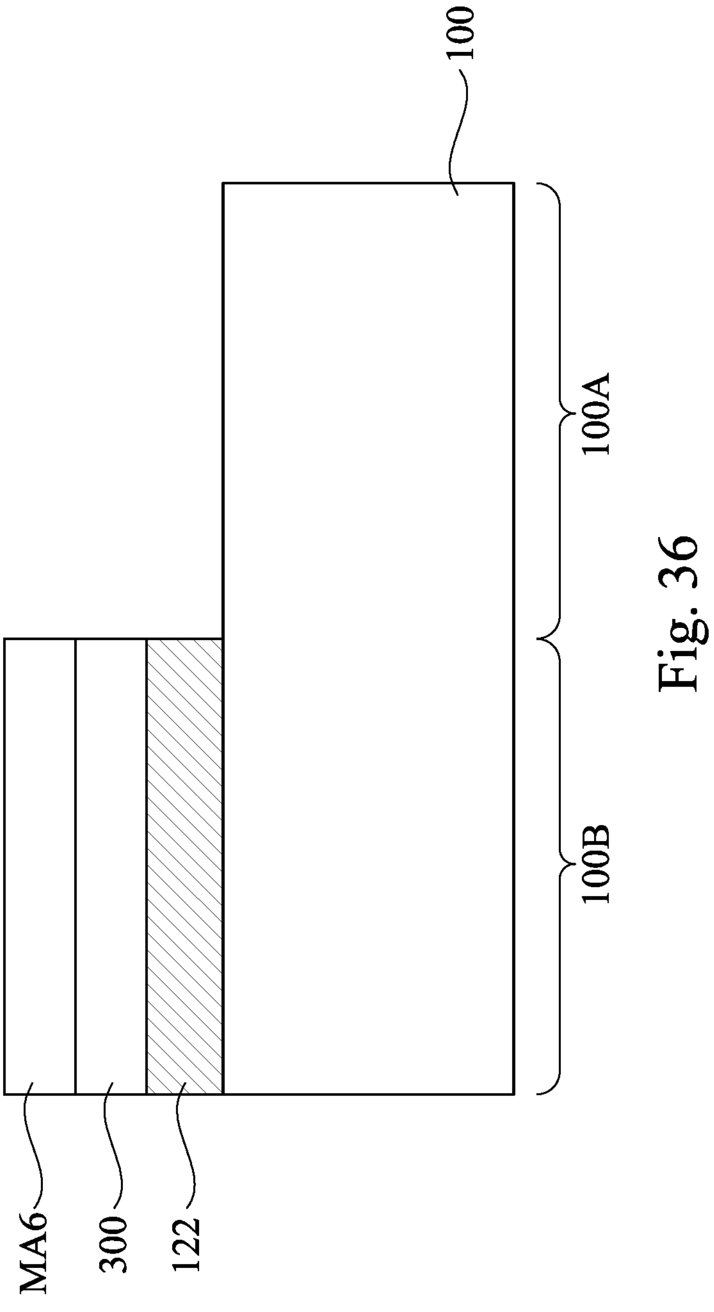

Reference is made to FIG. 36. A patterned mask MA6 is formed over the second region 100B of the substrate 100, while leaving the first region 100A of the substrate 100 exposed. In some embodiments, the patterned mask MA6 may include photoresist, and may be patterned using suitable photolithography process.

Afterwards, portions of the pad layer 300 and the semiconductor layers 122 exposed by the patterned mask MA6 are removed by using the patterned mask MA6 as an etch mask. The portions of the pad layer 300 and the semiconductor layers 122 can be removed by suitable etching process, such as wet etch, dry etch, the like, or combinations thereof. As a result, portions of the pad layer 300 and the semiconductor layers 122 over the first region 100A of the substrate 100 are removed, and the surface of the first region 100A of substrate 100 is exposed. On the other hand, portions of the pad layer 300 and the semiconductor layer 122 over the second region 100B of the substrate 100 are protected by the patterned mask MA6 during the etching process, and may keep remaining over the substrate 100 after the etching process is completed.

Figure 37:
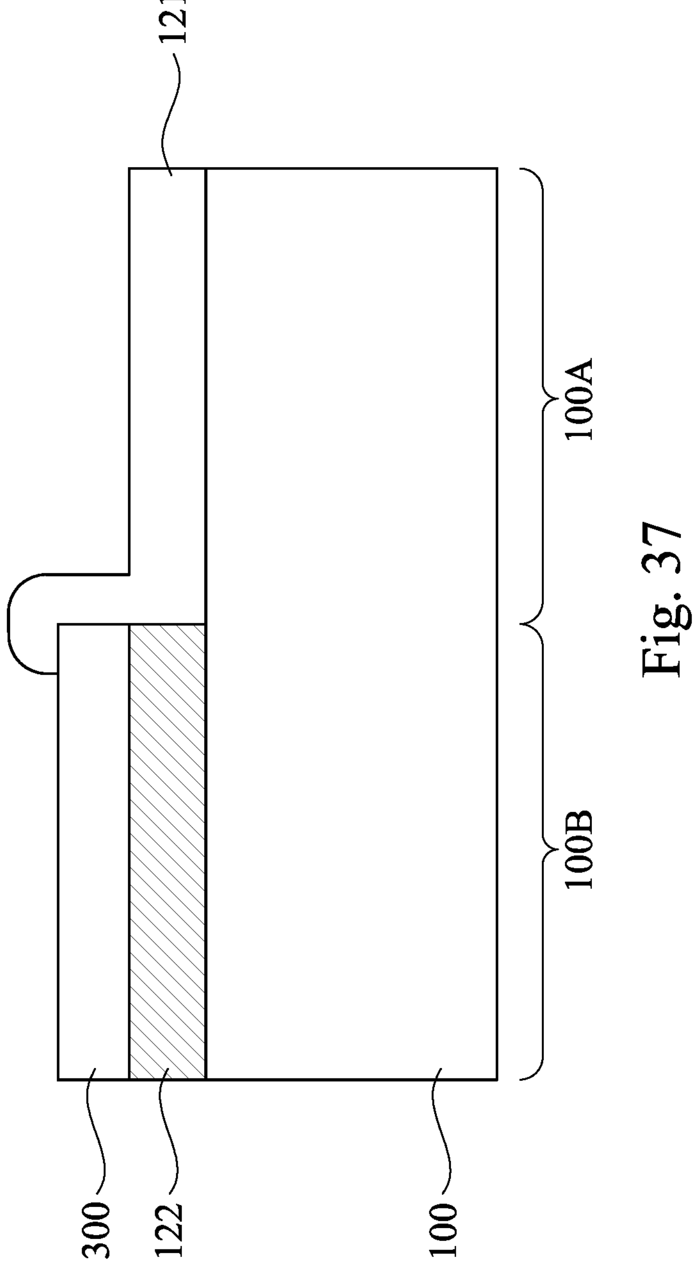

Reference is made to FIG. 37. The patterned mask MA6 is removed. Afterwards, a semiconductor layer 121 is selectively formed on the exposed surface of the first region 100A of the substrate 100. In some embodiments, the semiconductor layer 121 may be deposited using suitable deposition process, such as selective epitaxial growth (SEG), chemical vapor deposition (CVD), molecular beam epitaxy (MBE), or other suitable process(es). In some embodiments, the semiconductor layer 121 may be selectively grown on epitaxy material, such as the substrate 100 and the semiconductor layer 122. Accordingly, the semiconductor layer 121 may include higher deposition rate on the substrate 100 and the semiconductor layer 122 than on the pad layer 300. In some embodiments, because the semiconductor layer 121 may also be grown from sidewall of the semiconductor layer 122, excess material of the semiconductor layer 121 may extend to the sidewall and the top surface of the pad layer 300.

Figure 38:
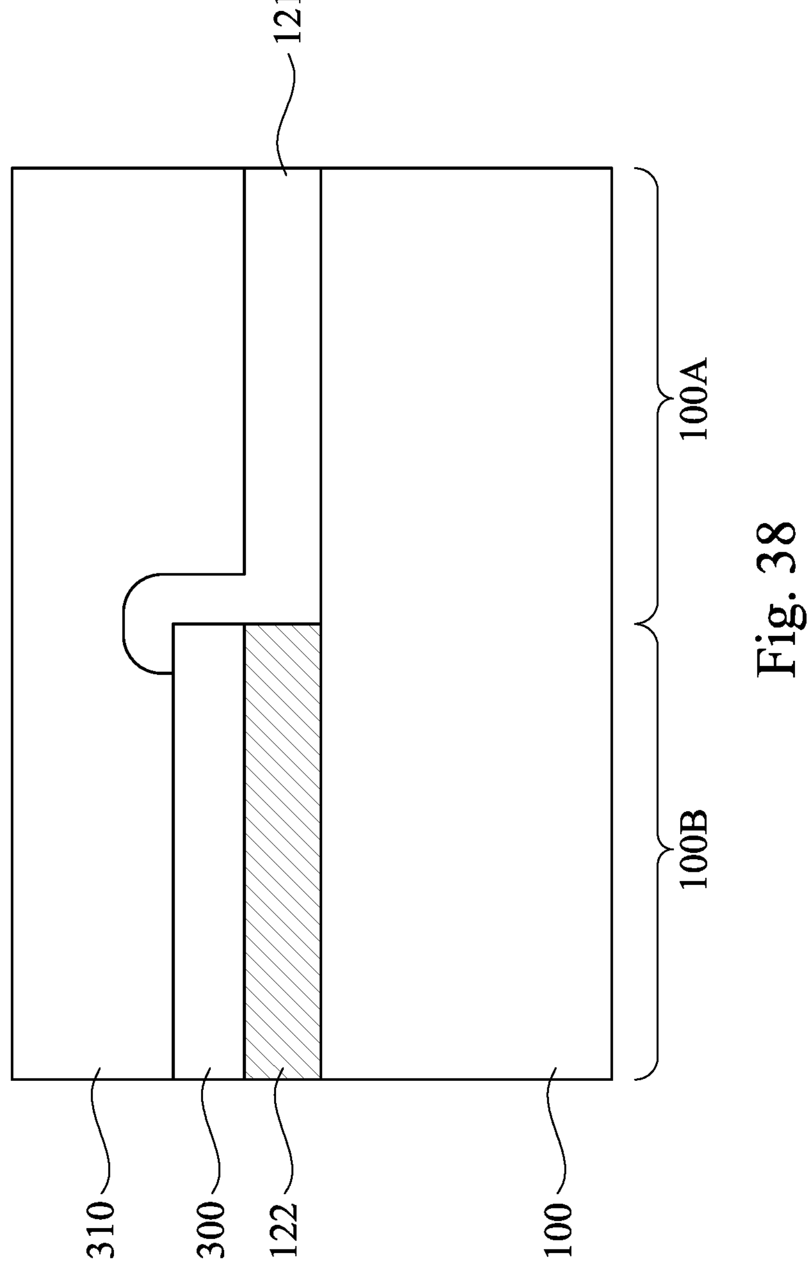

Reference is made to FIG. 38. A dielectric layer 310 is deposited over the substrate 100 and covering the semiconductor layer 121 and the pad layer 300. In some embodiments, the dielectric layer 310 may span over the first region 100A and the second region 100B of the substrate 100. In some embodiments, the dielectric layer 310 may be deposited using suitable deposition process, such as CVD, ALD, PVD, or the like.

Figure 39:
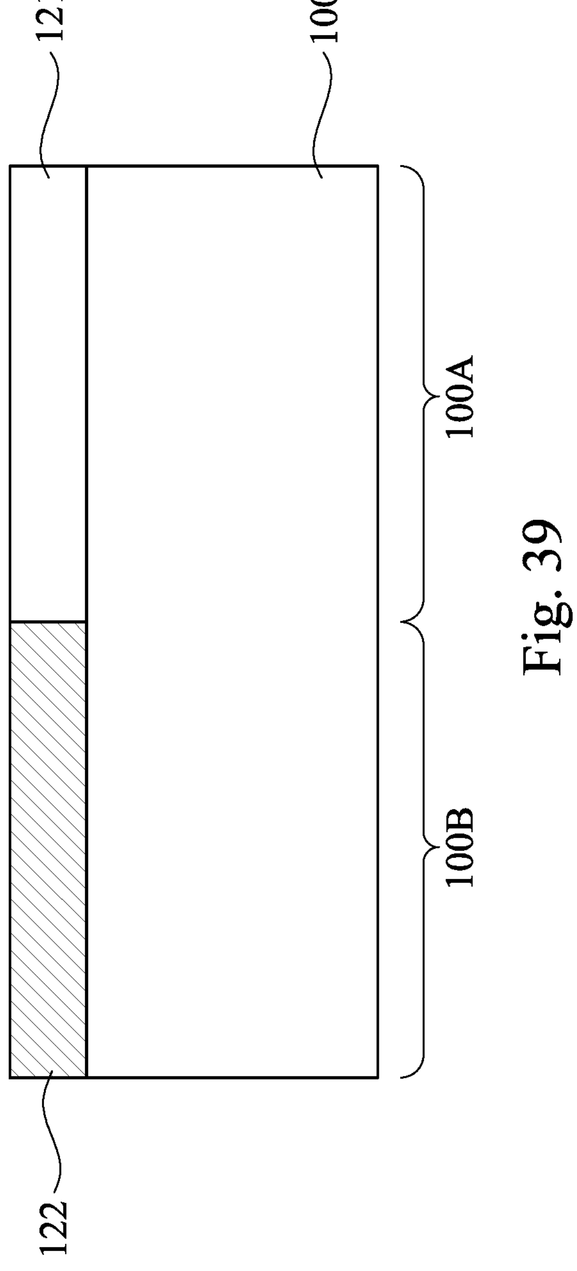

Reference is made to FIG. 39. A planarization process, such as a chemical mechanical polishing (CMP) process, is performed to level the top surface of the semiconductor layer 121 and the top surface of the semiconductor layer 122. In some embodiments, the dielectric layer 310 is removed during the planarization process.

Figure 40:
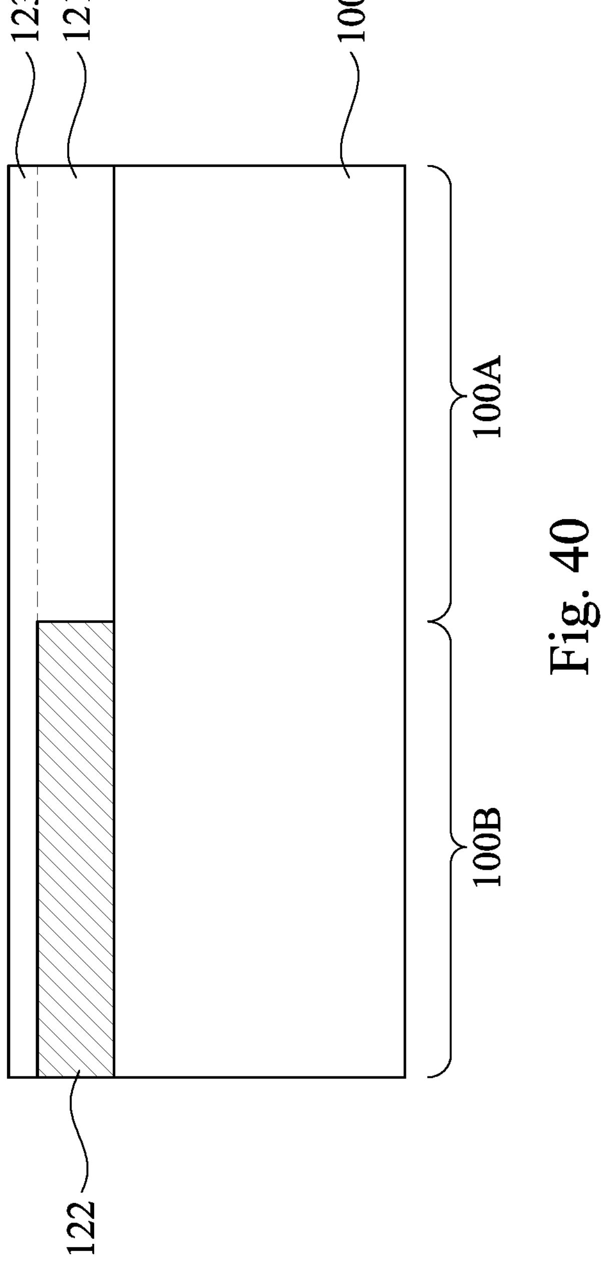

Reference is made to FIG. 40. A semiconductor layer 123 is deposited over the semiconductor layer 121 and 122. In some embodiments, the semiconductor layer 123 may span over the first region 100A and the second region 100B of the substrate 100. In some embodiments, the semiconductor layer 123 may be deposited using suitable deposition process, such as chemical vapor deposition (CVD), molecular beam epitaxy (MBE), or other suitable process(es).

Figure 41:
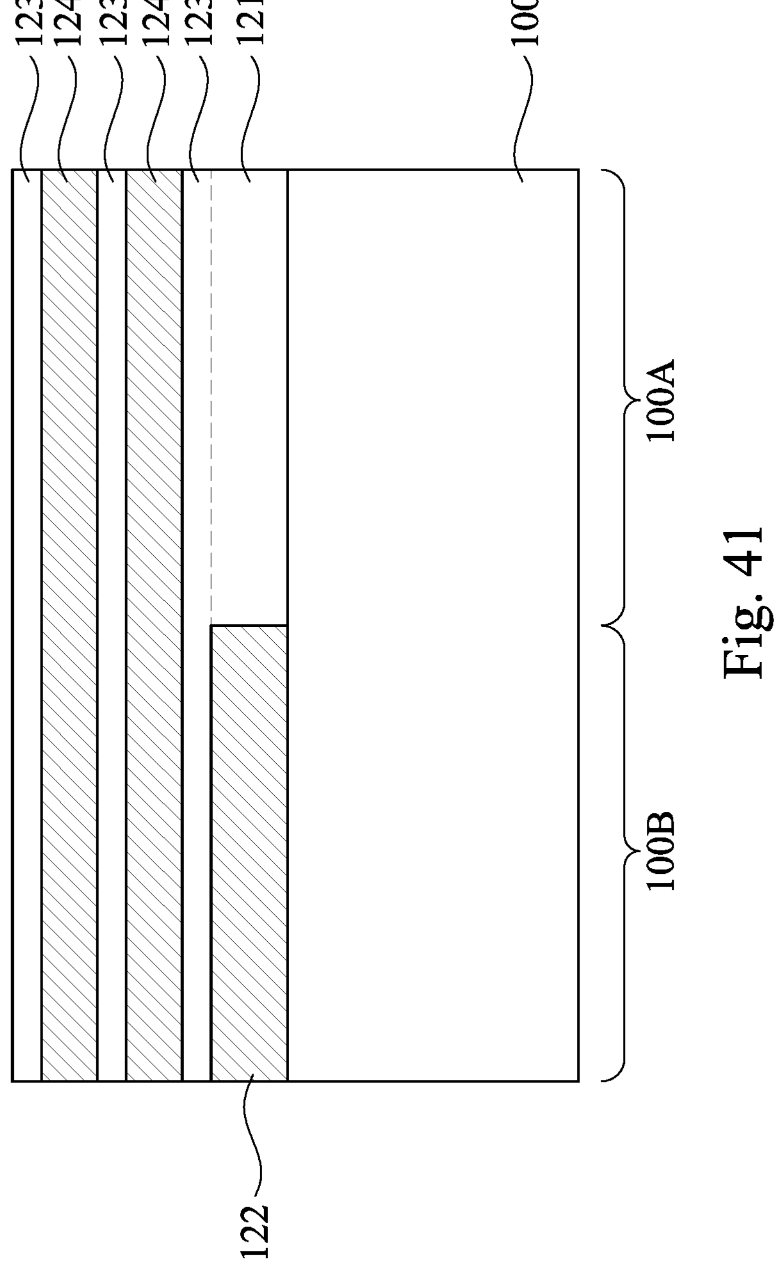

Reference is made to FIG. 41. Semiconductor layers 124 and semiconductor layers 123 are alternately deposited over the substrate 100. In some embodiments, the semiconductor layer 121 and the semiconductor layers 123 may be made of a same material, such as silicon. In some embodiments, the semiconductor layer 122 and the semiconductor layers 124 may be made of a same material, such as silicon germanium. In some embodiments, the semiconductor layer 121 is formed over the first region 100A of the substrate 100, and the semiconductor layer 122 is formed over the second region 100B of the substrate 100, while each of the semiconductor layers 123 and 124 may span over the first region 100A and the second region 100B of the substrate 100.

In some embodiments, a portion of the bottommost one of the semiconductor layers 123 is in contact with the semiconductor layer 121. Because the semiconductor layer 123 and the semiconductor layer 121 are made of a same material, the composite layer of the semiconductor layer 121 and the portion of the semiconductor layer 123 may collectively form the semiconductor layer 115 discussed in later steps.

Figure 42:
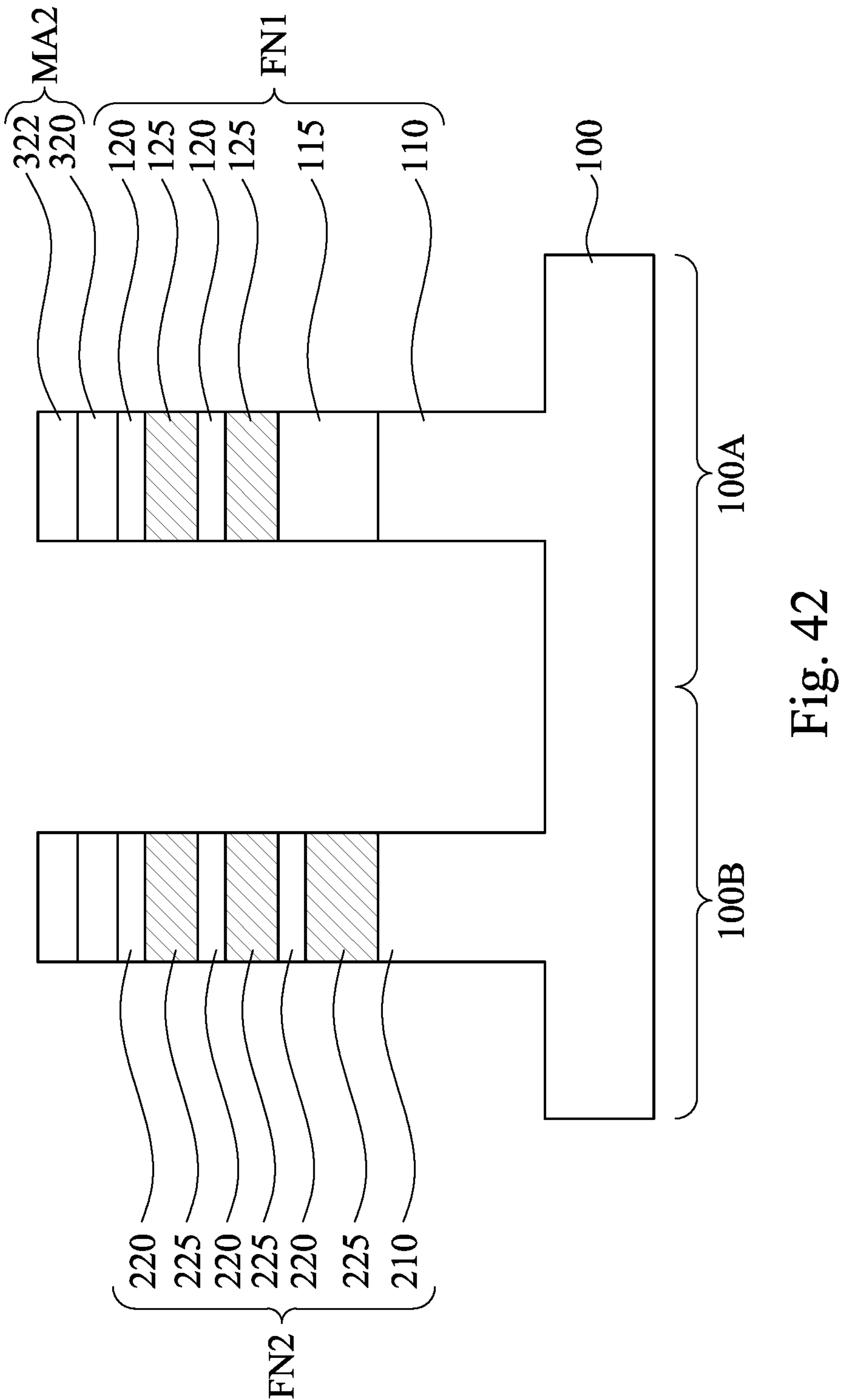

Reference is made to FIG. 42. Patterned masks MA2 are formed over the topmost one of the semiconductor layers 123. In some embodiments, each of the patterned masks MA2 may include a pad oxide layer 320 and a hard mask layer 322 over the pad oxide layer 320.

After the patterned masks MA2 are formed, an etching process is performed to remove portions of the semiconductor layers 121, 122, 123, and 124, and the substrate 100 that are exposed by the patterned mask MA2, so as to form a fin structure FN1 over the first region 100A of the substrate 100 and a fin structure FN2 over the second region 100B of the substrate 100. In some embodiments, the etching process may include dry etch, wet etch, or combinations thereof.

After the fin structures FN1 and FN2 are formed, the structure shown in FIG. 42 may undergo the processes as described in FIGS. 10 to 22B and FIGS. 24A to 34B. The resulting structures may be similar to the structures shown in FIGS. 1A to 1D and 23A to 23D.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. A first semiconductor device is disposed over a first region of a substrate, and a second semiconductor device is disposed over a second region of a substrate. The first semiconductor device may include less semiconductor channel layers than the second semiconductor device. Such dual-channel number (ex: 3-sheet+2-sheet) devices on a same chip may be beneficial for power saving. In some embodiments, the first and second semiconductor devices may include different depths of source/drain epitaxy structures, which in turn will improve the device performance and may be beneficial for device control. In other embodiments, the first and second semiconductor devices may include different depths of non-conductive epitaxy layers of source/drain epitaxy structures, which in turn will improve the device performance and may be beneficial for device control.

According to some embodiments of the present disclosure, a method includes forming first semiconductor layers arranged one above another over a first region of a substrate, and second semiconductor layers arranged one above another over a second region of the substrate, in which a number of the first semiconductor layers is less than a number of the second semiconductor layers; forming a first gate structure spanning over the first semiconductor layers and a second gate structure spanning over the second semiconductor layers; etching, by using the first and second gate structures as etch masks, the first semiconductor layers and the second semiconductor layers to form a first recess within the first semiconductor layers and a second recess within the second semiconductor layers; forming a hard mask layer covering the first recess; performing an etching process to deepen the second recess; and forming a first source/drain epitaxy structure in the first recess and a second source/drain epitaxy structure in the deepened second recess.

In some embodiments, the etching the first semiconductor layers and the second semiconductor layers is performed such that a bottommost end of the first recess is lower than a bottommost one of the first semiconductor layers, while a bottommost end of the second recess is higher than a bottommost one of the second semiconductor layers.

In some embodiments, performing the etching process to deepen the second recess is performed such that a bottommost end of the deepened second recess is lower than the bottommost one of the second semiconductor layers.

In some embodiments, forming the first source/drain epitaxy structure and the second source/drain epitaxy structure includes forming a first epitaxy layer in the first recess and a second epitaxy layer in the second recess; and forming a third epitaxy layer over the first epitaxy layer and a fourth epitaxy layer over the second epitaxy layer, in which a thickness variation between the first epitaxy layer and the second epitaxy layer is less than a thickness varication between the third epitaxy layer and the fourth epitaxy layer.

In some embodiments, the method further includes performing ion implantation process to dope the third and fourth epitaxy layers, such that the third and fourth epitaxy layers have higher dopant concentrations than the first and second epitaxy layers.

In some embodiments, the first semiconductor layers are in contact with the third epitaxy layer and are spaced from the first epitaxy layer.

In some embodiments, the method further includes removing the hard mask layer prior to forming the first and second source/drain epitaxy structures.

According to some embodiments of the present disclosure, a method includes forming first semiconductor layers vertically stacked over a first region of a substrate and second semiconductor layers vertically stacked over a second region of the substrate, in which a number of the first semiconductor layers is less than a number of the second semiconductor layers; forming a first gate structure spanning over the first semiconductor layers and a second gate structure spanning over the second semiconductor layers; etching, by using the first and second gate structures as etch masks, the first semiconductor layers and the second semiconductor layers to form a first recess within the first semiconductor layers and a second recess within the second semiconductor layers; performing a first deposition process to form a first epitaxy layer in the first recess and a second epitaxy layer in the second recess; forming a hard mask layer in the second recess and covering the second epitaxy layer; performing a second deposition process to form a third epitaxy layer over the first epitaxy layer; and performing a third deposition process to form a fourth epitaxy layer over the third epitaxy layer and a fifth epitaxy layer over the second epitaxy layer.

In some embodiments, the method further includes forming inner spacers between adjacent two of the first semiconductor layers and between adjacent two of the second semiconductor layers, in which the hard mask layer is formed in contact with the inner spacers.

In some embodiments, the method further includes removing the hard mask layer prior to performing the third deposition process.

In some embodiments, top surfaces of the first and second epitaxy layers are lower than a bottommost one of the second semiconductor layers.

In some embodiments, a top surface of the third epitaxy layer is lower than a bottommost one of the first semiconductor layers.

In some embodiments, the method further includes performing ion implantation process to dope the fourth and fifth epitaxy layers, such that the fourth and fifth epitaxy layers have higher dopant concentrations than the first, second, and third epitaxy layers.

In some embodiments, a bottom surface of the fourth epitaxy layer is lower than a bottommost one of the first semiconductor layers and a bottom surface of the fifth epitaxy layer is lower than a bottommost one of the second semiconductor layers.

In some embodiments, the first, second, and third epitaxy layers are made of a same material that is different from materials of the fourth and fifth epitaxy layers.

According to some embodiments of the present disclosure, a device includes a substrate, a first semiconductor device over the substrate, and a second semiconductor device over the substrate. The first semiconductor device includes first semiconductor layers arranged one above another over the substrate, a first gate structure wrapping around each of the first semiconductor layers, and first source/drain epitaxy structures on opposite sides of the first gate structure, in which each of the first source/drain epitaxy structures includes a first epitaxy layer and a second epitaxy layer over the first epitaxy layer, and a bottom surface of the second epitaxy layer is lower than a bottommost one of the first semiconductor layers. The second semiconductor device includes second semiconductor layers arranged one above another over the substrate, in which a number of the first semiconductor layers is less than a number of the second semiconductor layers; a second gate structure wrapping around each of the second semiconductor layers; and second source/drain epitaxy structures on opposite sides of the second gate structure, in which each of the second source/drain epitaxy structures includes a third epitaxy layer and a fourth epitaxy layer over the third epitaxy layer, and a bottom surface of the fourth epitaxy layer is lower than a bottommost one of the second semiconductor layers.

In some embodiments, the second epitaxy layer has a higher dopant concentration than the first epitaxy layer, and the fourth epitaxy layer has a higher dopant concentration than the third epitaxy layer.

In some embodiments, a thickness of each of the first source/drain epitaxy structures is less than a thickness of each of the second source/drain epitaxy structures.

In some embodiments, a thickness of the first epitaxy layer is substantially the same as a thickness of the third epitaxy layer, and a thickness of the second epitaxy layer less than a thickness of the fourth epitaxy layer.

In some embodiments, a thickness of the first epitaxy layer is greater than a thickness of the third epitaxy layer, and a thickness of the second epitaxy layer less than a thickness of the fourth epitaxy layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
- forming first semiconductor layers vertically stacked over a first region of a substrate and second semiconductor layers vertically stacked over a second region of the substrate, wherein a number of the first semiconductor layers is less than a number of the second semiconductor layers;
- forming a first gate structure spanning over the first semiconductor layers and a second gate structure spanning over the second semiconductor layers;
- etching, by using the first and second gate structures as etch masks, the first semiconductor layers and the second semiconductor layers to form a first recess within the first semiconductor layers and a second recess within the second semiconductor layers;
- performing a first deposition process to form a first epitaxy layer in the first recess and a second epitaxy layer in the second recess;
- forming a hard mask layer in the second recess and covering the second epitaxy layer;
- performing a second deposition process to form a third epitaxy layer over the first epitaxy layer; and
- performing a third deposition process to form a fourth epitaxy layer over the third epitaxy layer and a fifth epitaxy layer over the second epitaxy layer, wherein the first, second, and third epitaxy layers comprises a same material that is different from materials of the fourth and fifth epitaxy layers.

2. The method of claim 1, further comprising forming inner spacers between adjacent two of the first semiconductor layers and between adjacent two of the second semiconductor layers, wherein the hard mask layer is formed in contact with the inner spacers.

3. The method of claim 1, further comprising removing the hard mask layer prior to performing the third deposition process.

4. The method of claim 1, wherein top surfaces of the first and second epitaxy layers are lower than a bottommost one of the second semiconductor layers.

5. The method of claim 4, wherein a top surface of the third epitaxy layer is lower than a bottommost one of the first semiconductor layers.

6. The method of claim 1, wherein the fourth and fifth epitaxy layers have higher dopant concentrations than the first, second, and third epitaxy layers.

7. The method of claim 1, wherein a bottom surface of the fourth epitaxy layer is lower than a bottommost one of the first semiconductor layers and a bottom surface of the fifth epitaxy layer is lower than a bottommost one of the second semiconductor layers.

8. A method, comprising:
- forming first semiconductor layers vertically stacked over a first region of a substrate and second semiconductor layers vertically stacked over a second region of the substrate, wherein a bottommost one of the first semiconductor layers is higher than a bottommost one of the second semiconductor layers;
- forming a first gate structure over the first semiconductor layers and a second gate structure over the second semiconductor layers;
- etching, by using the first and second gate structures as etch masks, the first semiconductor layers and the second semiconductor layers to form a first recess within the first semiconductor layers and a second recess within the second semiconductor layers;
- forming a first epitaxy layer in the first recess and a second epitaxy layer in the—second—recess, wherein the first epitaxy layer is thicker than the second epitaxy layer, comprising:
  - performing a first deposition process to form a first layer of the first epitaxy layer and the second epitaxy layer; and
  - performing a second deposition process to form a second layer of the first epitaxy layer over the first layer of the first epitaxy layer, and
- forming a third epitaxy layer over the first epitaxy layer and a fourth epitaxy layer over the second epitaxy layer.

9. The method of claim 8, wherein the first semiconductor layers and the second semiconductor layers are made of a same material.

10. The method of claim 8, wherein a topmost surface of the first epitaxy layer is lower than the bottommost one of the first semiconductor layers and a topmost surface of the second epitaxy layer is lower than the bottommost one of the second semiconductor layers.

11. The method of claim 8, wherein forming the first epitaxy layer further comprises:

forming a mask covering the second epitaxy layer prior to performing the second deposition process; and removing the mask once the second deposition process is complete.

12. The method of claim 8, wherein the third epitaxy layer is shorter than the fourth epitaxy layer.

13. The method of claim 12, wherein a total thickness of the first epitaxy layer and the third epitaxy layer is substantially equal to a total thickness of the second epitaxy layer and the fourth epitaxy layer.

14. A method, comprising:

forming a semiconductor material over a first region and a second region of a substrate;

removing a portion of the semiconductor material from the second region of the substrate;

after removing the portion of the semiconductor material, forming first semiconductor layers vertically stacked over the first region of the substrate and second semiconductor layers vertically stacked over the second region of the substrate, wherein a number of the first semiconductor layers is different from a number of the second semiconductor layers;

forming a first gate structure over the first semiconductor layers and a second gate structure over the second semiconductor layers;

etching, by using the first and second gate structures as etch masks, the first semiconductor layers and the second semiconductor layers to form a first recess within the first semiconductor layers and a second recess within the second semiconductor layers;

forming a first epitaxy layer in the first recess and a second epitaxy layer in the—second—recess, wherein the first epitaxy layer is thicker than the second epitaxy layer; and forming a third epitaxy layer over the first epitaxy layer and a fourth epitaxy layer over the second epitaxy layer, wherein an interface between the first epitaxy layer and the third epitaxy layer and an interface between the second epitaxy layer and the fourth epitaxy layer are at different levels.

15. The method of claim 14, wherein the first epitaxy layer is spaced apart from the first semiconductor layers and the second epitaxy layer is spaced apart from the second semiconductor layers.

16. The method of claim 14, wherein the third epitaxy layer interfaces with the first semiconductor layers, and the fourth epitaxy layer interfaces with the second semiconductor layers.

17. The method of claim 14, wherein the semiconductor material and the first semiconductor layers are made of a same material.

18. The method of claim 14, wherein the number of the first semiconductor layers is less than the number of the second semiconductor layers.

19. The method of claim 14, wherein a bottommost one of the first semiconductor layers is higher than a bottommost one of the second semiconductor layers.

20. The method of claim 14, wherein a topmost one of the first semiconductor layers and a topmost one of the second semiconductor layers are at a same level.

* * * * *